(12) United States Patent
Claussen et al.

(10) Patent No.: US 10,875,339 B1
(45) Date of Patent: Dec. 29, 2020

(54) HIGH RESOLUTION GRAPHENE FILMS FOR ELECTROCHEMICAL SENSING VIA INKJET MASKLESS LITHOGRAPHY

(71) Applicant: Iowa State University Research Foundation, Inc., Ames, IA (US)

(72) Inventors: Jonathan Claussen, Ames, IA (US); John Hondred, Ames, IA (US); Loreen Stromberg, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 16/130,601

(22) Filed: Sep. 13, 2018

Related U.S. Application Data

(60) Provisional application No. 62/558,044, filed on Sep. 13, 2017.

(51) Int. Cl.

| | | |
|---|---|---|
| *B41M 5/00* | (2006.01) |
| *B41J 11/00* | (2006.01) |
| *C09D 11/32* | (2014.01) |
| *C09D 11/38* | (2014.01) |
| *G03F 7/16* | (2006.01) |
| *H01L 21/3205* | (2006.01) |
| *H01L 21/306* | (2006.01) |
| *H01L 21/283* | (2006.01) |
| *H01L 21/288* | (2006.01) |
| *H01L 21/32* | (2006.01) |

(52) U.S. Cl.
CPC ........ *B41M 5/0017* (2013.01); *B41J 11/0015* (2013.01); *C09D 11/32* (2013.01); *C09D 11/38* (2013.01); *G03F 7/168* (2013.01); *H01L 21/283* (2013.01); *H01L 21/288* (2013.01); *H01L 21/30604* (2013.01); *H01L 21/32* (2013.01); *H01L 21/32051* (2013.01)

(58) Field of Classification Search
None
See application file for complete search history.

(56) References Cited

PUBLICATIONS

L. Zhang et al., "Ink-Jet Printing High Resolution, Large Area Graphene Patterns by Coffee-Ring Lithography", Advanced Materials, vol. 24, pp. 436-440. (Year: 2012).*
N. Sahu et al., "Fundamental Understanding and Modeling of Spin Coating Process: A Review", Indian J. Phys. vol. 83, pp. 494-502. (Year: 2009).*

(Continued)

*Primary Examiner* — Jiong-Ping Lu
(74) *Attorney, Agent, or Firm* — McKee, Voorhees & Sense, PLC

(57) ABSTRACT

Methods, systems, and compositions to produce high resolution, highly scalable patterns on a variety of substrates. A high resolution sacrificial negative of the desired pattern in inkjet printed on the substrate with an inkjet printable ink. A viscous solution is coated or deposited over the negative pattern and substrate. The solution is stabilized such as by drying and adheres to the substrate. The sacrificial negative is removed, leaving the dried solution in the high resolution form factor defined by the removed negative. This allows the solution to be formulated without regard to meeting inkjet printing requirements but results in a high resolution final positive pattern on the substrate.

Figure 1:
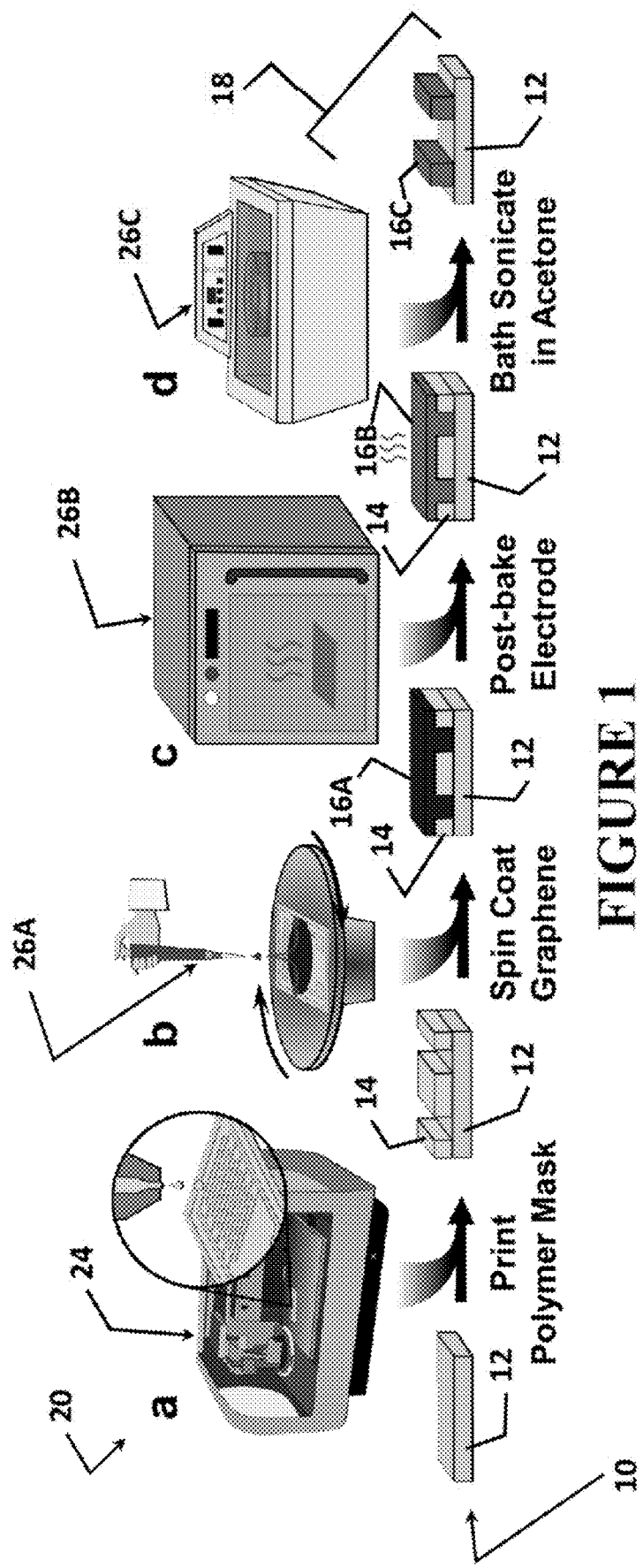

32 Claims, 64 Drawing Sheets
(52 of 64 Drawing Sheet(s) Filed in Color)

(56) References Cited

PUBLICATIONS

W. Yue et al., "Fabrication of Metallic Nanostructures of Sub-20nm with an Optimized Process of E-Beam Lithography and Lift-Off", Journal of Nanoscience and Nanotechnology, vol. 12, pp. 696-699. (Year: 2012).*

Cargill et al., "Effect of platinum nanoparticle deposition parameters on hydrogen peroxide transduction for applications in wearable electrochemical glucose biosensors", https://www.spiedigitaillibray.org/conference-proceedings-of-spie, 9 pages, downloaded on Sep. 5, 2017.

Chang et al., "A Circuits and Systems Perspective of Organic/Printed Electronics: Review, Challenges, and Contemporary and Emerging Design Approaches", IEEE Journal of Emerging and Selected Topics in Circuits and Systems, vol. 7, No. 1, 42 pages, Mar. 2017.

Claussen et al., "Electrochemical Biosensor of Nanocube-Augmented Carbon Nanotube Networks", ACS NANO, vol. 3, No. 1, pp. 37-44, 2009.

Claussen et al., "Nanostructuring Platinum Nanoparticles on Multilayered Graphene Petal Nanosheets for Electrochemical Biosensing", Advanced Functional Materials, vol. 22, pp. 3399-3405, 2012.

Claussen et al., "Electrochemical glutamate biosensing with nanocube and nanosphere augmented single-walled carbon nanotube networks; a comparative study", Journal of Materials Chemistry, vol. 21, pp. 11224-11231, 2011.

Claussen et al., Effects of Carbon Nanotube-Tethered Nanosphere Density on Amperometric Biosensing: Simulation and Experiment:, Journal of Physical Chemistry, vol. 115, pp. 20896-20904, 2011.

Das et al., "3D nanostructured inkjet printed graphene via UV-pulsed laser irradiation enables paper-based electronics and electrochemical devices", Nanoscale, vol. 8, pp. 15870-15879, Sep. 2016.

Das et al., "Electrical Differentiation of Mesenchymal Stem Cells into Schwann Cell-Like Phenotypes using Inkjet Printed Graphene Circuits", Adv. Healthcare Mater., 6(7), 14 pages, Feb. 2, 2017.

Hondred et al., "High Resolution Graphene Films for Electrochemical Sensing via Inkjet Maskless Lithography", CS Nano, 11(10), pp. 9836-9845, 2017.

Khan et al., "Technologies for Printing Sensors and Electronics Over Large Flexible Substrates: A Review", IEEE Sensors Journal, vol. 15, No. 6, 22 pages, Jun. 2015.

Krebs, Frederik C., "Fabrication and processing of polymer solar cells: A review of printing and coating techniques", Solar Energy Materials & Solar Cells, vol. 93, pp. 394-412, Nov. 25, 2008.

Mirri et al., "High-Performance Carbon Nanotube Transparent Conductive Films by Scalable Dip Coating", ACS NANO, vol. 6, No. 11, pp. 9737-9744, 2012.

Moridi et al., "Cold spray coating: review of material systems and future perspectives", http://tandfonline.com/action/journalinformation?journalcode=ysue20, pp. 369-395, published online Apr. 16, 2014.

Sahu et al., "Fundamental understanding and modeling of spin coating process: A review", Indian J. Phys., vol. 83(4), pp. 493-502, 2009.

Wong et al. "Flexible Electronics: Materials and Applications, Electronic Materials: Science & Technology", Chapters 6 & 7, 71 pages, 2009.

* cited by examiner

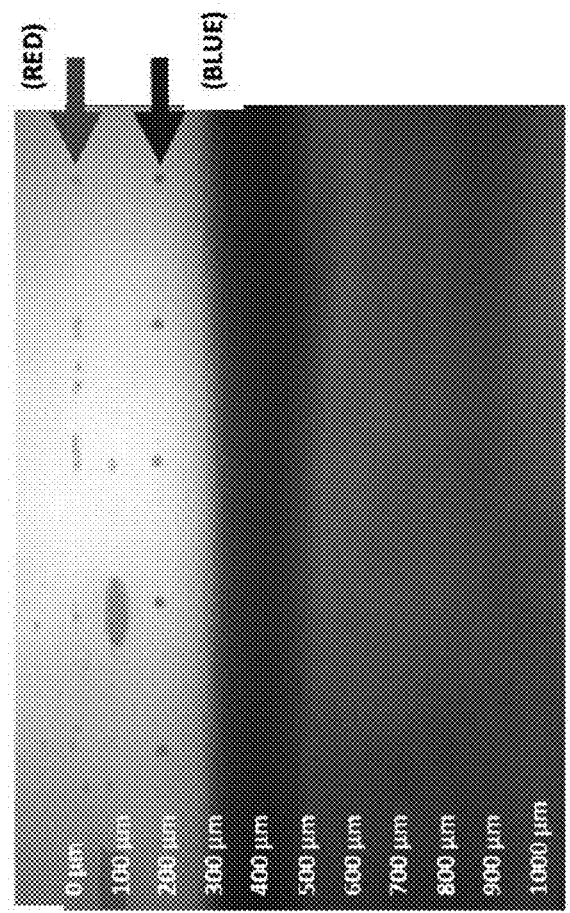
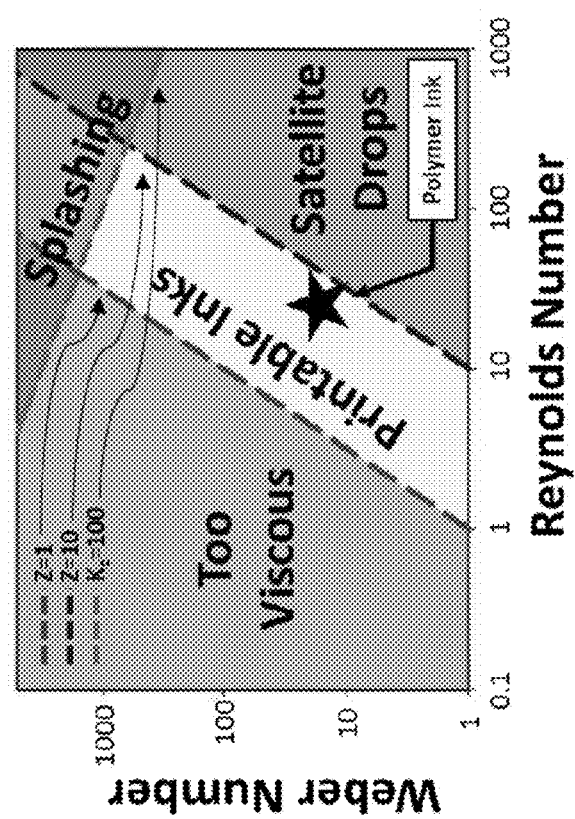
FIGURE 2A
FIGURE 2B

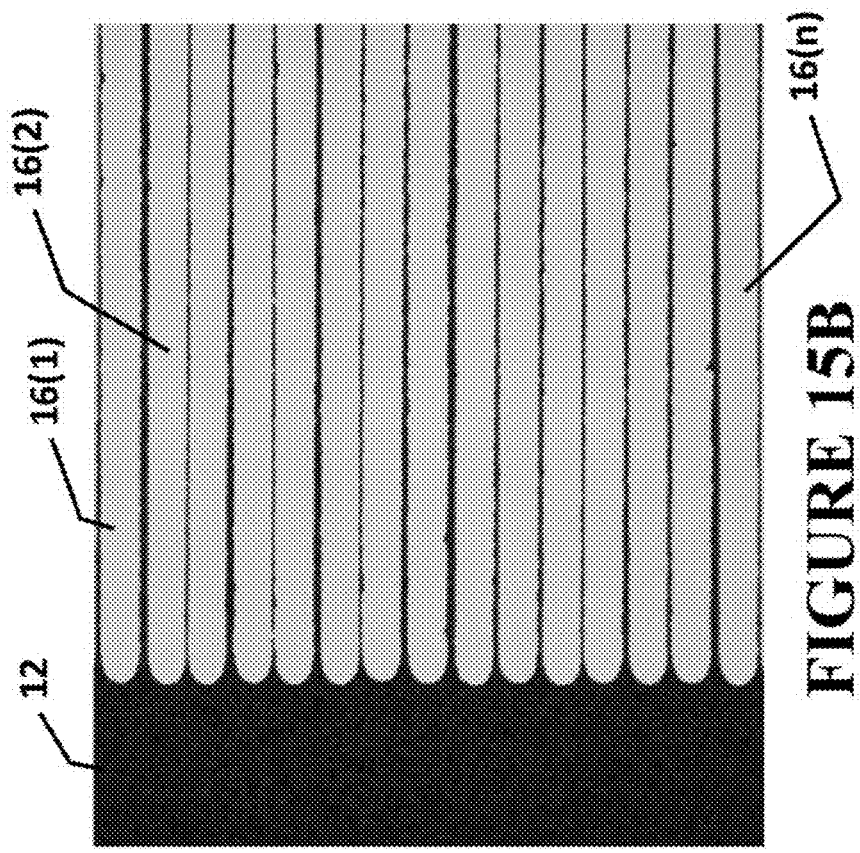
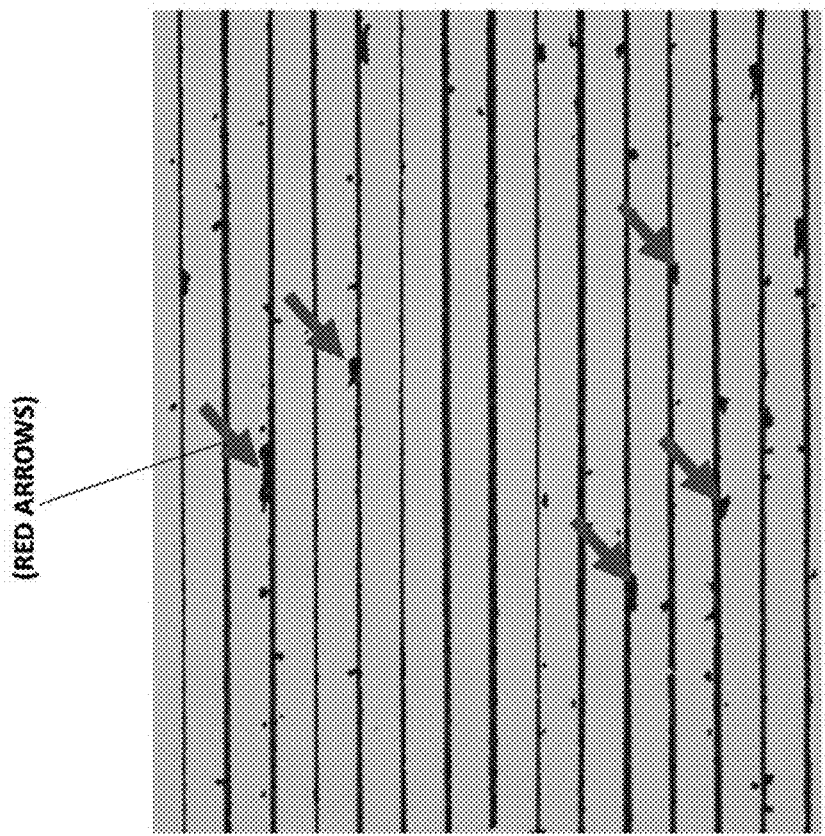
FIGURE 15B
FIGURE 15A (MOVIE 1 FRAME 1 AT APPROXIMATELY 30 FRAMES/SEC)

(MOVIE 1 FRAME 2)

(MOVIE 1 FRAME 10)

(MOVIE 1 FRAME 11)

(MOVIE 1 FRAME 20)

(MOVIE 1 FRAME 21)

(MOVIE 1 FRAME 107)

(MOVIE 1 FRAME 109)

(MOVIE 1 FRAME 110)

(MOVIE 1 FRAME 111)

(MOVIE 1 FRAME 113)

(MOVIE 1 FRAME 114)

(MOVIE 2 FRAME 1 -- ACETONE BATH) (APPROX. 30 FRAMES A SECOND)

(MOVIE 2 FRAME 99 –SUBMERSING COMBINED SUBSTRATE, INKJET PRINTED SACRIFICIAL LAYER, AND GRAPHENE-BASED OVERCOATING INTO BATH. NOTE: CANNOT SEE THE NEGATIVE PATTERN OF THE SACRIFICIAL LAYER).

(MOVIE 2 FRAME 141—SHOWING LIFT-OFF OF SOME OF THE GRAPHENE COATING FROM OVER WHERE THE SACRIFICIAL LAYER WAS JUST FROM SITTING IN THE BATH. NOTE: THE ACETONE PERMEATES OR PENETRATES THROUGH THE COMPLETE OVER-COAT OF GRAPHENE AND THEN DISSOLVES THE SACRIFICIAL LAYER UNDERNEATH, EVEN THOUGH THAT PROCESS CANNOT BE SEEN WITH THE HUMAN EYE).

(MOVIE 2 FRAME 147-SHOWS HOW JUST SITTING IN BATH AND MAYBE WITH SOME PERTURBATION OF THE COMBINATION, FURTHER LIFT OFF OCCURS)

(MOVIE 2 FRAME 167—SHOWS STILL FURTHER LIFT OFF, INCLUDING STARTING TO BE ABLE TO SEE WITH HUMAN EYE THE GRAPHENE THAT STAYS ADHERED TO THE SUBSTRATE IN ITS POSITIVE PATTERNS)

(MOVIE 2 FRAME 196—SHOWS LIFT PARTIALLY PROCESSED COMBINATION OUT OF BATH AND BEGINNING SPRAY WITH STREAM OF ACETONE TO PROMOTE FURTHER LIFTOFF OF GRAPHENE OTHER THAN THE POSITIVE PATTERNS—SEE STREAM OF ACETONE FROM NOZZLE AT TOP CENTER OF FRAME DIRECTED TO UPPER RIGHT-HAND PORTIONS OF COMBINATION. STREAM WIDTH IS INDICATED WITH ARROWS)

FIGURE M2 (MOVIE 2 FRAME 254—SHOWS HOW FURTHER SCANNING OF STREAM ACROSS TOP HALF OF COMBINATION REMOVES/LIFTS OFF MORE AND MORE GRAPHENE AND LEAVING PATTERNED GRAPHENE)

FIGURE M2 (MOVIE 2 FRAME 355 SHOWS FURTHER STREAM IMPINGEMENT HAS CLEANED ALMOST ENTIRE TOP 2/3 OF COMBINATION OF UNWANTED GRAPHENE AND REVEALS MOST OF POSITIVE PATTERNS AND SUBSTRATE AROUND THEM. NOTE WASHED OFF GRAPHENE THAT HAS FALLEN INTO THE BATH)

FIGURE M2 (MOVIE 2 FRAME 405 –SHOWS STREAM IMPINGEMENT ALMOST COMPLETELY CLEANED THE WHOLE COMBINATION)

FIGURE M2 (MOVIE 2 FRAME 586— SHOWS CLOSER UP VIEW OF MOSTLY CLEANED WHOLE COMBINATION AND CLEAN CUTOFF OF SMALL POSITIVE PATTERNS)

HIGH RESOLUTION GRAPHENE FILMS FOR ELECTROCHEMICAL SENSING VIA INKJET MASKLESS LITHOGRAPHY

CROSS-REFERENCE TO RELATED APPLICATIONS

This application claims the benefit of Provisional Application U.S. Ser. No. 62/558,044 filed on Sep. 13, 2017, all of which is herein incorporated by reference in its entirety.

GRANT REFERENCE

This invention was made with government support under USDA/NIFA contract no. 2016-67021-25038. The Government has certain rights in this invention.

I. BACKGROUND OF THE INVENTION

A. Field of the Invention

The present invention relates to high resolution patterns and, in particular, to methods, systems, and compositions to create such patterns from a starting viscous solution containing such things as conductive nanoparticles.

B. Problems in the State of the Art

The demand for highly efficient, small-scale circuits is high. Traditional techniques include photolithography, which require masks and relatively time-consuming and relatively complex process steps. An example, incorporated by reference herein, of a photolithography technique is: Claussen, et al., Electrochemical Biosensor of Nanocube-Augmented Carbon Nanotube Networks, *ACS Nano,* 2009, 3 (1), pp 37-44.

Inkjet printing, when properly configured, can offer both more flexibility and simplicity, but has inherent limitations in how small its resolution can get. Conductive inkjet printable inks have been developed, including use of graphene nanoparticles, but those resolution limitations for direct inkjet printing of circuits with such materials are not known to go below on the order of 50 µm line resolution. The nature of inkjet printing mandates that fluid properties of the ink, such as viscosity, surface tension, and density, fall within certain ranges for consistent droplet formation and pattern printing, which impacts resolution. Additionally, when the ink includes particles, such as conductive particles, particle size may affect printing resolution in terms of clogging printer nozzle(s), splatter, or inconsistencies. Important benefits could be achieved with better resolution. Coupled with such things as scalability, economy, and simplicity, as well as continuous production possibilities, there is valuable room for improvement in this technical area.

II. SUMMARY OF THE INVENTION

The invention therefore relates to methods, systems, and compositions which improve over or solve problems and deficiencies in this technical art.

This invention introduces a scalable manufacturing technique to develop high resolution, low-cost circuits based on graphene and other nanoparticle solutions for potentially a wide variety of applications and, in particular, electrochemical sensing. Some key points regarding the technology are:

1. High resolution graphene films (20 micron line resolution) that do not require the use of expensive photolithography. High resolution graphene circuits are important to developing highly efficient circuits such as the interdigitated electrode presented in one of the examples of this disclosure.
2. Manufacturing is highly scalable. One example of the process uses only inkjet printing and a solution deposition or coating technique, one non-limiting example being spin coating. Spin coating could also be transitioned to other coating techniques such as dip coating or drop casting. The printing and coating is amenable to, e.g., roll-to-roll manufacturing. The printing and coating processing can be easily programmed by software (e.g. computer aided design software) and thus do not require the use of a physical implement such as a stencil or gravure cylinder for each new design. Hence our invention permits rapid prototyping of new designs. Current high resolution graphene circuit techniques require the use of a stencil (made with photolithography) or a gravure cylinder to accomplish high resolution of graphene.
3. Formulated various nanomaterial solutions (e.g., graphene, silver nanoparticles, $MoS_2$ or others) solution for coating processes.
4. One example of this invention also includes the formation of an ink that is more viscous than inkjet printable graphene but less viscous than screen printed inks. Therefore, this unique ink formulation is suited for spin coating and dip coating processes.
5. One example of this invention includes using a low-cost (e.g. $150), benchtop laser (e.g. 1000 mW) to anneal graphene to improve its electrical conductivity. This laser can be used on graphene coated on thermally sensitive substrates (paper or polymers).
6. Printed graphene or other nano-material-based materials can be used, e.g., in various electrochemical sensing modalities such as with 2 and 3 electrode set-ups or for running cyclic voltammetry, amperometry, or impedance spectroscopy.

In one aspect of the invention, a method of creating high resolution patterns on any of a variety of substrates begins with inkjet printing a high resolution negative of the pattern on the substrate from sacrificial material. A nano-material-based solution materials is deposited or coated over the negative pattern and surrounding substrate. The combination is heated or annealed to reduce the solution and promote adherence of the nano-materials to the substrate. The sacrificial negative pattern and excess reduced nano-materials are removed leaving a high resolution positive pattern having resolution at least on the same order of resolution and accuracy as the negative pattern.

In another aspect of the invention a system for producing combinations such as described above includes an inkjet printer subsystem capable of high resolution pattern printing of appropriate sacrificial materials as ink down in the at least the 20 micron line width range. A solution deposition or coating subsystem is adapted to coat and reduce the nano-material-based solution on top of the inkjet printed substrate as discussed above. A material removal subsystem is configured to remove the sacrificial inkjet printed material and non-desired nano-material-based material to leave a positive pattern of nano-material-based material adhered to the substrate and on the order of the same resolution as the inkjet printed high resolution negative pattern. The system is scalable regarding the size of the substrates, the size, number and form factor of the inkjet-printed negative patterns, and thus the final end products.

In another aspect of the invention, an article of manufacture comprises the end product described above. In specific non-limiting exemplary embodiments, deposition or coating can be with spin coating, reducing of the solution is through heating in any of a number of ways, and removal of material is through sonication and dissolving.

In another aspect of the invention, a nano-material-based solution comprises nanomaterials as at least part of the solute and a solvent fluid. The resulting viscous solution can have characteristics, e.g. concentration of nanomaterials, that would not typically be able to be inkjet printed. In one example, the nano-material is electrically conductive particles that could be used as electrical circuitry. In another aspect of the invention, the sacrificial material is configured into inkjet-printable ink to achieve consistent droplet formation and high resolution pattern onto a variety of substrates with inkjet printing to the small scale range mentioned above. Some of the ink characteristics include viscosity, surface tension, and density limits.

These and other objects, features, aspects, and advantages of the invention will become more apparent with reference to the accompanying specification and claims.

III. BRIEF SUMMARY OF THE DRAWINGS

Reference to appended drawings will be made from time to time in some of the examples of the invention set forth in this written description. Those drawings are summarized below.

The patent or application file contains at least one drawing executed in color. Copies of this patent or patent application publication with color drawing(s) will be provided by the Office upon request and payment of the necessary fee.

FIG. 1. Schematic depicting a four-step manufacturing process 10 for IML graphene patterning according to one exemplary embodiment of system 20 of the invention. (Step a) A sacrificial polymer layer 14 is inkjet printed (by an ink jet printer subsystem 24) onto the substrate 12 as the negative design pattern. (Step b) Highly concentrated graphene ink 16A is spin coated (by a coating or deposition subsystem 26A) evenly over the entire surface. (Step c) A post-bake process (by an annealing subsystem 26B) increases the adhesion of the graphene to the substrate 12. (Step d) The sacrificial layer 14 is removed (by a removal subsystem 26C) and graphene lift-off occurs with a sonicated acetone bath to produce the final graphene pattern 16C on substrate 12 (final product 18).

FIGS. 2A and B. Polymer lacquer fluid properties for the exemplary embodiment of FIG. 1. (FIG. 2A) Graphical representation of optimized inkjet printing parameters plotted versus the non-dimensional Reynolds and Weber numbers. Star indicates where the developed printable polymer ink falls within these parameters. (FIG. 2B) Optical image of the polymer ink (~dia. 10 μm) without any satellite droplets where the red arrow points to the 1 pL nozzle tips and the blue arrow points to droplets acquired immediately after expulsion from the inkjet printer nozzle.

Figure 3:
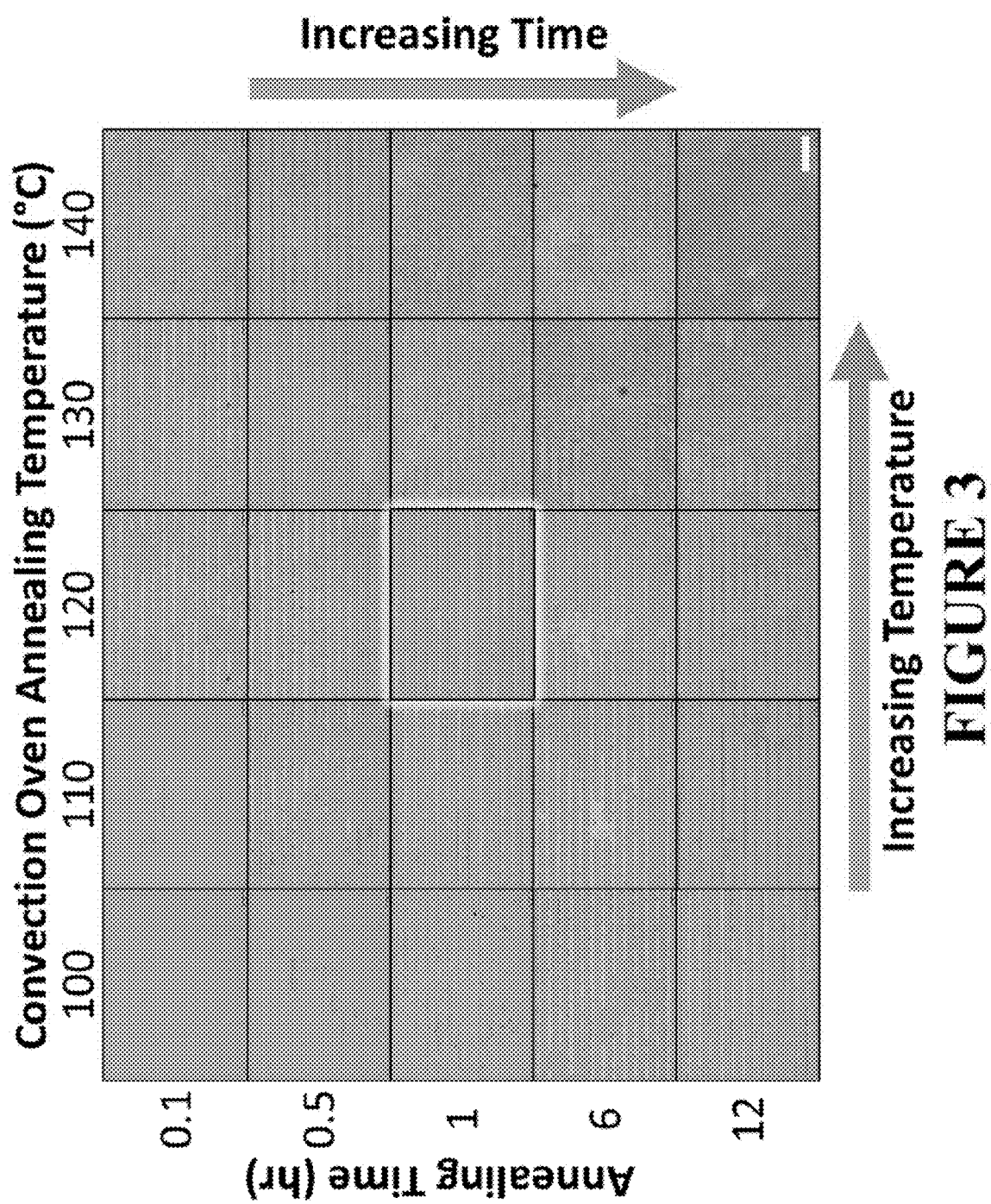

FIG. 3. A 5×5 panel of optical images illustrating the efficiency of the graphene lift-off method according to the temperature and time of the graphene post-bake according to the exemplary embodiment of FIG. 1. Top Left: Spin coated graphene and sacrificial polymer are completely removed exposing the bare Si/SiO$_2$ wafer (purple). Bottom Right: Spin coated graphene (green) completely covers the surface of the wafer as the underlying polymer sacrificial layer is not removed. Center: Highlighted center image shows high-resolution graphene lines with efficient graphene lift-off process. Scale bar equals 250 μm.

Figure 4A:
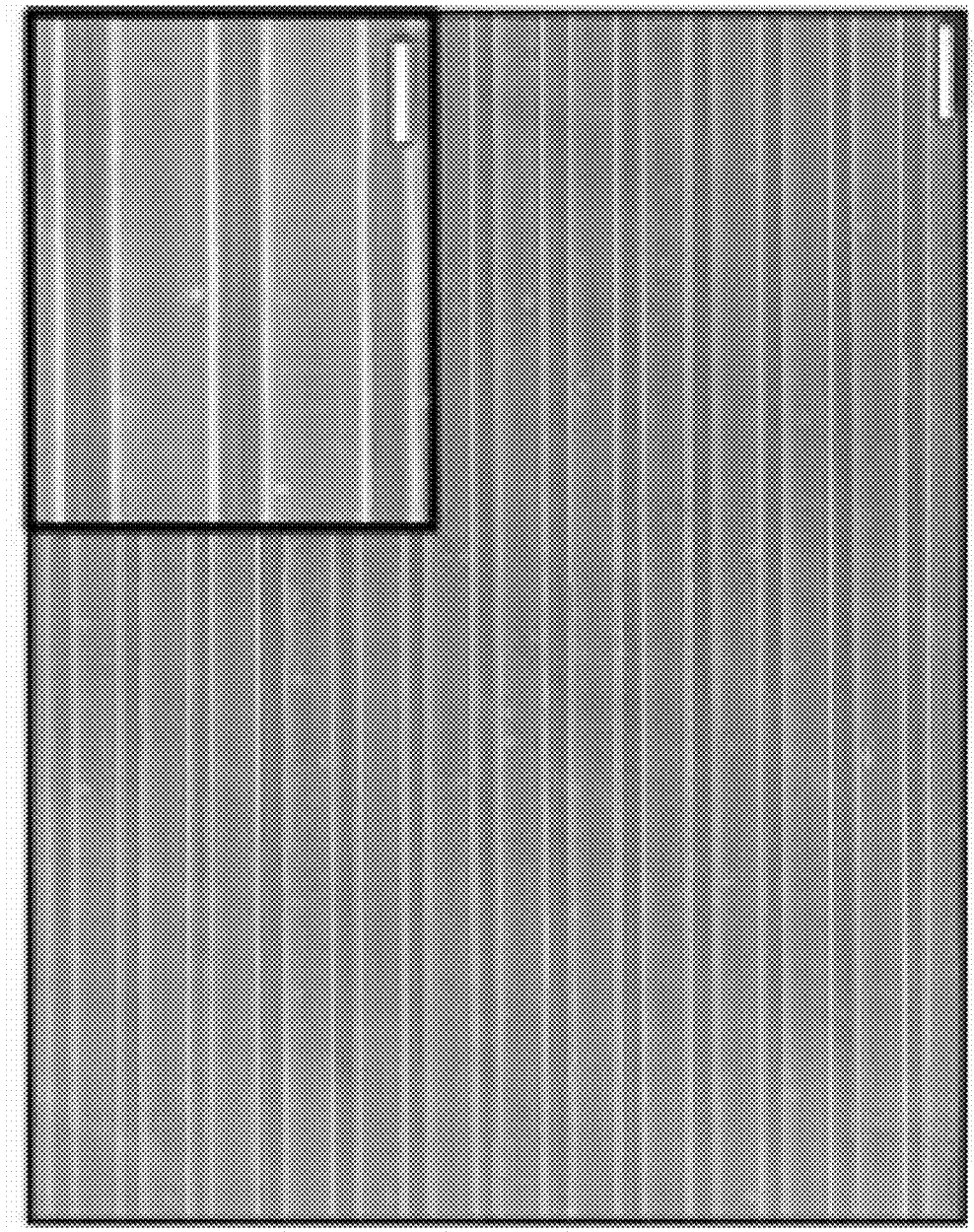
Figure 4B:
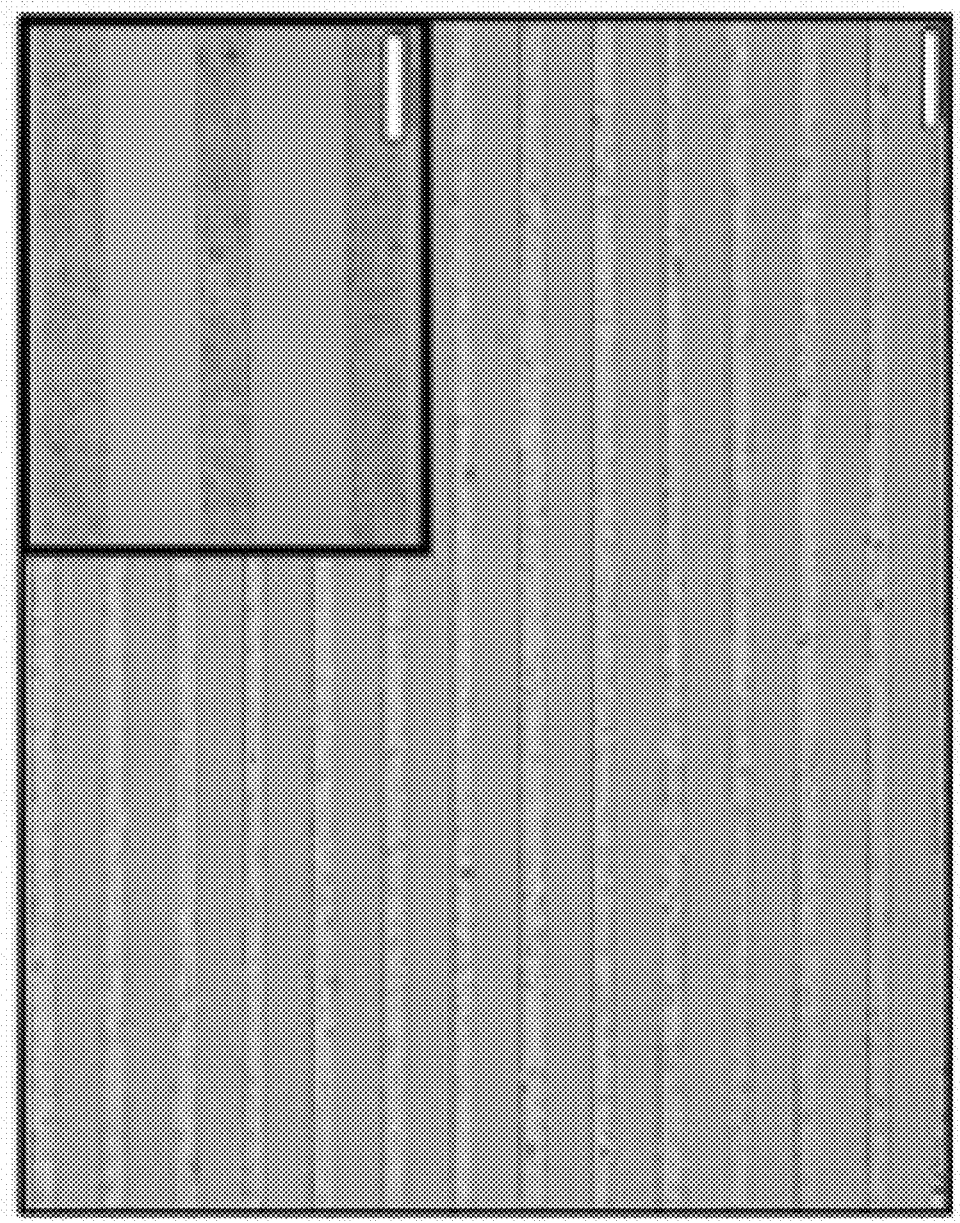
Figure 4C:
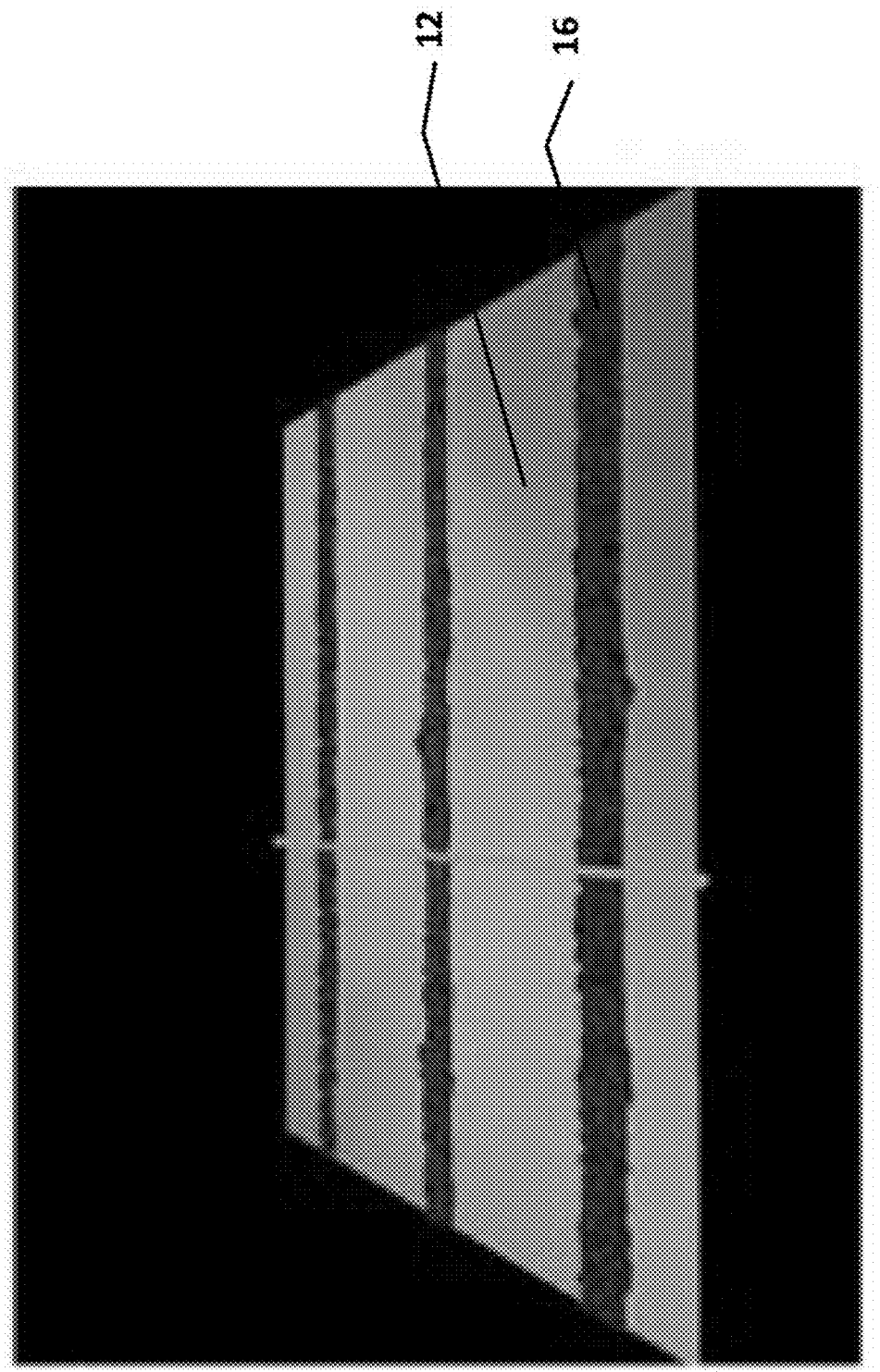
Figure 4D:
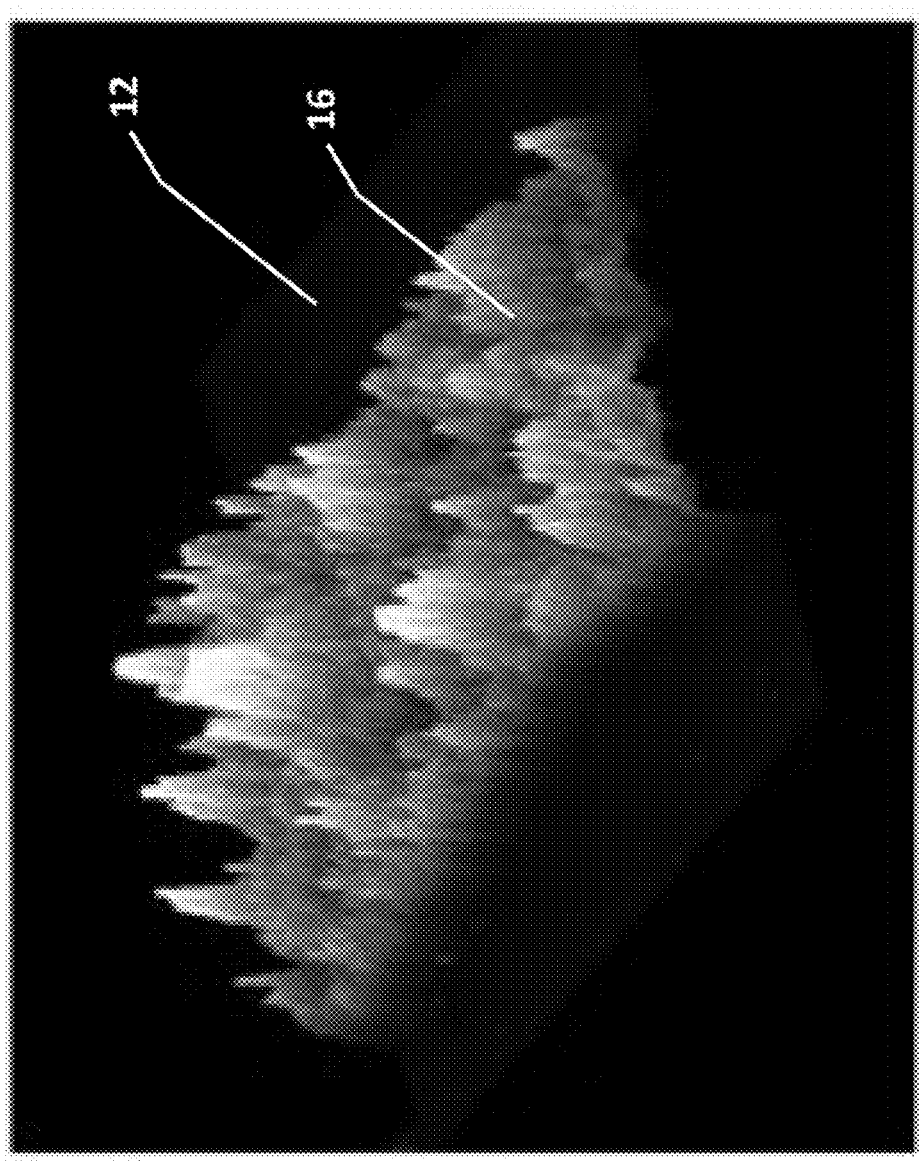
Figure 4E:
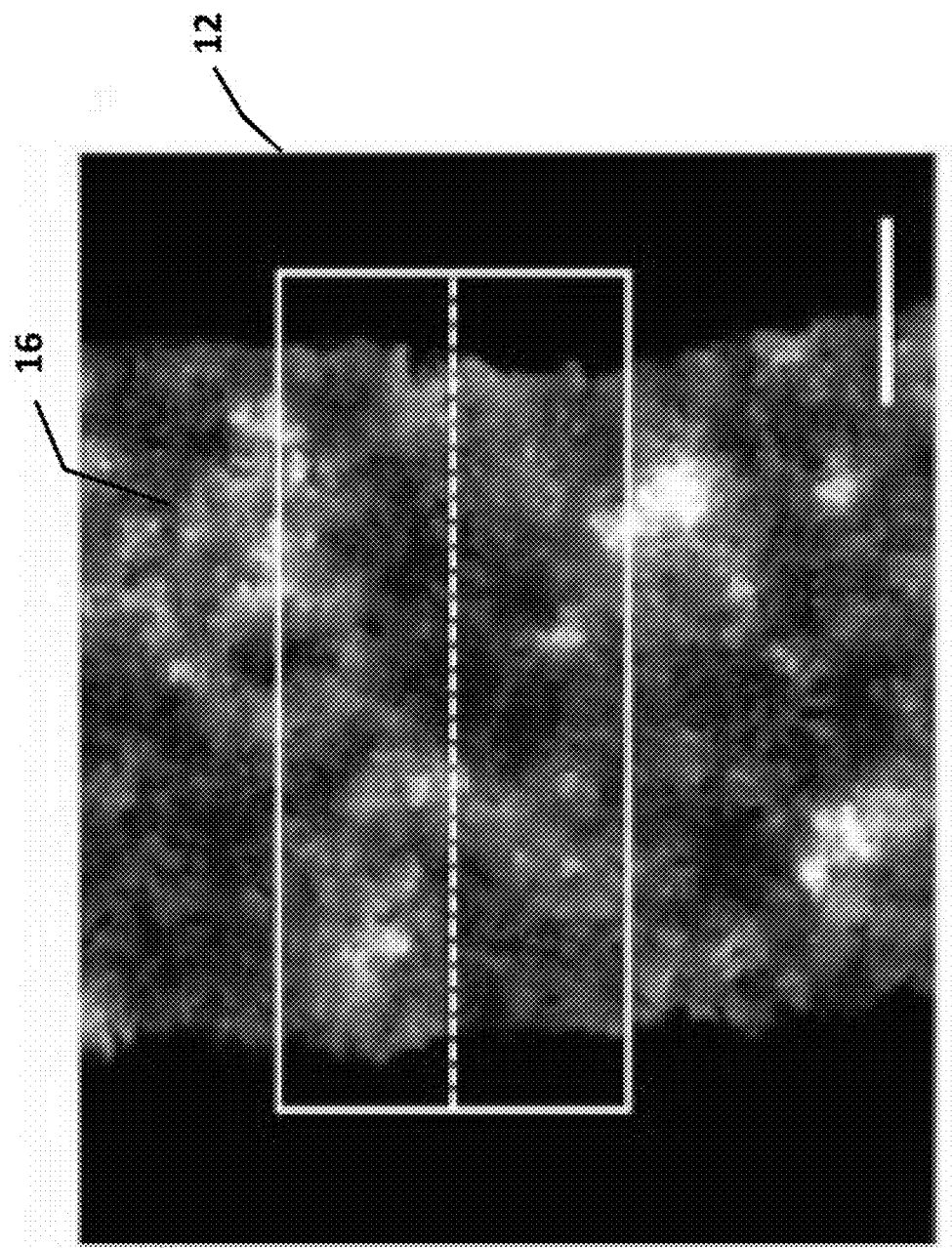
Figure 4F:
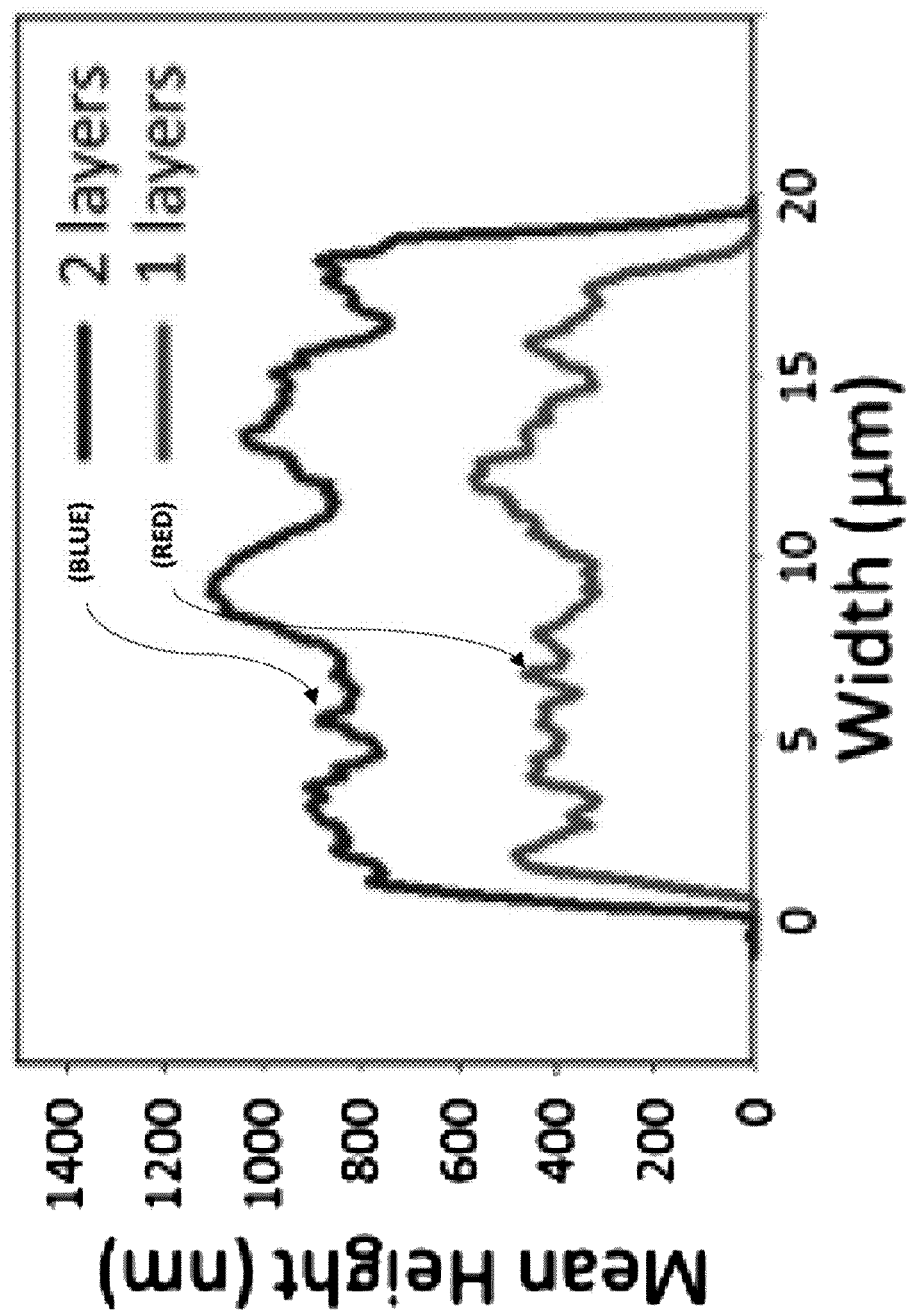

FIGS. 4A-F. Line resolution of graphene 16B patterned with the IML method Si/SiO$_2$ wafer 12 according to the exemplary embodiment of FIG. 1. (FIG. 4A) Optical microscopy images of inkjet printed polymer sacrificial layer, scale bar 100 μm. Upper right corner: Magnified inset shows 50 μm polymer lines with 20 μM spaces, scalebar 50 μm. (FIG. 4B) Graphene pattern after IML, scale bare 100 μm. Upper right corner: Magnified inset showing 20 pin graphene lines, scalebar 50 μm. Printed graphene lines analyzed with (FIG. 4C) confocal microscopy, (FIG. 4D) cross-sectional 3D AFM imaging, and (FIG. 4E) top view 2D AFM imaging. The dotted white line in (e) depicts the average cross section used to determine the graphene height profiles presented in (FIG. 4F). Averaged cross section height (f) of I (red) and 2 (blue) spin coated layers of graphene using IML.

FIGS. 5A-F. Electrochemical H$_2$O$_2$ sensing characterization with the IML graphene electrode 30 on heat treated PET 12 according to the exemplary embodiment of FIG. 1. (FIG. 5A) Graphene electrode 30 fabricated with IML, laser annealed, and electroplated with platinum nanoparticles to form a H$_2$O$_2$ sensor. (FIG. 5B) SEM of IML graphene electrode before (top) and after (bottom) laser annealing. Scale bar 5 μm. (FIG. 5C) SEM of electrodeposited platinum nanoparticles onto graphene electrode. Scale bare is 5 μm. Upper right corner: Magnification of typical platinum nanoparticles on graphene. Scale bar is 500 nm. (FIG. 5D) Cyclic voltammetry of H$_2$O$_2$ sensor in IX PBS (Black) with 100 μm H$_2$O$_2$ additions. (FIG. 5E) Amperometric H$_2$O$_2$ sensing showing current response for concentration step increases of 0.1 μm (orange arrows), 1 μm (purple arrows), 10 μm (green arrows) and 100 μM (red arrows) additions. Inset shows magnified view of 0.1 μM and 1 μM additions. (FIG. 5F) Concentration verses current graph illustrating the linear sensitivity of the H$_2$O$_2$ sensor. Inset shows magnified view of current response for 0.1 μM, 1 μM, and 10 μM concentration additions.

FIGS. 6A-E. IML graphene design and IDE characterization according to the exemplary embodiment of FIG. 1. (FIG. 6A) Array of IDEs 40 showing the negative IDE inkjet printed pattern using a sacrificial polymer layer (left) and the resultant graphene IDE pattern after MIL on a silicon wafer (right) on Si/SiO$_2$ wafer. Upper corner images show magnified view of IDE patterns 40(1)-(n). (FIG. 6B) High resolution tilted-view SEM micrograph of resultant graphene IML IDE. Scale bar is 100 μm. (FIG. 6C) SEM displaying edge of graphene pattern. Scale bar is 20 μm. (FIG. 6D) Diagram of total impedance vs frequency behavior for various concentrations of KCl (Bode Plot). (FIG. 6E) Nyquist impedance plots for three different size IDEs with four distinct concentrations of KCl.

FIGS. 7A-D. Optical images of resultant inkjet printed sacrificial layer according to the exemplary embodiment of FIG. 1. (FIG. 7A) 50 μm circles of sacrificial layer with 50 μm spacing between drops. (FIG. 7B) Printed sacrificial layer in IDE design with 50 μm width and 25 μm spacing. (FIG. 7C) Sacrificial layer in IML logo pattern. (FIG. 7D) Magnification of patterned IML Logo.

Figure 8:
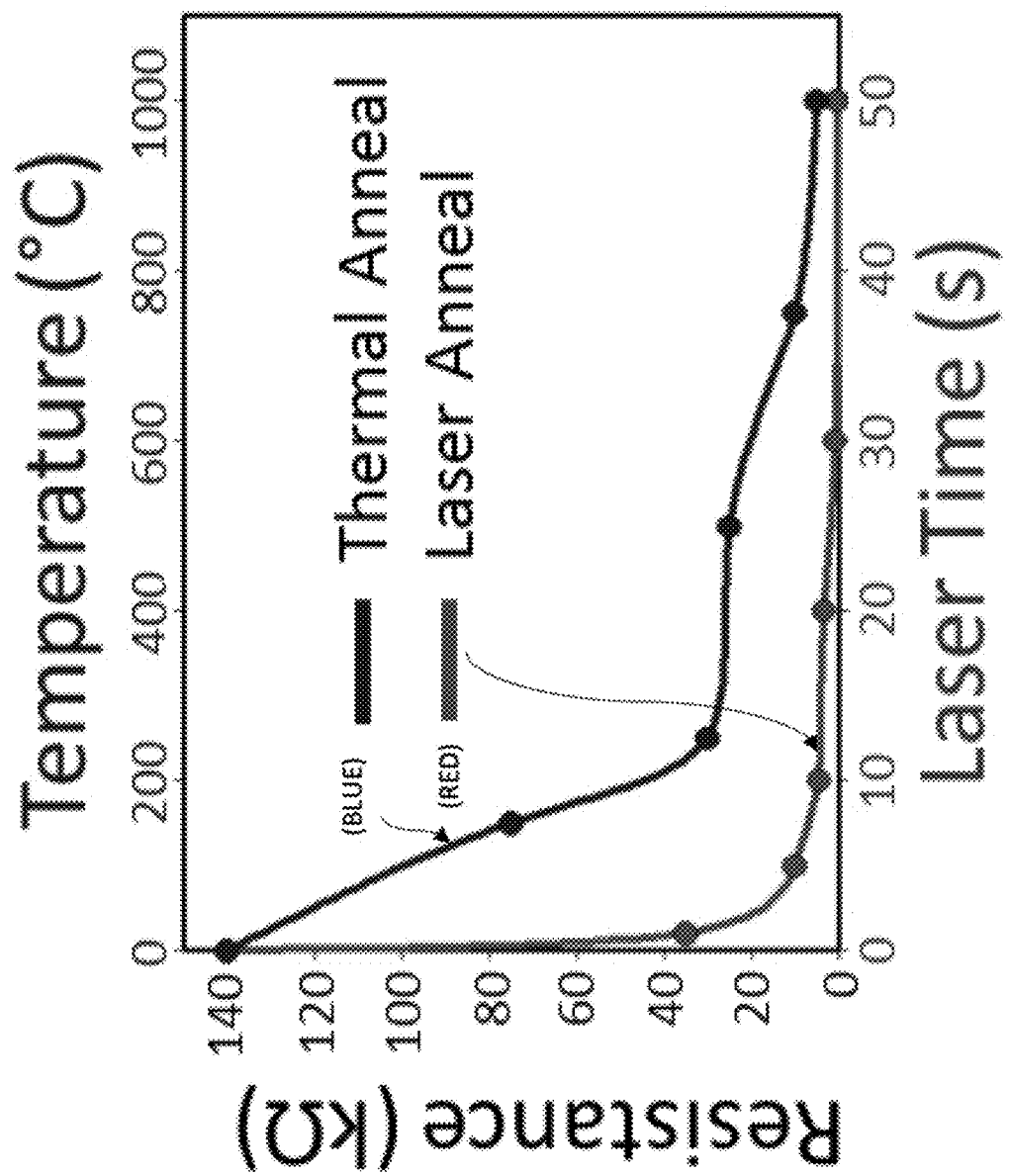

FIG. 8. Annealing of patterned graphene after IML according to the exemplary embodiment of FIG. 1. Blue: Thermal annealing of graphene with increasing temperatures on Si/SiO$_2$ wafer. Red: Laser annealing of graphene with increasing laser time on heat treated. PET.

Figure 9A:
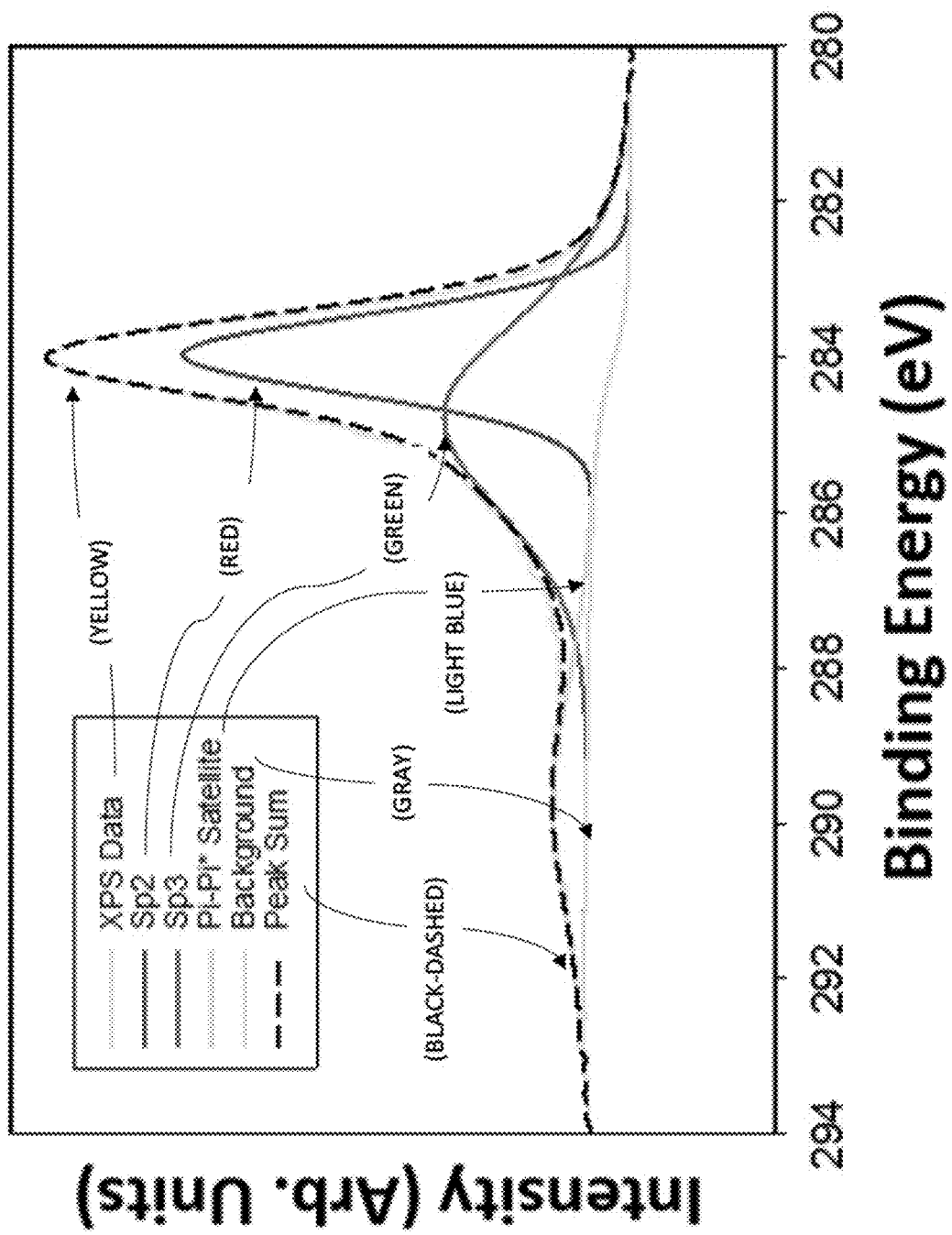
Figure 9B:
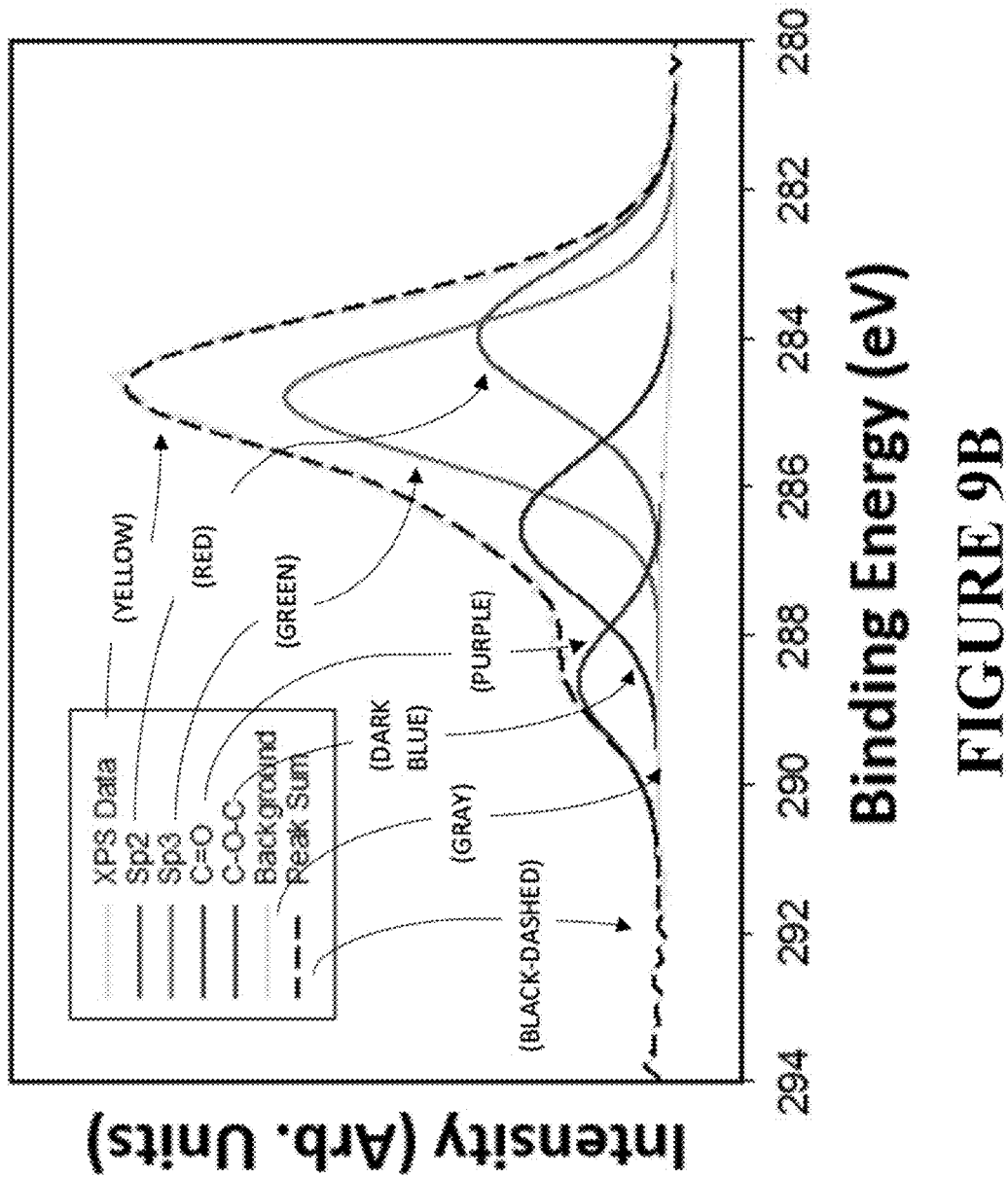

FIGS. 9A-B. XPS graphs of IML graphene on heat treated PET (FIG. 9A) without annealing and (FIG. 9B) after laser annealed in an ambient oxygen atmosphere according to the exemplary embodiment of FIG. 1.

Figure 10:
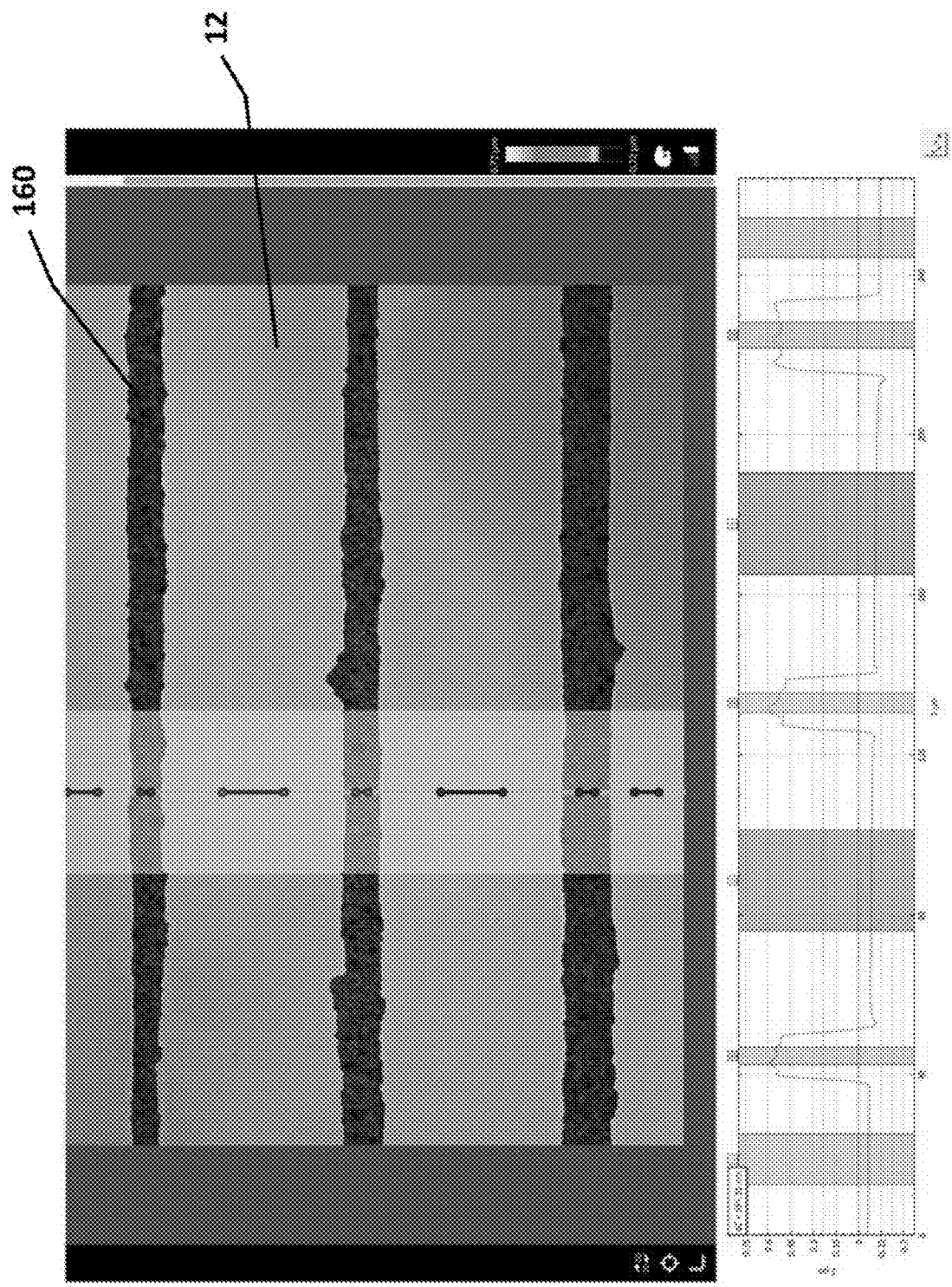

FIG. 10. Confocal microscopic images of graphene line 16 with average cross-sectional height on Si/SiO$_2$ wafer 12 according to the exemplary embodiment of FIG. 1.

Figure 11A:
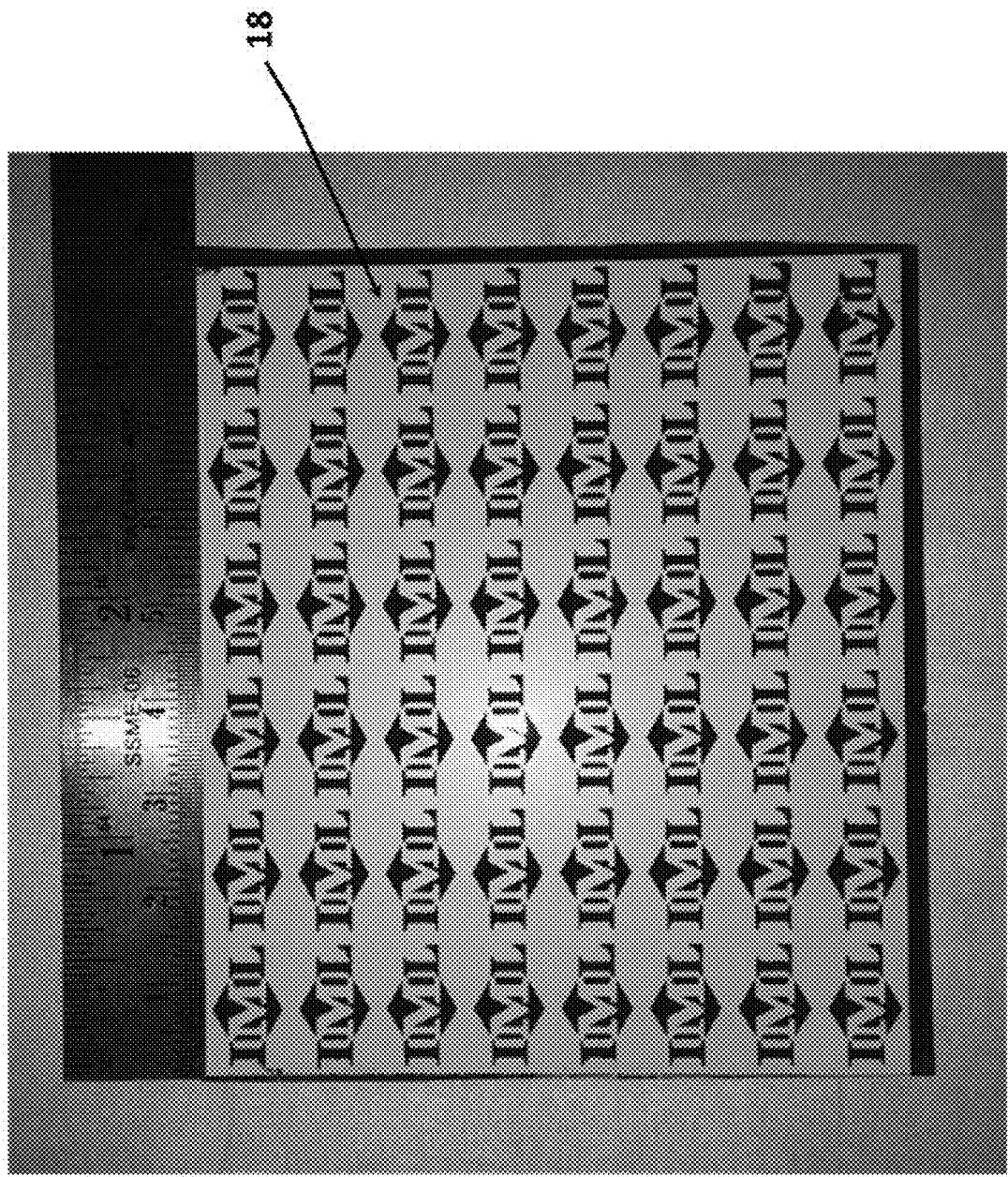
Figure 11B:

FIGS. 11A-B. (FIG. 11A) Graphene and (FIG. 11B) silver IML patterns created via the inkjet maskless lithography (IML) technique on heat treated PET (combined end product 18) according to the exemplary embodiment of FIG. 1.

Figure 12:
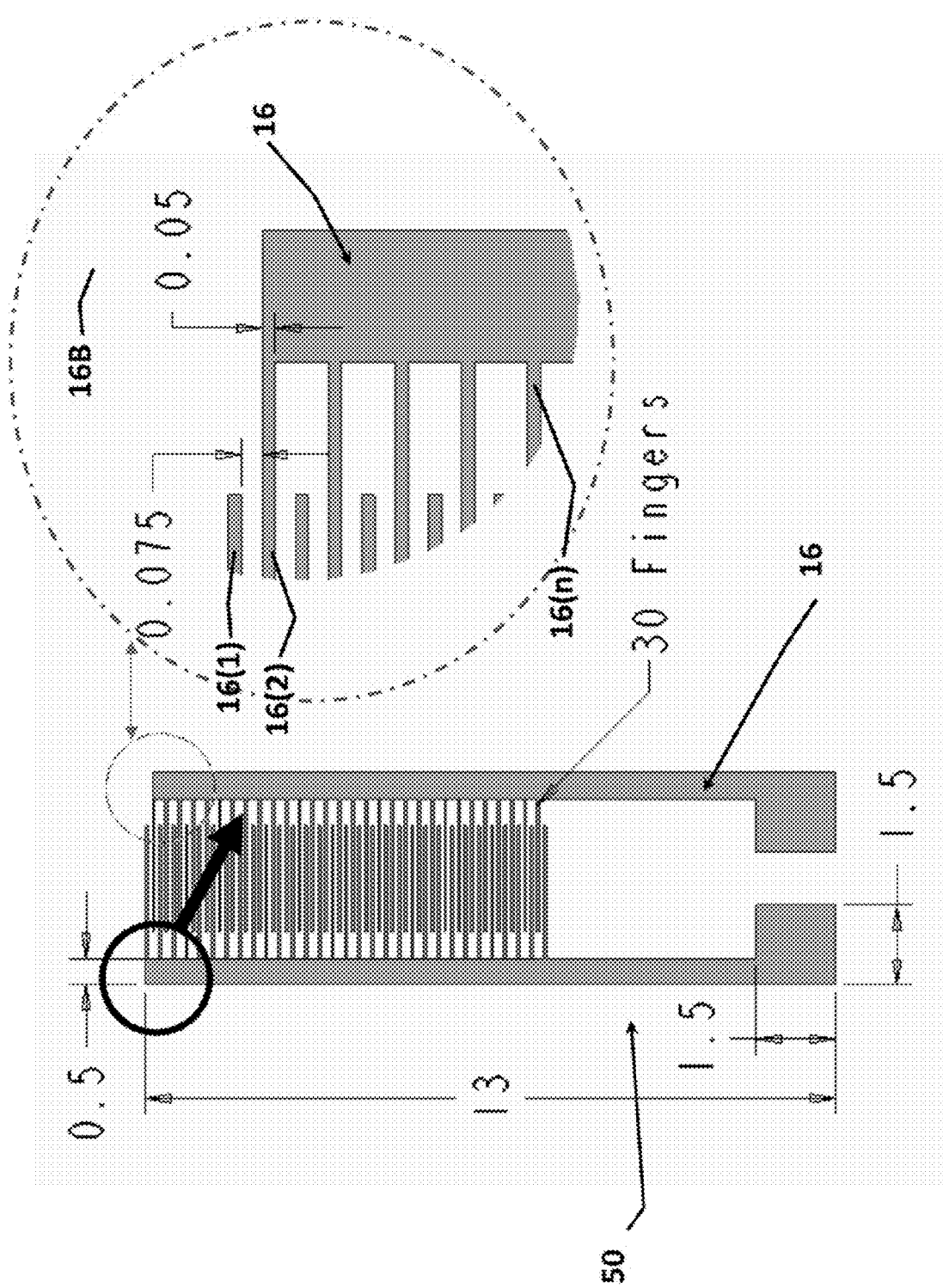
Figure 13A:
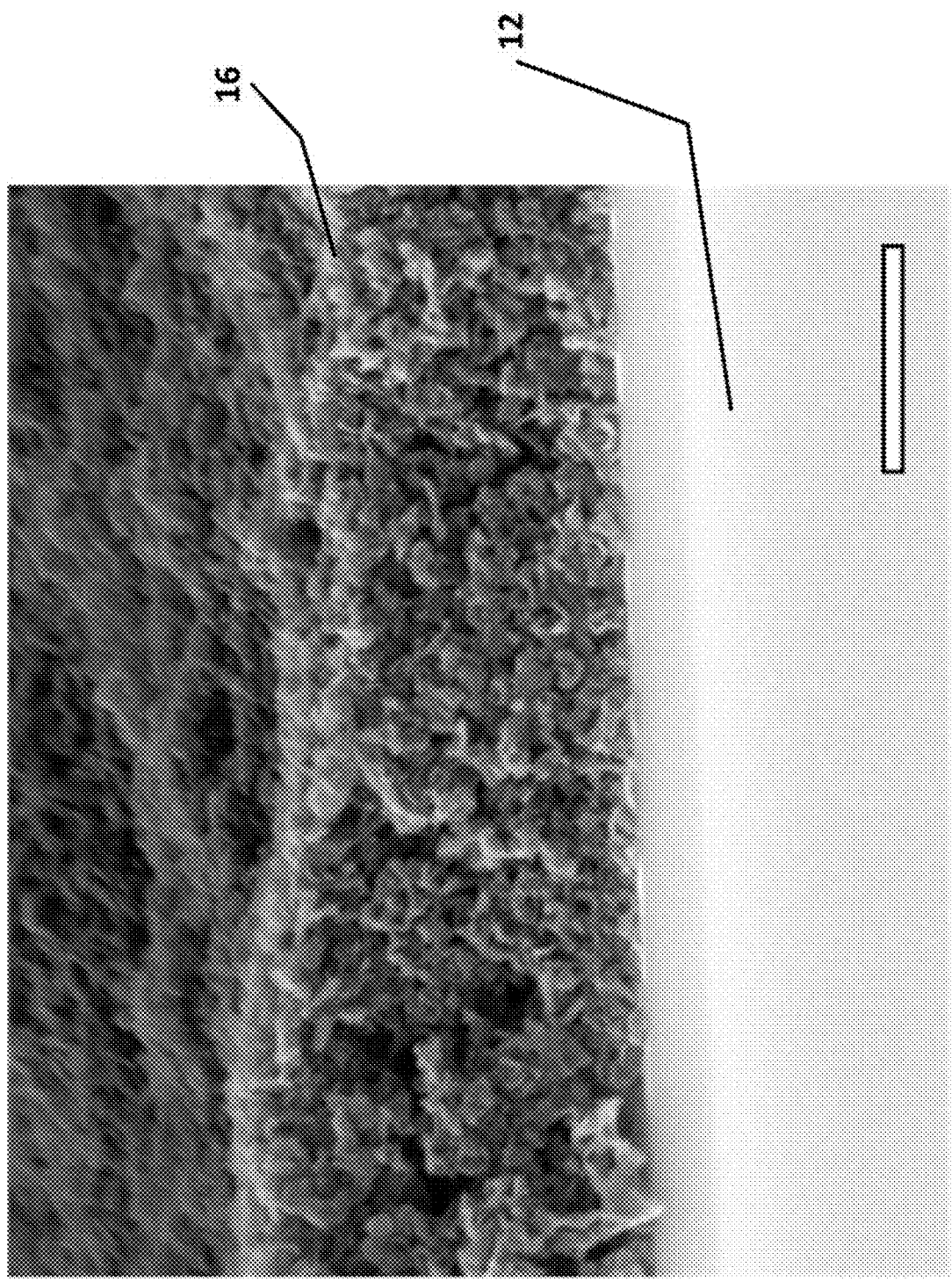
Figure 13B:
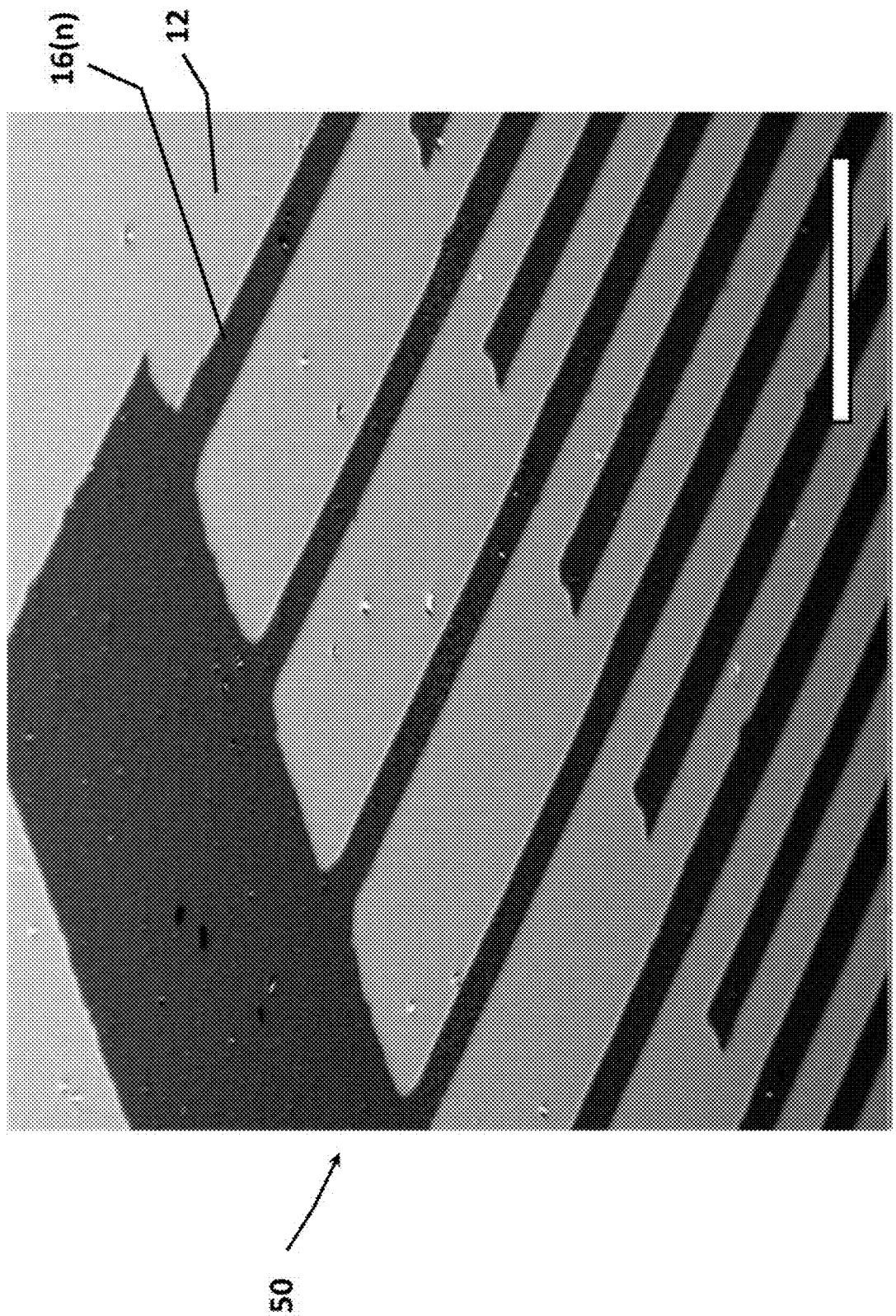
Figure 13C:
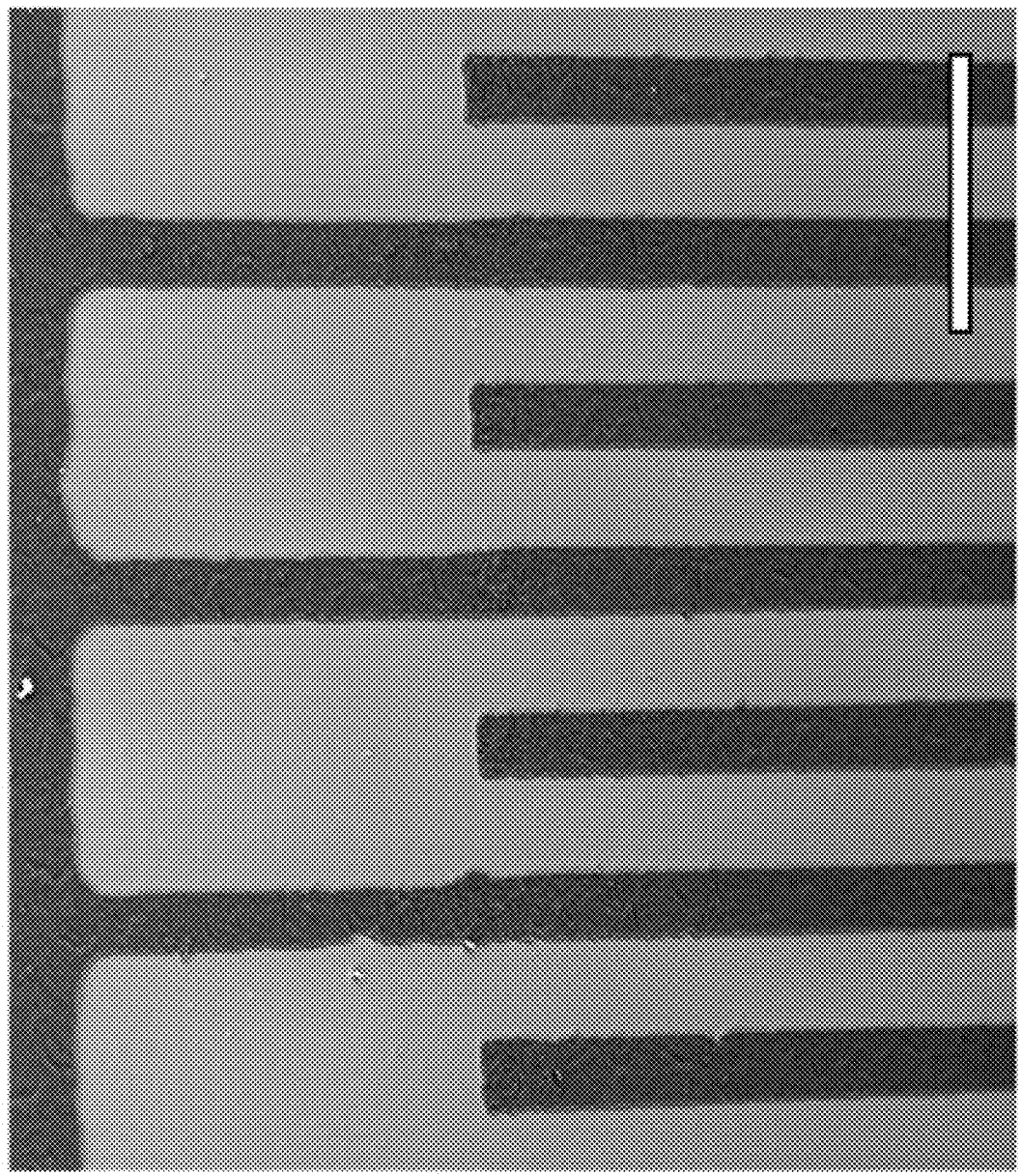
Figure 13D:
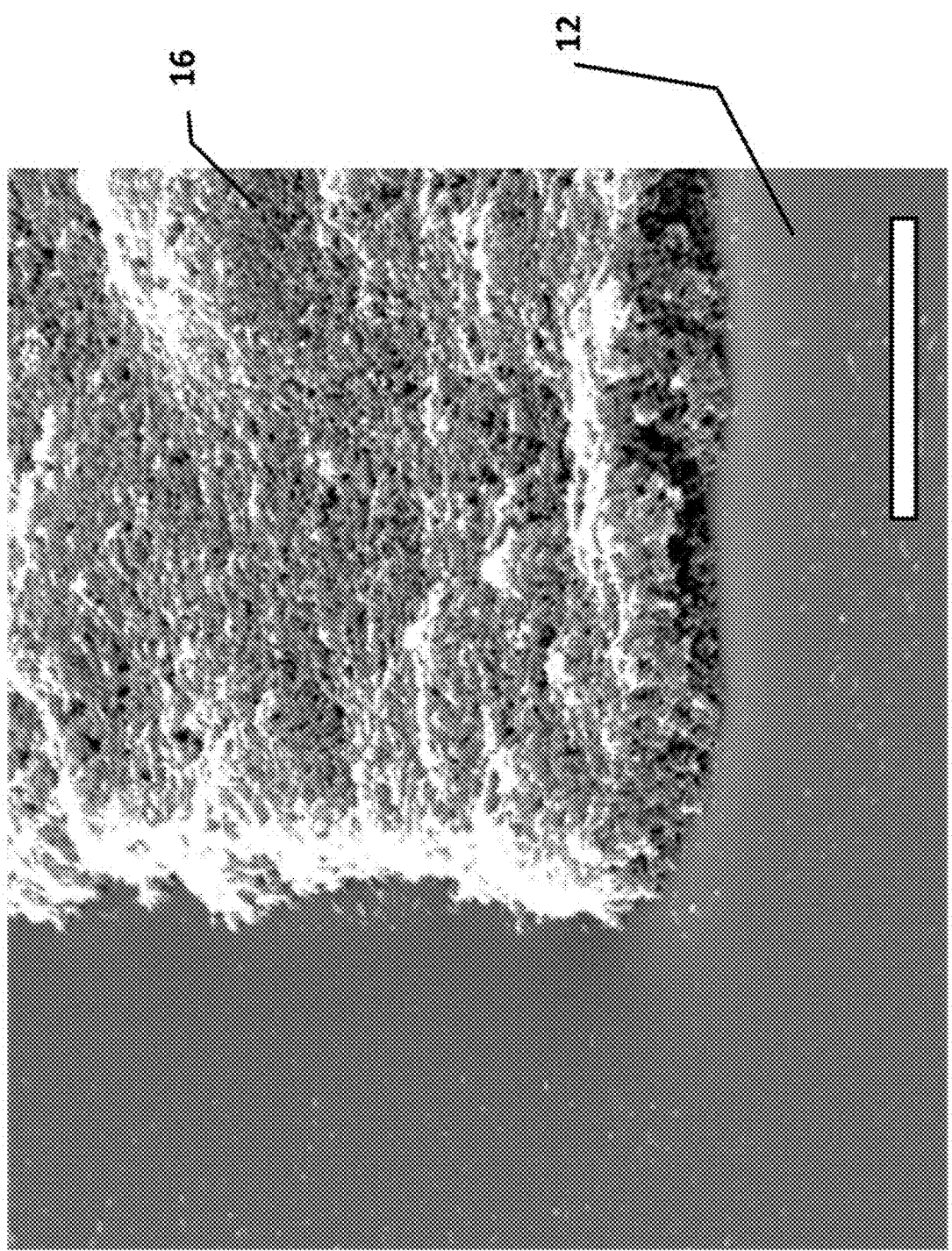
Figure 14A:
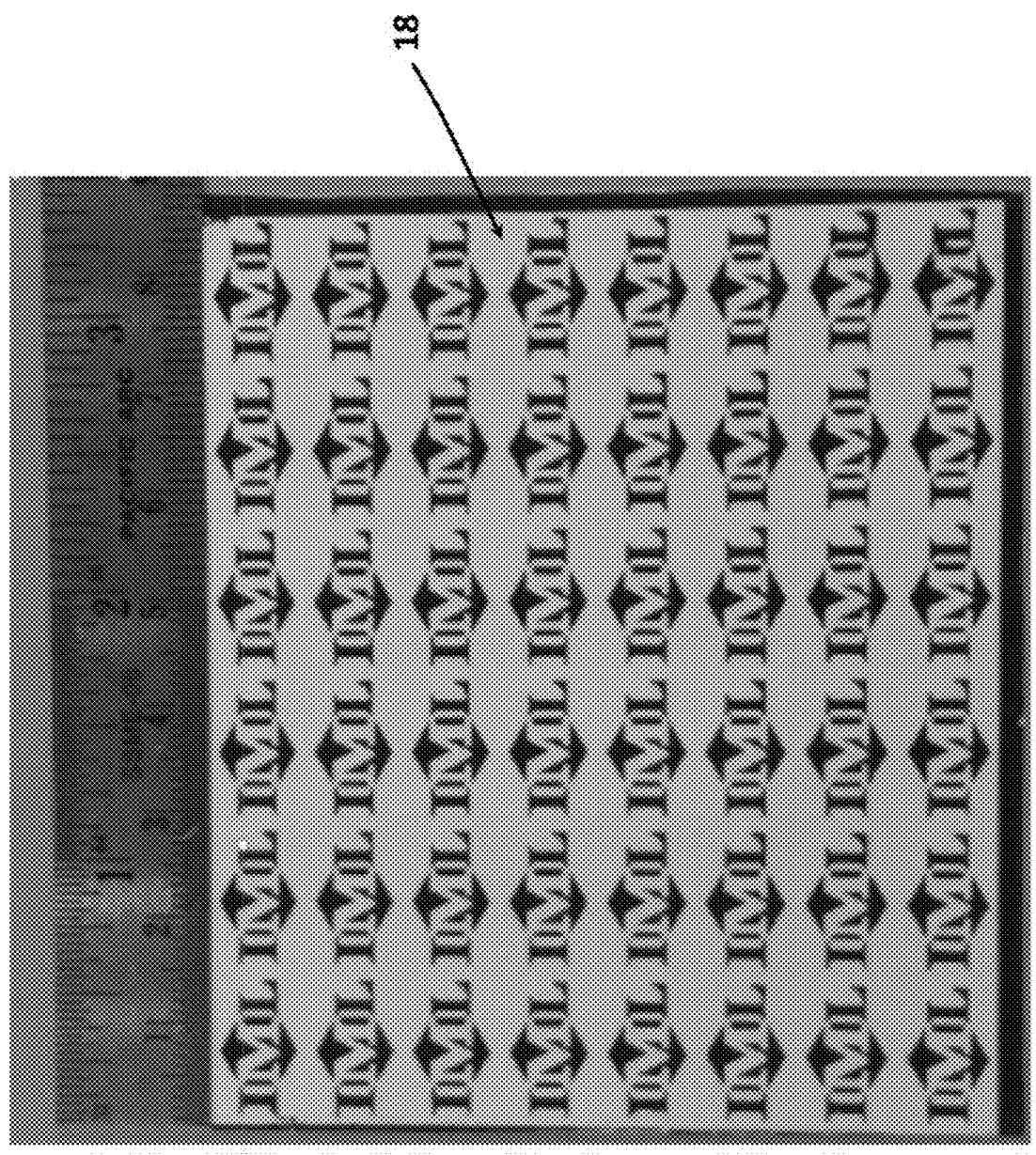
Figure 14B:
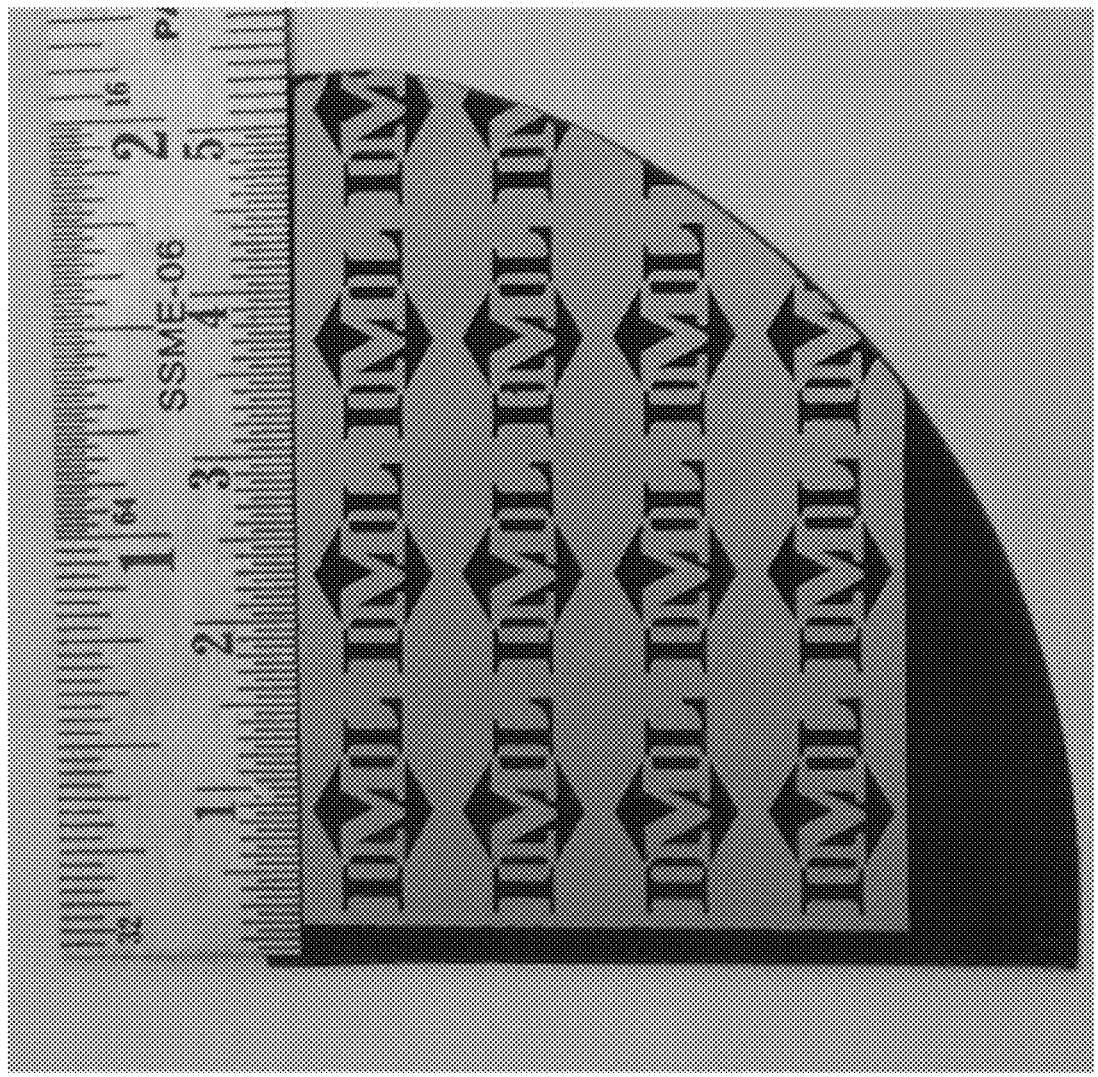
Figure 14C:
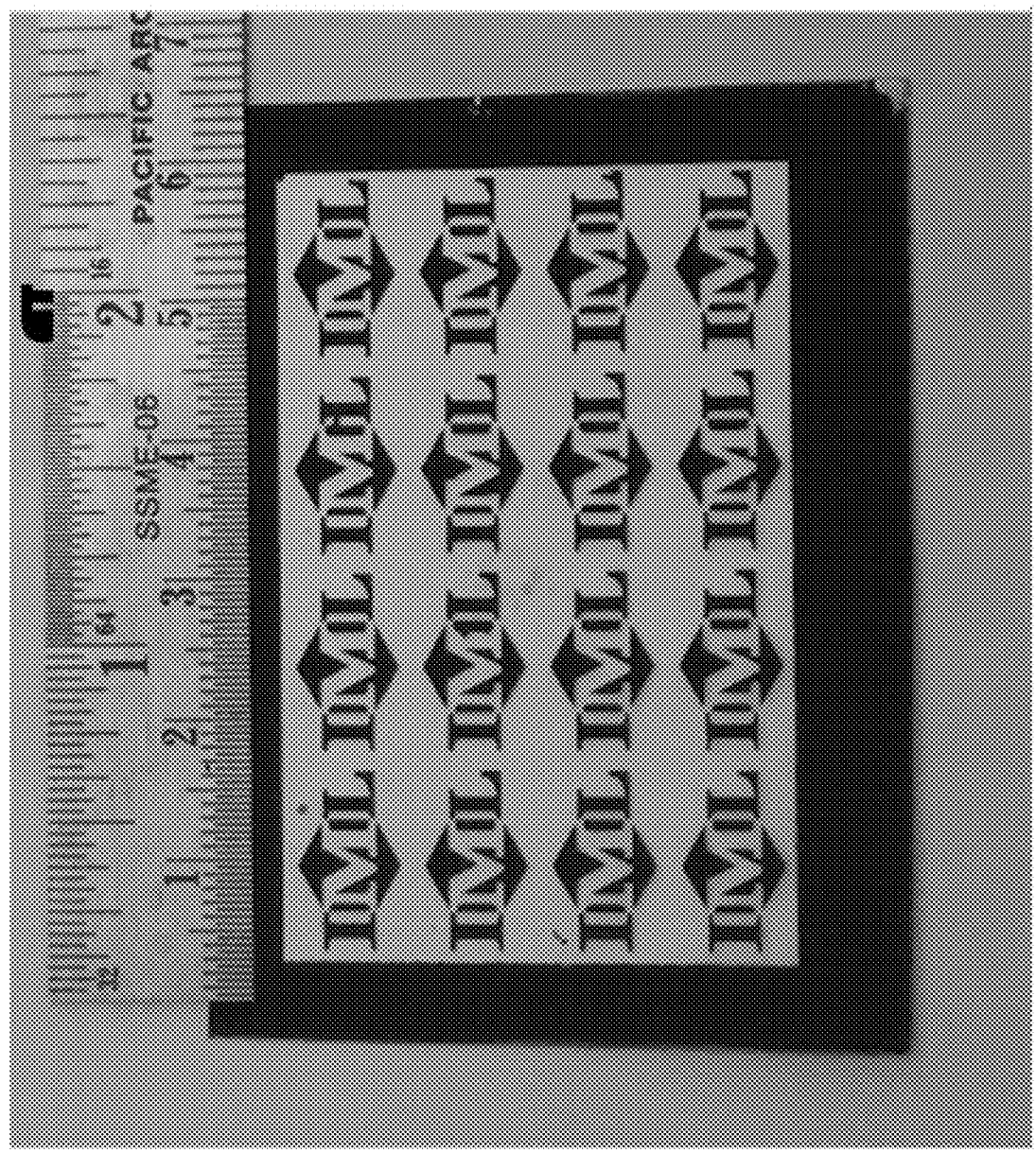
Figure 14D:

FIG. 12. Interdigitated 16(1) . . . 16(n) electrode (IDE) design of graphene electrodes 50 according to an exemplary embodiment of the invention.

FIGS. 13A-D. SEM of graphene IDE created via IML on a Si/SiO$_2$ wafer according to an exemplary embodiment of the invention. (FIG. 13A) Cross-section of graphene, scale bar 1 μm. (FIG. 13B) Horizontal angled view of graphene IDE, scale bar 200 μm. (FIG. 13C) Vertical angled view of IDE, scale bar 200 μm. (FIG. 13D) Magnified vertical angled view of graphene, scalebar 5 μm.

FIGS. 14A-D. Graphene IML logo on various substrates according to an exemplary embodiment of the invention: (FIG. 14A) kemafoil (heat treated PET), (FIG. 14B) silicon wafer, (FIG. 14C) clear PET, and (FIG. 14D) Polymide tape (Kapton®).

FIGS. 15A-B. Graphene lines on heat treated PET after IML patterning according to an exemplary embodiment of the invention. (FIG. 15A) Graphene flakes (red arrows) fusing together suspending over the sacrificial layer and not completely removed in acetone bath. (FIG. 15B) Patterned graphene after sonication or impingement from acetone wash bottle with no unwanted graphene flakes. Individual high resolution graphene lines shown at 16(1) . . . 16(n).

Figure 16:
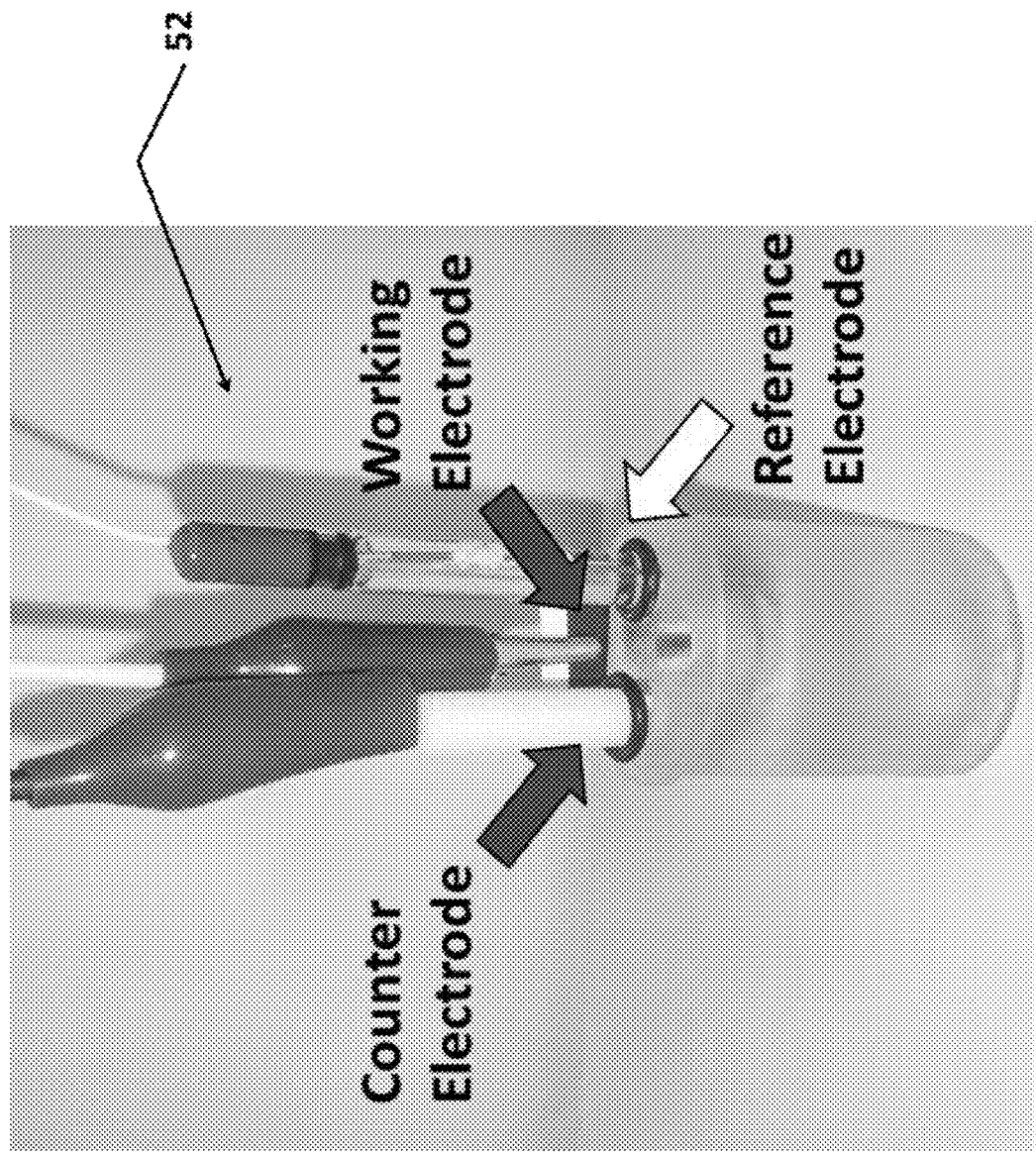
Figure 17A:
Figure 17B:
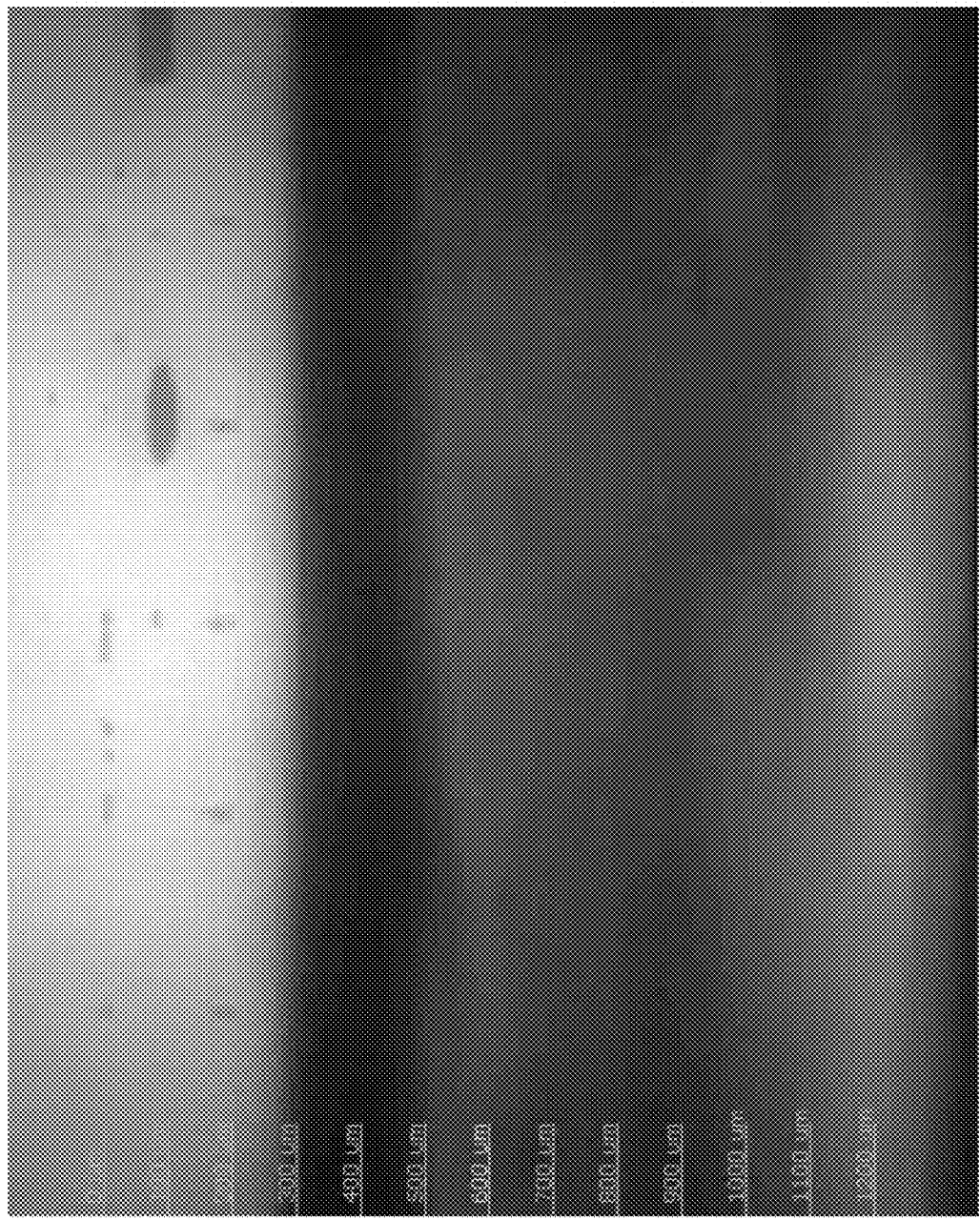
Figure 17C:
Figure 17D:
Figure 17E:
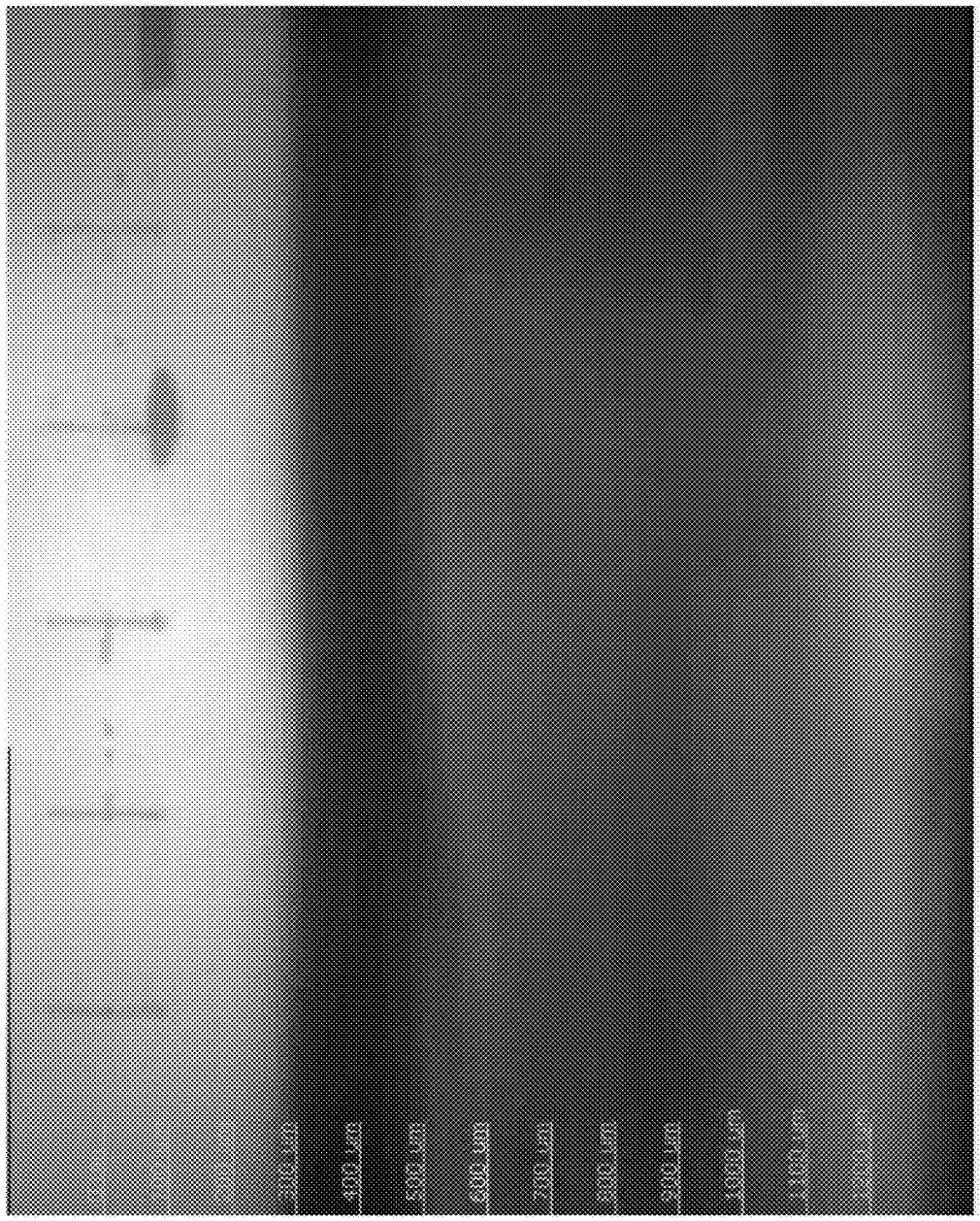
Figure 17F:
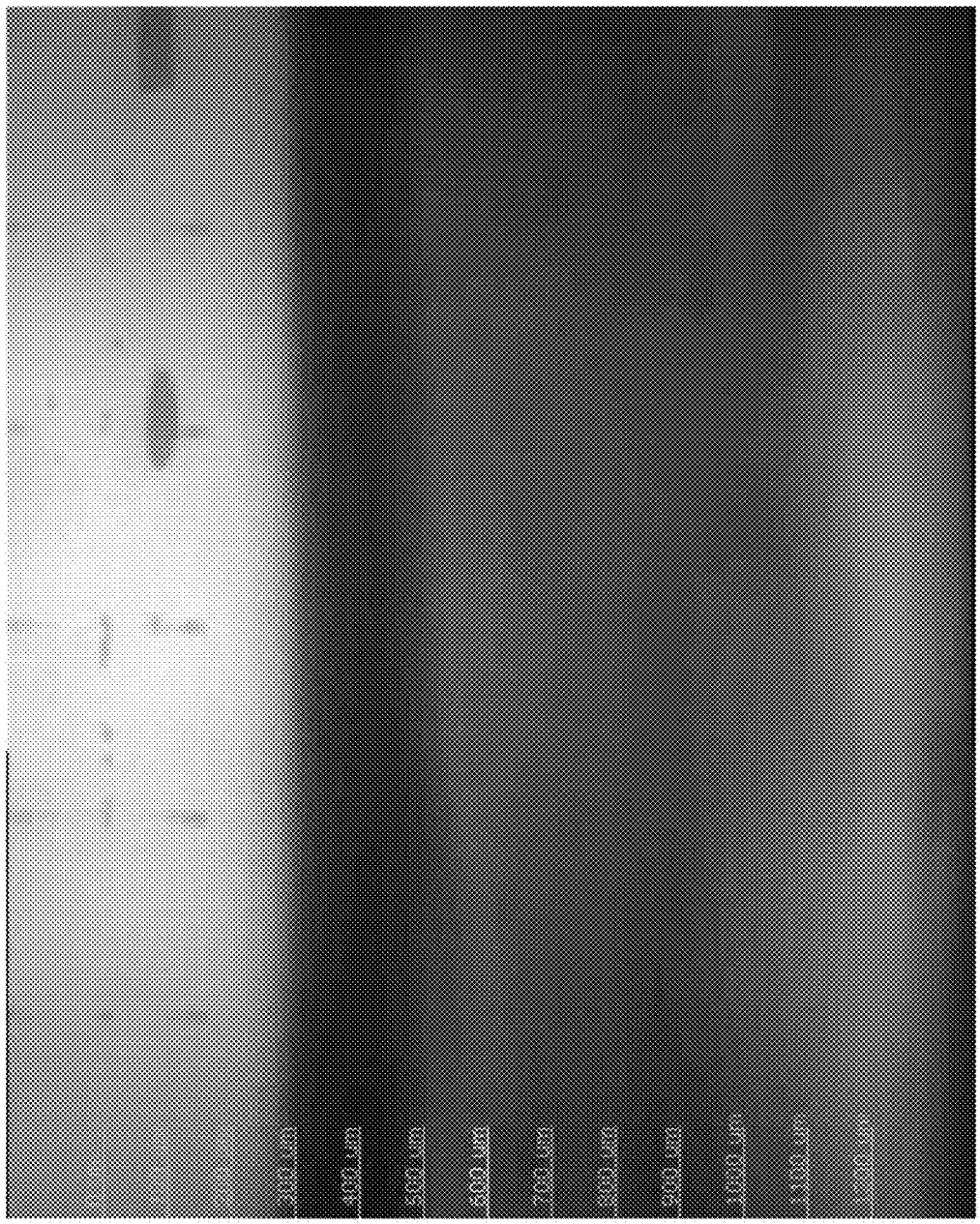
Figure 17G:
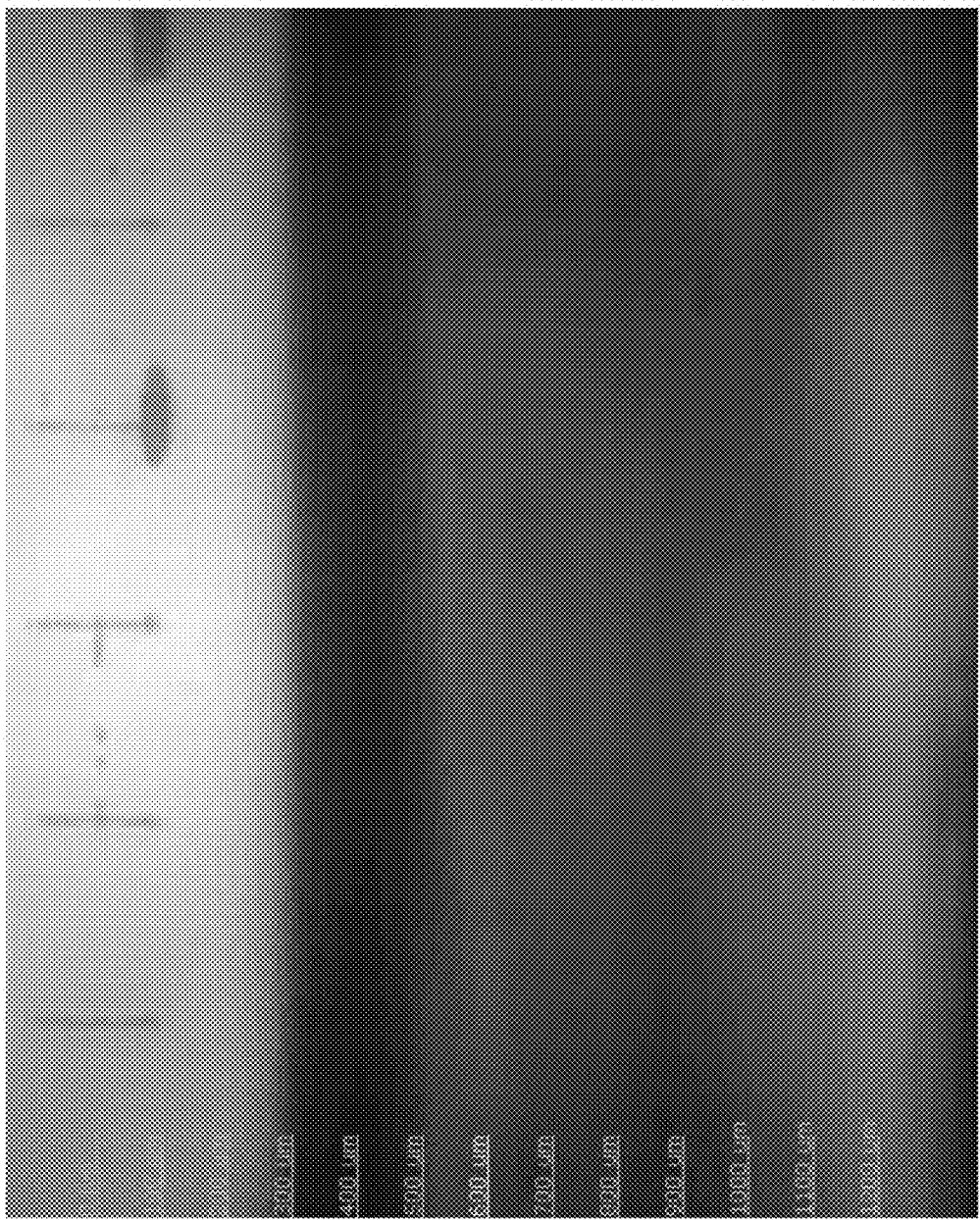
Figure 17H:
Figure 17I:
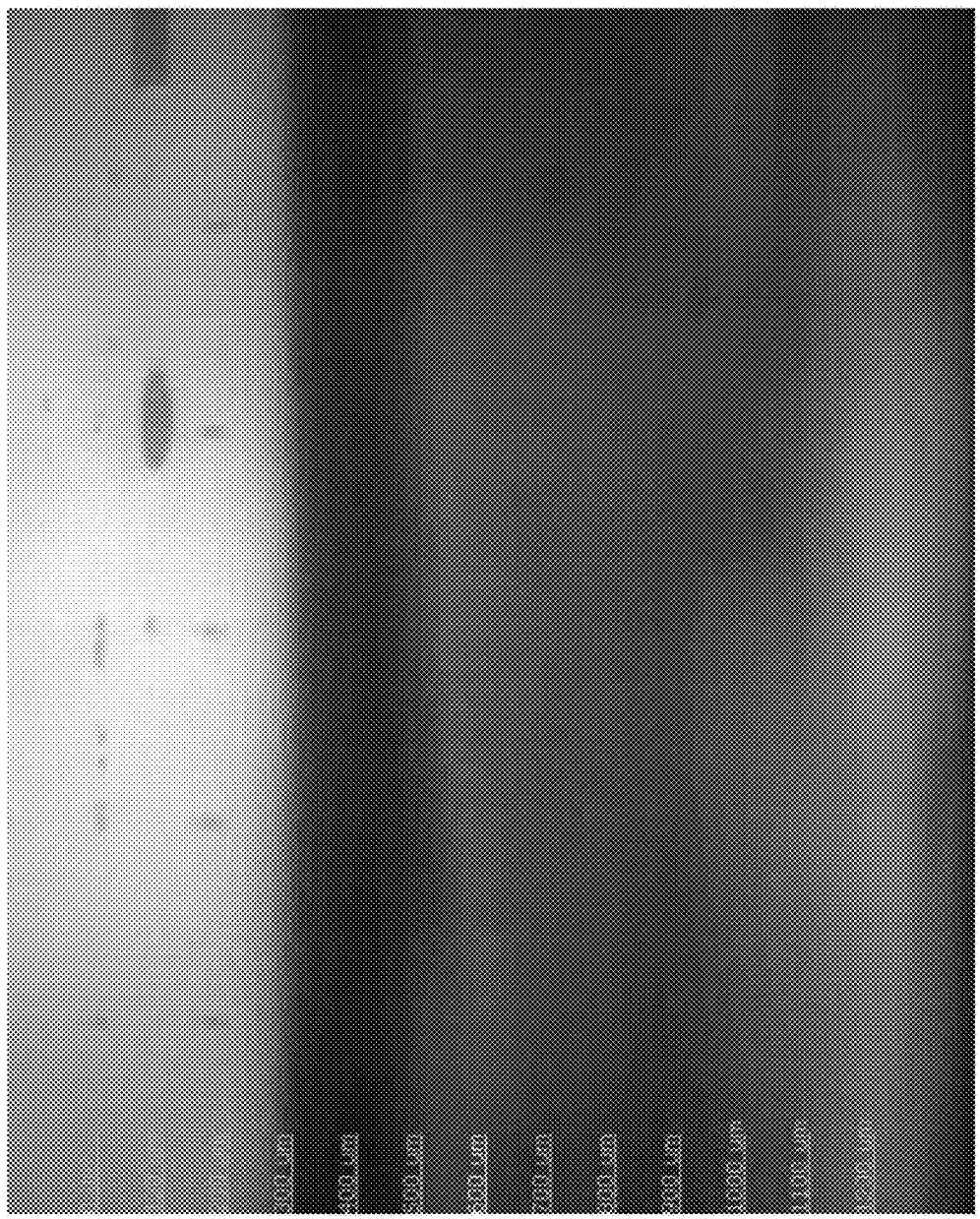
Figure 17J:
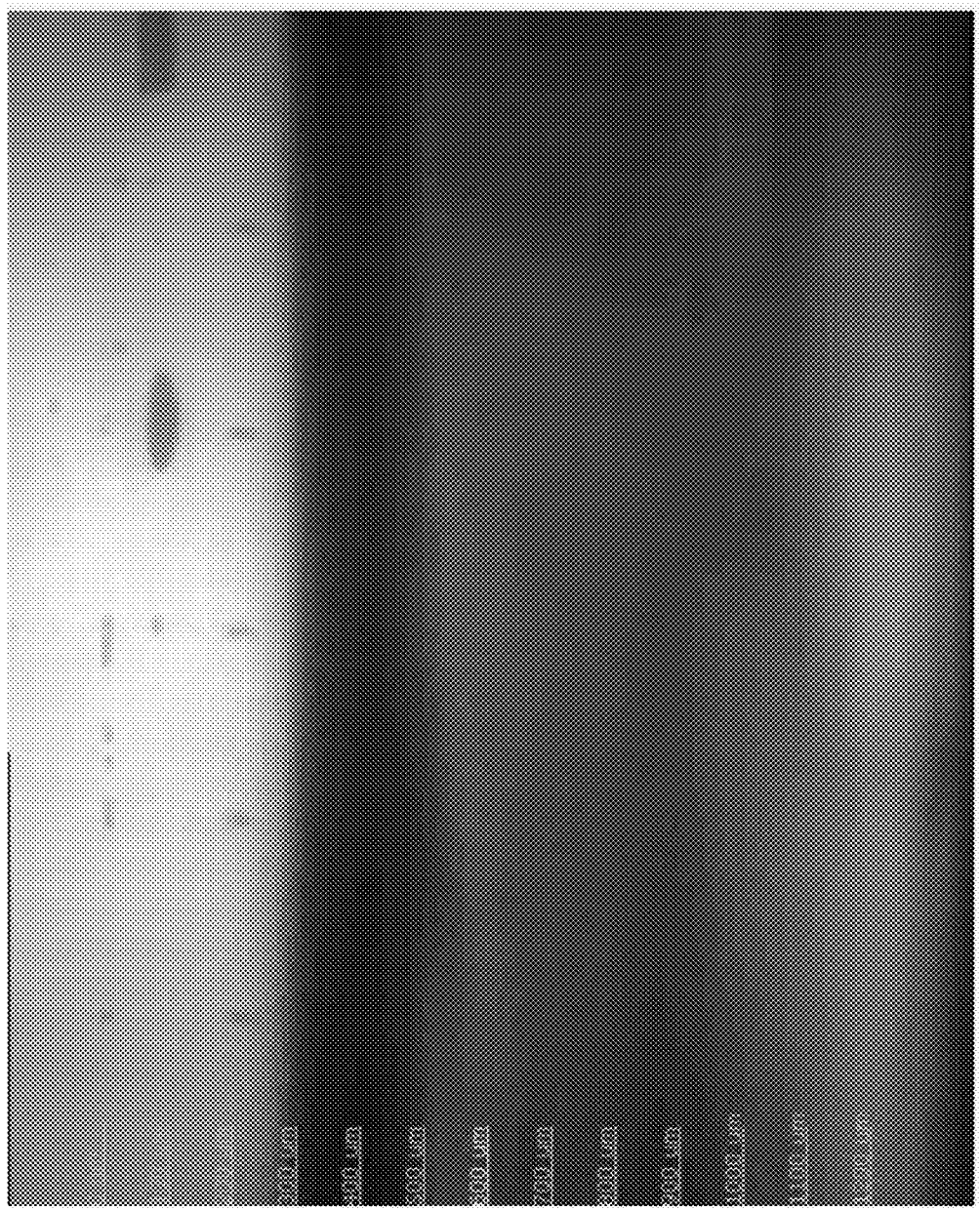
Figure 17K:
Figure 17L:
Figure 18A:
Figure 18B:
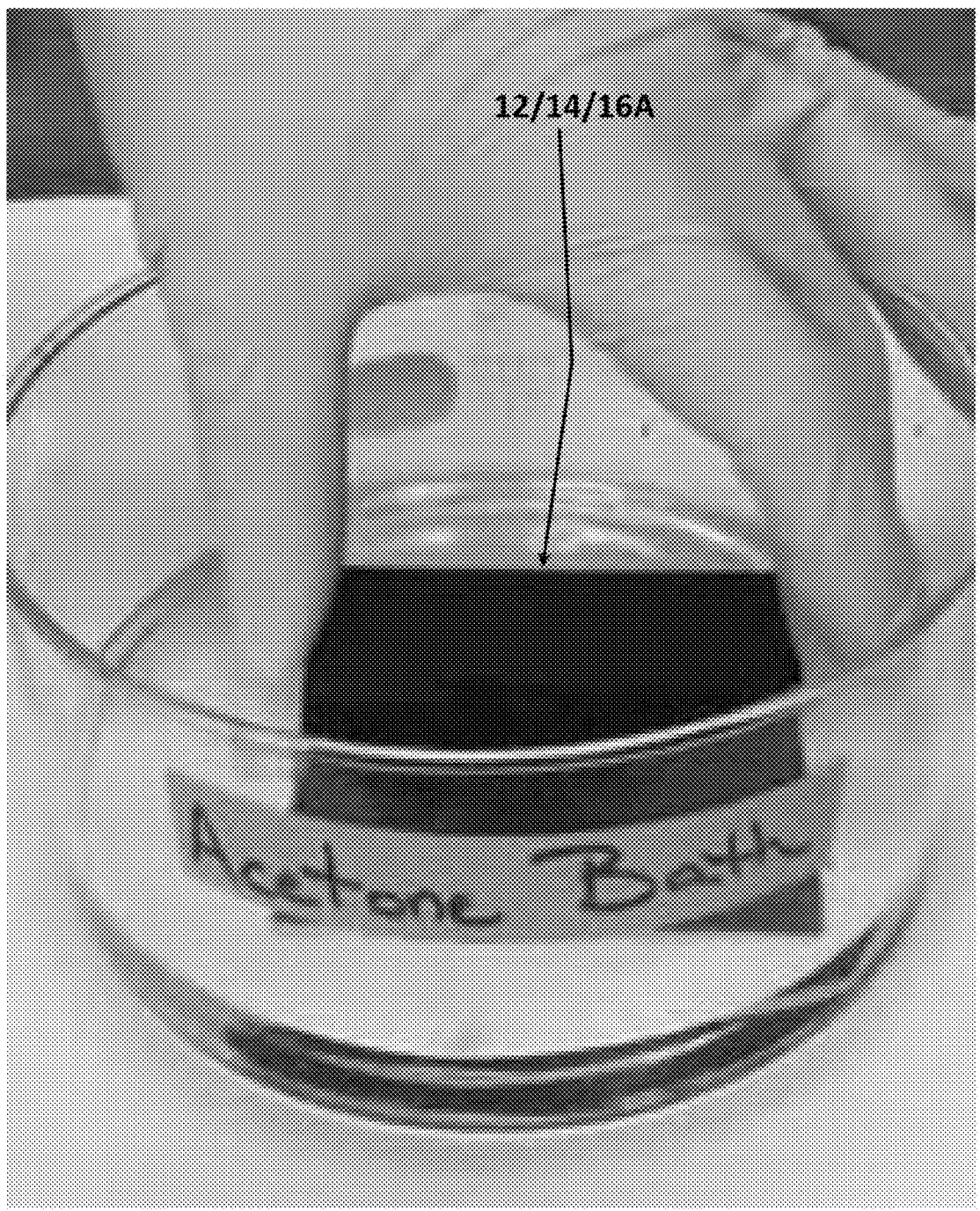
Figure 18C:
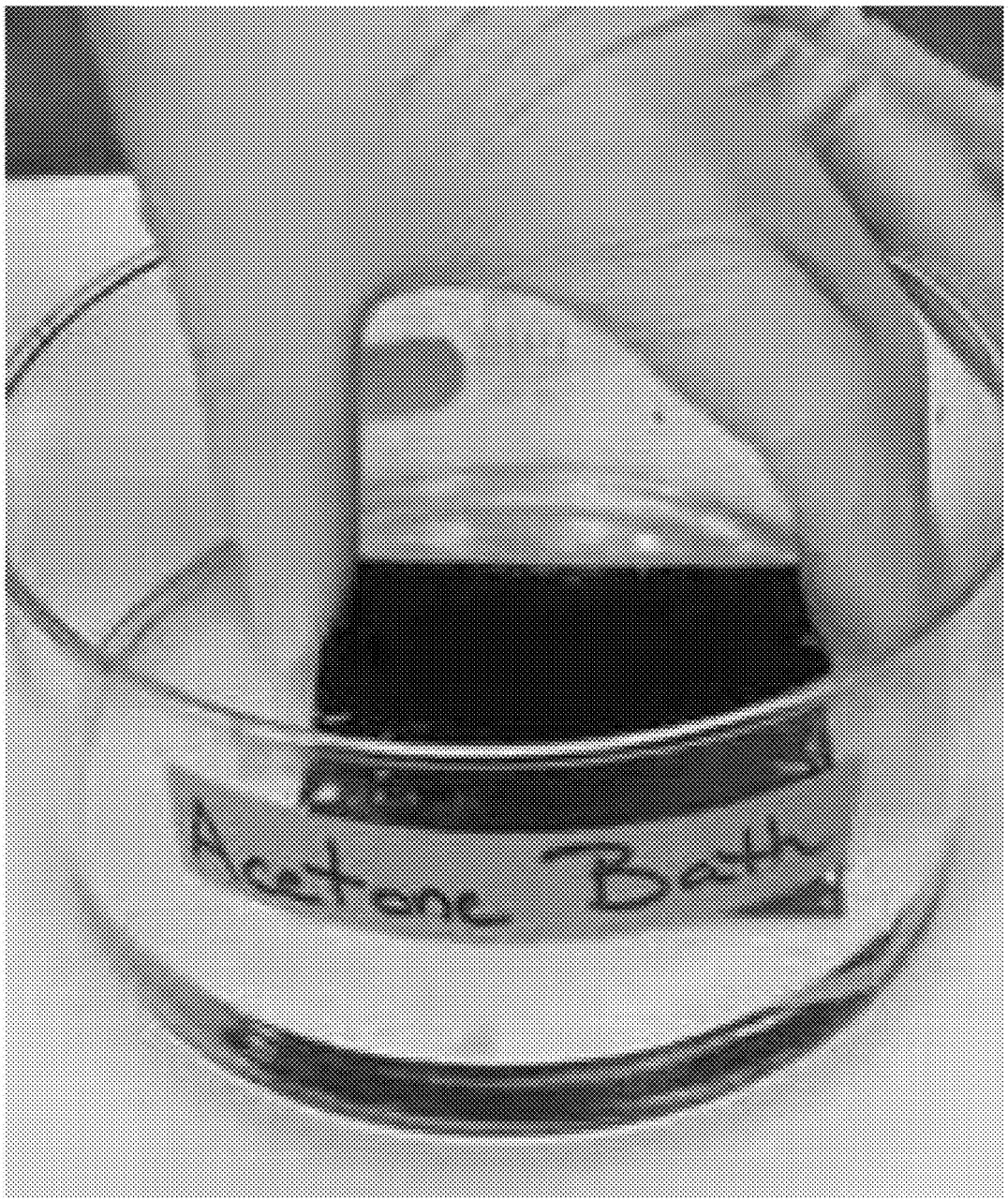
Figure 18D:
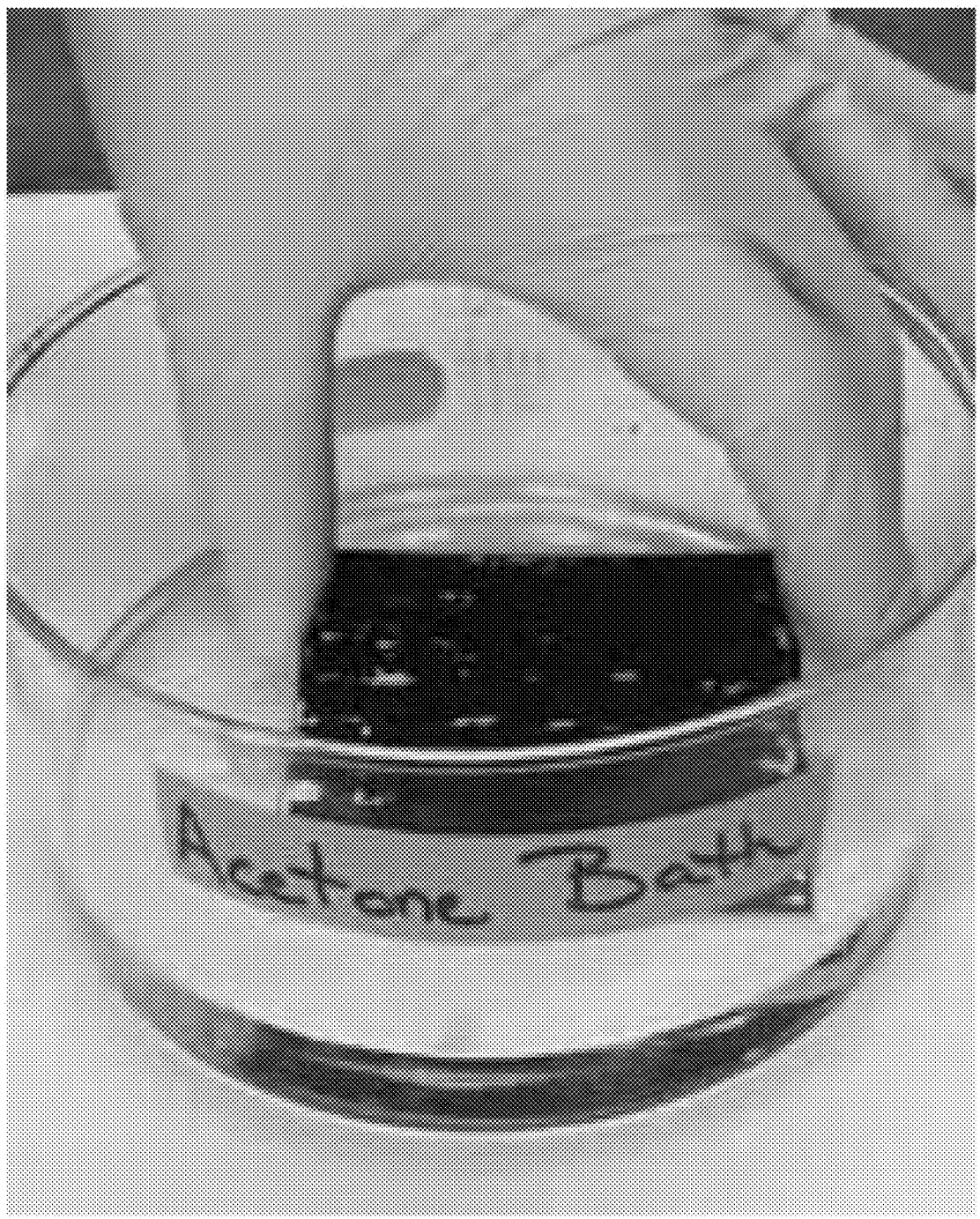
Figure 18E:
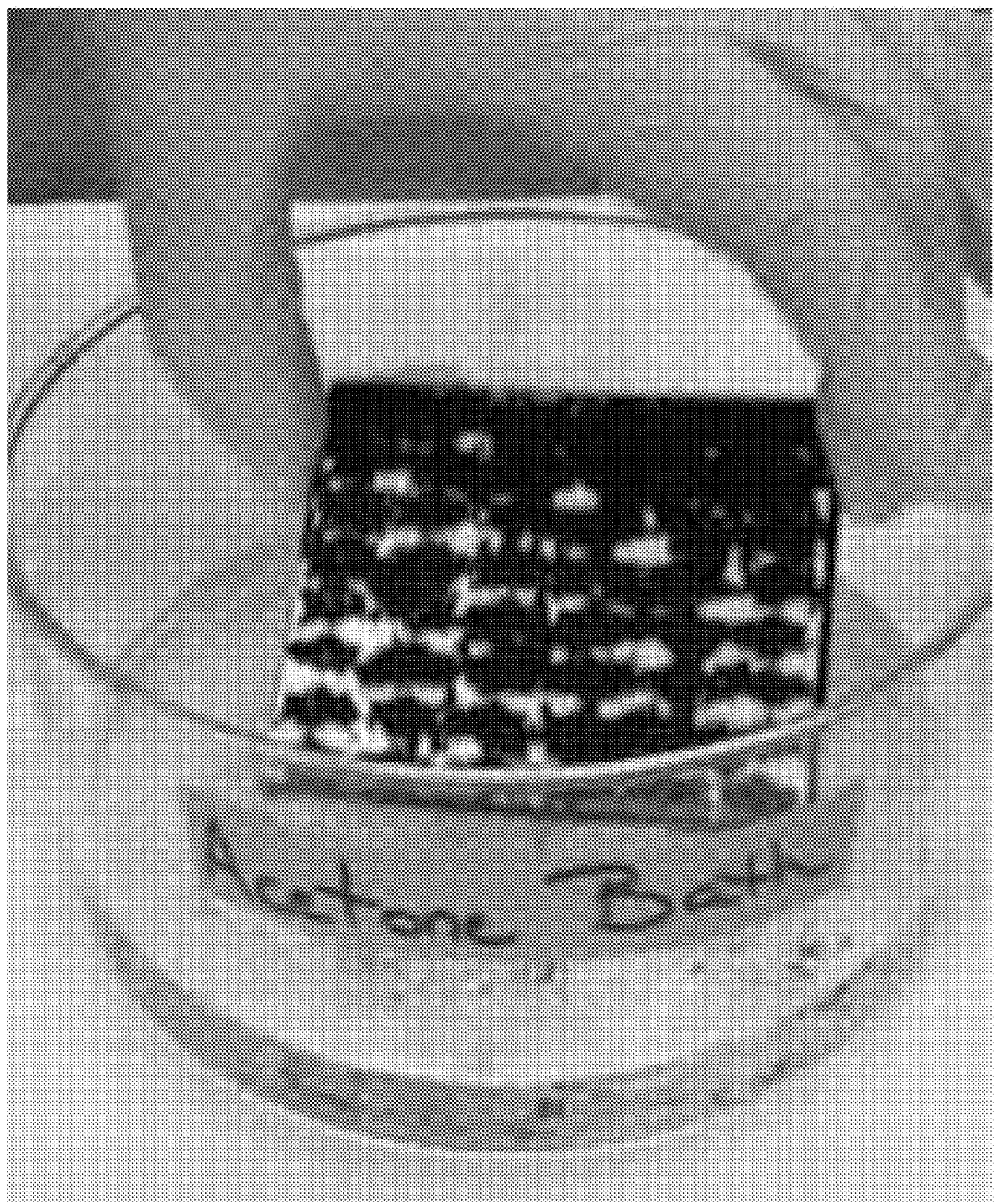
Figure 18F:
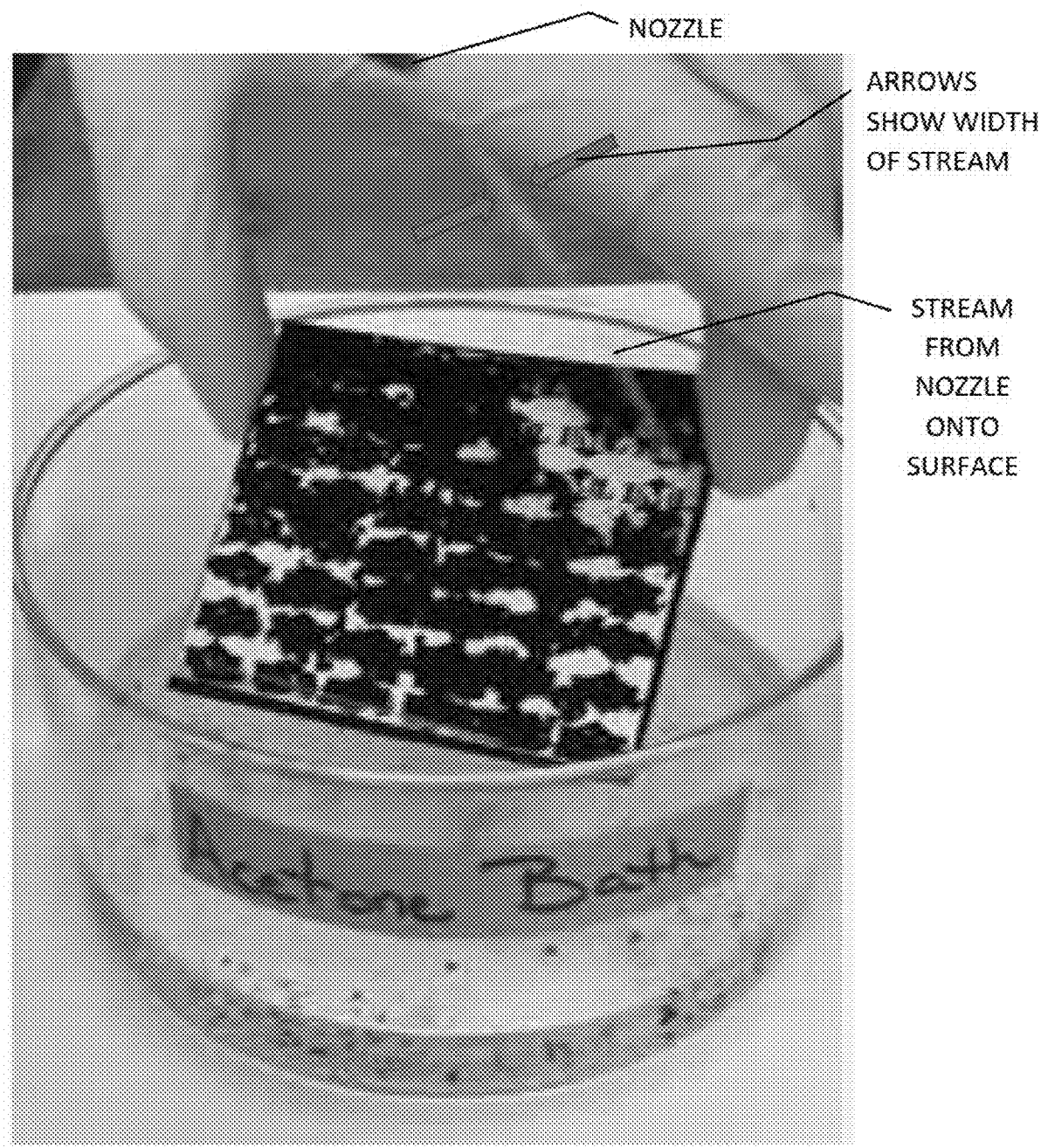
Figure 18G:
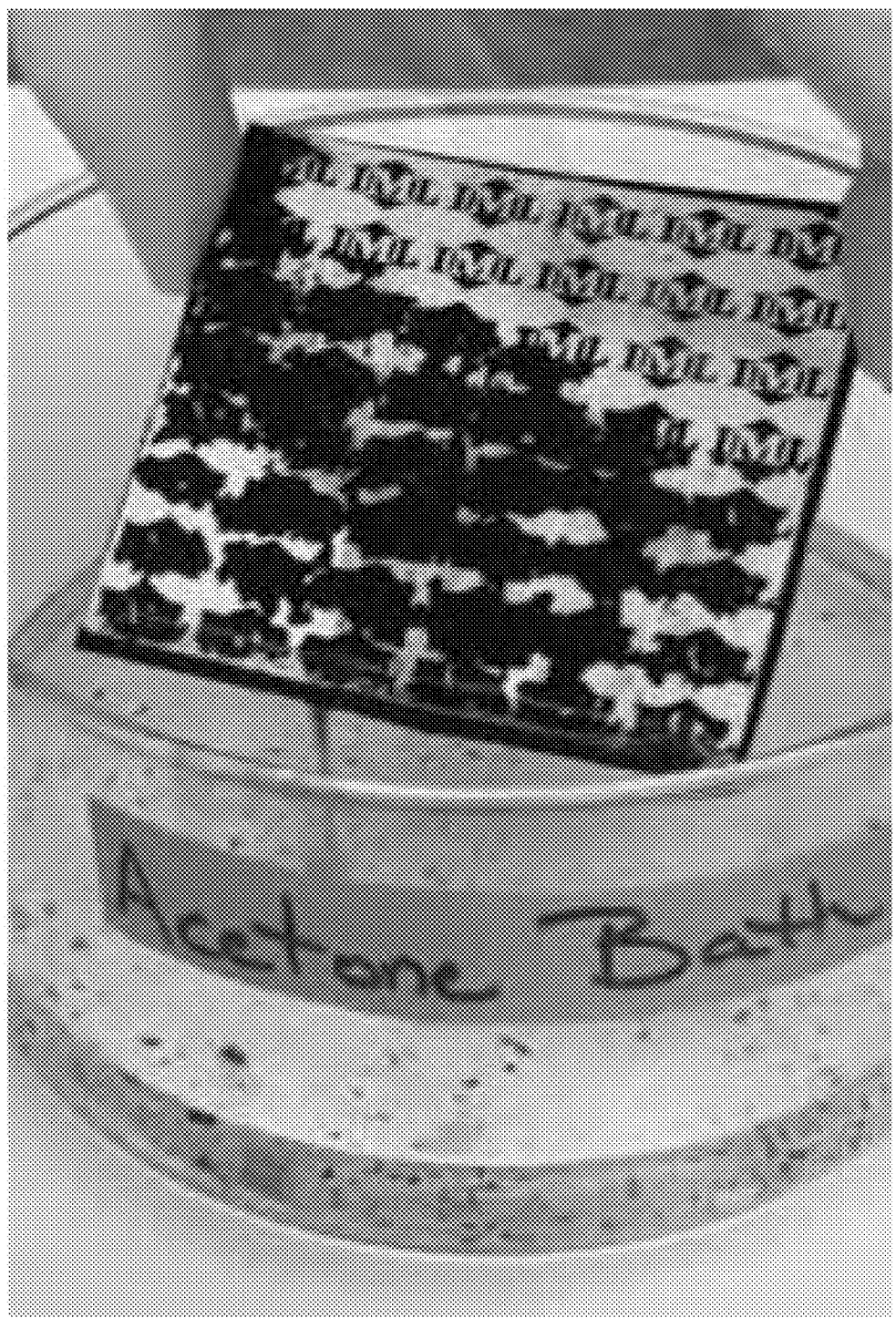
Figure 18H:
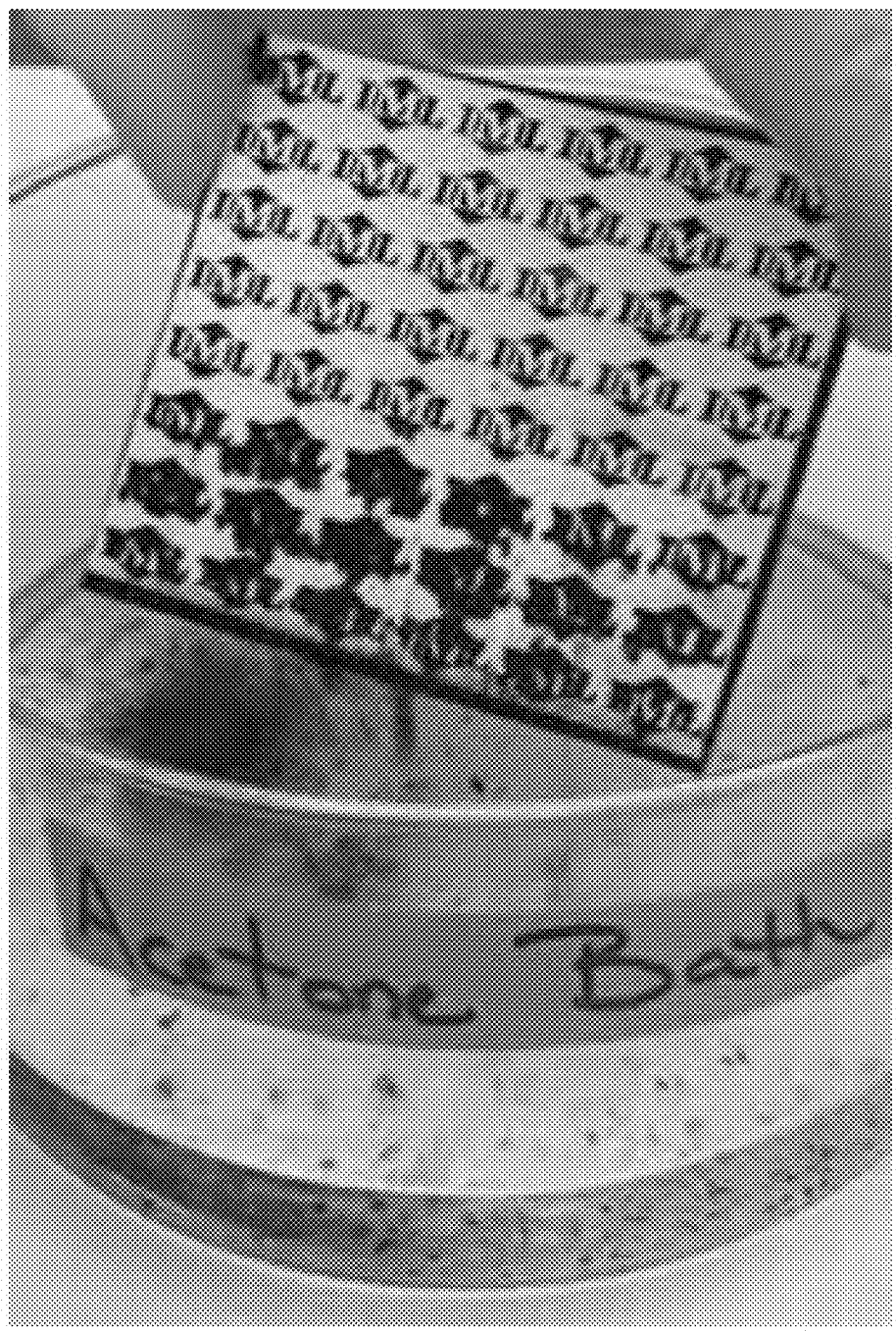
Figure 18I:
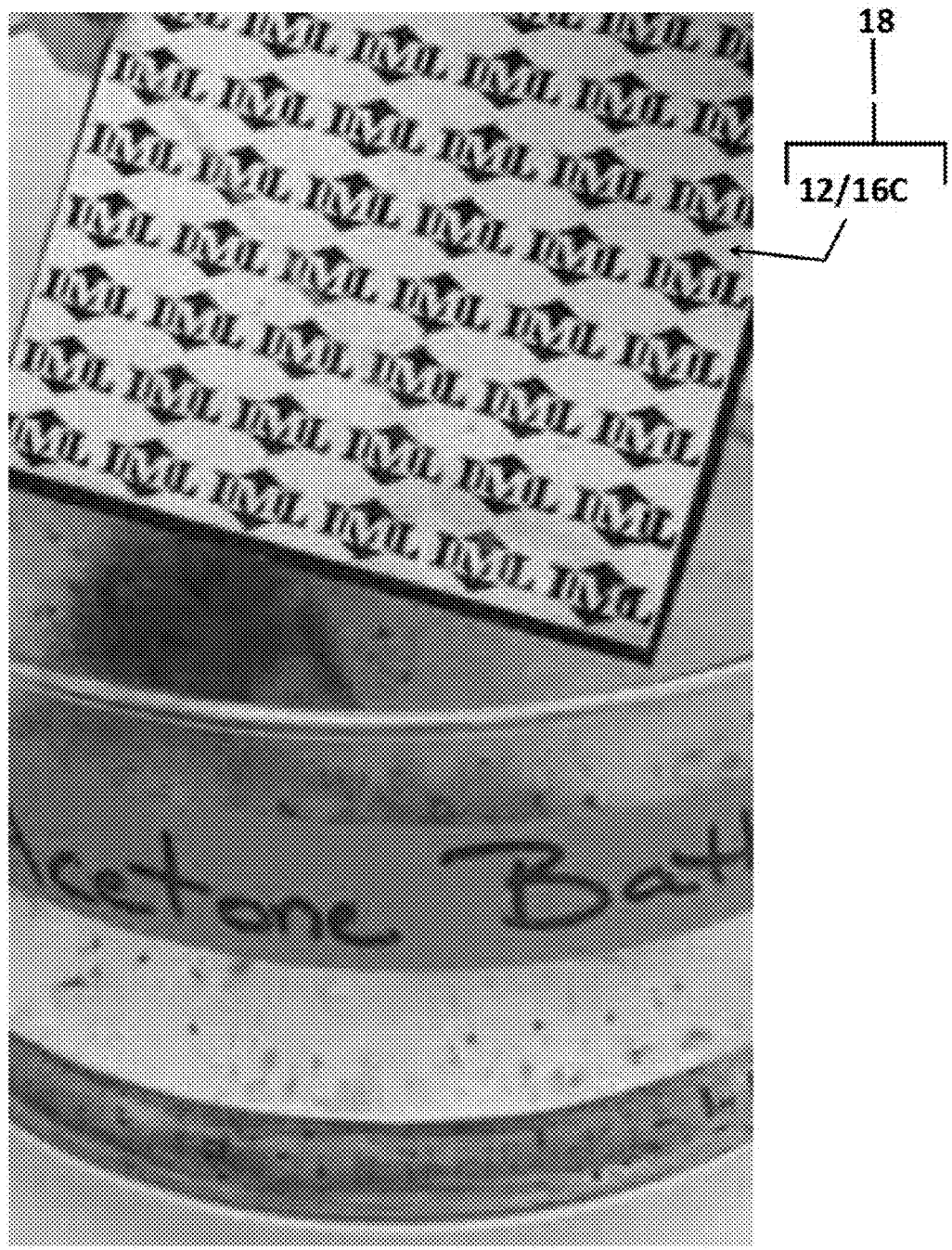
Figure 18J:

FIG. 16. Three electrode setup 52 for hydrogen peroxide sensing using 3D printed vial to standardize testing according to an exemplary embodiment of the invention.

FIGS. 17A-L (multiple sheets) are selected still frames from a video Movie 1 showing aspects of the invention.

FIGS. 18A-J (multiple sheets) are selected still frames from a video Movie 2 showing aspects of the invention.

Figure 19:
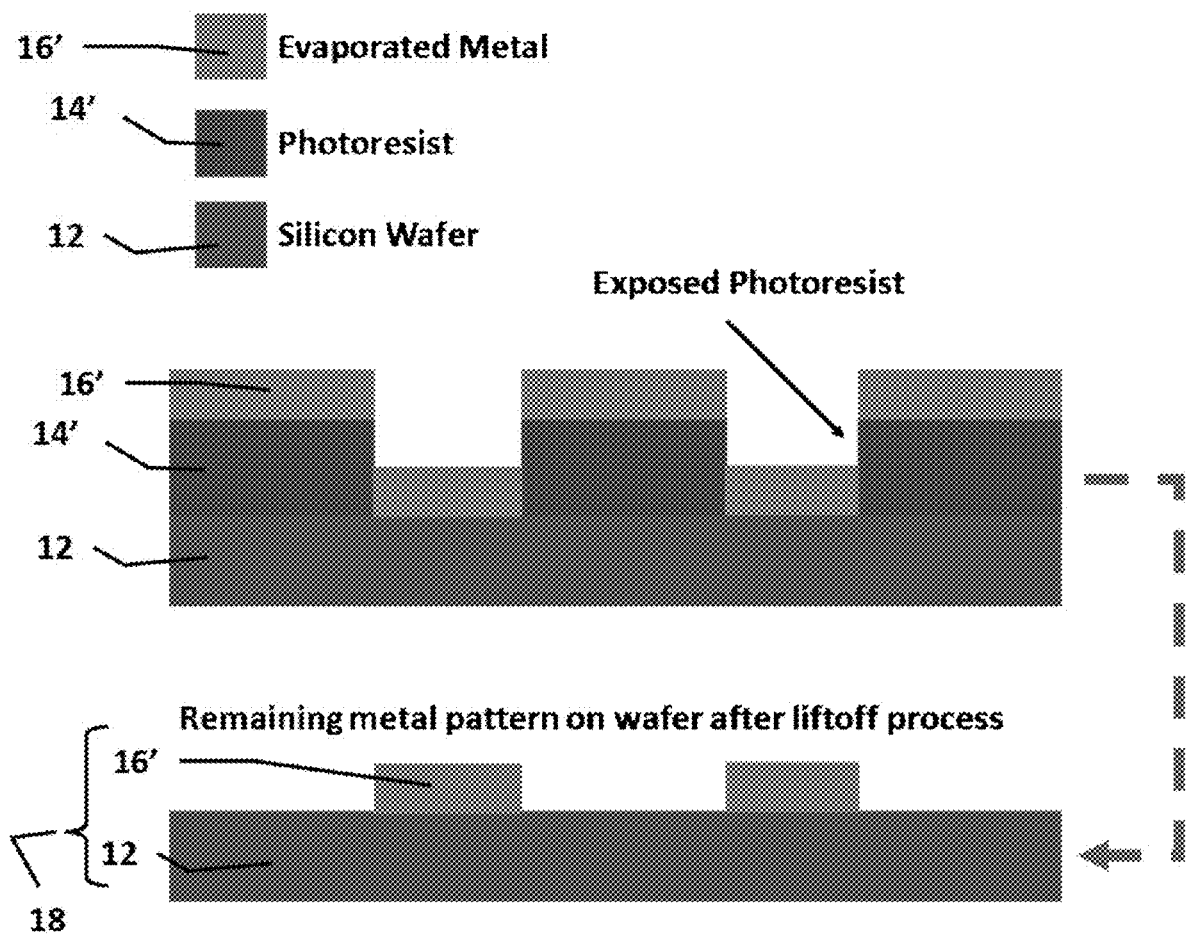

FIG. 19. Schematic diagram displaying photolithography patterning according to an exemplary embodiment of the invention. (Top) On top of a silicon wafer 12 a photoresist 14' has been patterned and then a thin film of metal 16' evaporated on top of the photoresist. (Bottom) After exposure to an organic solvent (e.g., acetone) the photoresist 14' dissolves and the metal 16' resting on top of the photoresist is removed.

III. DETAILED DESCRIPTION OF EXEMPLARY EMBODIMENTS OF THE INVENTION

A. Overview

For a better understanding of the invention and its various aspects, examples of how aspects of the invention can be made and used will be set forth. It is to be understood that these examples are neither exclusive nor inclusive of all forms and embodiments the invention can take.

The examples will focus upon graphene-based nanoparticles in the final patterns, as well as use of the patterns as electrodes such as for electrochemical sensing, but those skilled in this technical art will understand and appreciate that aspects of the invention can be applied with different materials and in different applications.

B. Generalized Method

At a more general level, one or more aspects of the invention pertain to the following.

Instead of either (a) using photolithography (coat a layer of conductive material with photoresist, mask the photoresist layer with the negative of the desired pattern, illuminate the combination, and remove the photoresist to reveal the positive of the circuit) or (b) trying to inkjet print conductive patterns directly onto a substrate, in one aspect of the invention, a different counter-intuitive paradigm is presented.

A negative of the desired pattern is inkjet printed directly to the substrate. The inkjet printer ink is a sacrificial layer that is subsequently removed. By selection and design of both the ink formulation and fluid properties, the inkjet printed pattern can have high resolution. Line spacing resolution on the order of 20 nm has been demonstrated.

A solution is then deposited or coated over the negative pattern and substrate around the negative pattern. The solution is not inkjet printed and therefore is not constrained by the limitations of inkjet printing in terms of fluid properties or particle size. The coating tends to fill in the high resolution spaces between the exposed surfaces of the substrate and the level(s) of the top(s) of the features of the negative pattern as defined between sides walls of the negative pattern features to begin formation of the positive pattern desired for the end product. The solution can include particles, including nano-scale particles. Examples are conductive particles, including but not limited to graphene-based particles or flakes. When so, the stabilized (e.g. dried) state of the solution is an electrically active circuit.

The sacrificial layer is then removed, leaving the stabilized positive pattern on the substrate. The positive pattern tends to assume the same resolution as the negative pattern. Therefore, high resolutions (on the order of as little as 20 μm line spacing resolution) patterns are possible. It the case of solutions containing graphene, this represents on the order of more than 100 percent improvement on resolution over known techniques of inkjet printing of graphene. And it avoids the complexity and limitations of photolithography, including opening up the possibility to cheaper, more scalable, continuous production of end products.

Because the solution for the positive pattern is coated or deposited in a layer over the negative pattern and substrate, sometimes solution will remain over the top(s) of some or even all features of the negative sacrificial pattern layer or extend either above the space (above the top level of the negative pattern) or otherwise present inconsistencies in the shape of the intended final positive pattern (e.g. jaggedness). Optional aspects to address these issues can include the following.

Heating or annealing of the combined substrate, negative pattern, and solution after the solution has been dried in place can be controlled to promote an increase in adhesion between the dried solution and the substrate. This can promote not only retention of the dried solution at the substrate, but more reliable removal of unwanted dried solution. Such heating can also promote removal of constituents of the dried solution which are not wanted in the final pattern. For example, controlled heating can remove binders, surfactants, and the like.

Heating or annealing of at least the positive pattern can also be controlled to affect the positive pattern. One example is annealing the positive pattern to influence or change its electrical properties.

Thus, the invention uses the subtle insight of the inventors that inkjet printing is powerful for high resolution patterns and scalability, economy, and a variety of substrates, but not presently effective for accurate high resolution printing of certain solutions. Therefore, instead of inkjet printing the ultimate desired pattern, a negative of the desired pattern is inkjet printed to the desired resolution, a solution containing the desired constituents of the final positive pattern is coated or deposited over the negative pattern and substrate, and the negative pattern is sacrificed/removed. This can also allow much different composition of the solution for the pattern than if it was to be ink-jet printed directly on the substrate. It also allows the advantages of inkjet printing of the negative patte and avoidance of masks needed in photolithography, which opens up flexibility regarding types of relevant substrates and scalability.

Other aspects according the invention can include the following.

The substrates that are in play are many and varied in characteristics, including flexible substrates.

The composition of the inkjet printable sacrificial layer can be pre-designed with specific characteristics to promote its functions. This can include fluid properties promoting the high resolution mentioned.

The composition of the solution to be coated or deposited over the sacrificial layer can be pre-designed with specific characteristics to promote its functions. This can include higher concentration of particles desired for the functioning of the ultimate positive pattern in comparison to what might be workable if formulated for inkjet printing. This can include constituents that interact favorably for adhesion to a given substrate, including increased adhesion with heat. This can include one coated or deposited layer, or plural coated or deposited layers depending on the pattern form factor desired or the substrate used.

The method of removing the sacrificial layer and/or unwanted (hied solution can vary. In one example, a solvent bath can be combined with generated controlled forces to influence such removal. The controlled forces can include, but are not necessarily limited to, vibrational forces through sonication or direct impingement through a fluid stream.

C. Operation

As will be described in more detail below, once the final pattern is finalized on the substrate, possible uses and applications are many.

In one example, selection of conductive particles in the coated solution can result in electrical circuits or components thereof. This includes interdigitated rather dense patterns. This includes scalability from micro-sized to meter-sized or more. This includes substrates from rigid, heat insensitive to flexible, heat sensitive.

D. Specific Example

High Resolution Graphene Films for Electrochemical Sensing Via Inkjet Maskless Lithography
See also, John A. Hondred, Loreen R. Stromberg, Curtis L. Mosher, and Jonathan C. Claussen, CS Nano, 2017, 11 (10), pp 9836-9845, incorporated by reference herein in its entirety, including Supplemental Information found at available free of charge on the ACS Publications website at DOI: 10.1.021/acsnano.7b03554.

Abstract

Solution-phase printing of nano material-based graphene inks are rapidly gaining interest for fabrication of flexible electronics. However, scalable manufacturing techniques for high-resolution printed graphene circuits are still lacking. Here, we report a patterning technique [i.e., inkjet maskless lithography (IML)] to form high resolution, flexible graphene films (line widths down to 20 µm) that significantly exceeds current graphene inkjet printing resolution (line widths ~60 µm). IML uses an inkjet printed polymer lacquer as a sacrificial pattern layer, viscous spin coated graphene, and a subsequent graphene lift-off to make the patterned films without the need for pre-fabricated stencils, templates or cleanroom technology (e.g., photolithography). Laser annealing is used to remove surfactants, solvents, and non-conductive binders from the graphene printed on thermally sensitive, flexible substrates [polyethylene terephthalate (PET)]. The laser annealing process and subsequent platinum nanoparticle deposition substantially increases the electroactive nature of the graphene as illustrated in electrochemical hydrogen peroxide ($H_2O_2$) sensing [fast response (5 sec), large linear sensing range (0.1-550 µm), high sensitivity (0.21 µM/µA) and low detection limit (0.21 µM)]. Moreover, high-resolution, complex graphene circuits [i.e., an interdigitated electrode (IDES) with varying finger width and spacing (50 µm and 50 µm; 75 µm and 150 µm; 150 µm and 200 µm respectively)] were created with IML and characterized via potassium chloride (KCL) electrical impedance spectroscopy (EIS). Results indicated that sensor sensitivity is correlated to electrode feature size as the IDE with the smallest finger width and spacing (50 µm and 50 µm) displayed the largest EIS magnitude response in KCL (~21 MΩ). These results indicate that the developed IML patterning technique is well-suited for rapid solution-phase graphene film prototyping on flexible substrates for numerous applications including electrochemical sensing.

Solution-phase printing of nanomaterial-based conductive inks has helped facilitate the scalable manufacturing of flexible electronics[1, 2, 3] in a low-cost, high-throughput fashion.[4, 5, 6] These printing protocols have expedited the advent of new technologies for diverse applications including those associated with energy storage,[7] flexible electronic displays,[8] smart packaging,[9] and diagnostic sensors.[10] Graphene-based inks have shown great promise in enabling these applications due to their inherently advantageous material properties (e.g., high mechanical flexibility, electrical and thermal conductivity, chemical and environmental robustness, and biocompatibility).[11, 12, 13] Numerous graphene printing techniques have been developed to coat graphene flakes onto flexible and non-flexible surfaces including screen, gravure, and inkjet printing.[14, 15] However, these techniques are often limited to low line resolution patterning (>50 µms).

Recently, a variety of manufacturing tools have been developed to increase the line resolution of printed graphene films such as gravure templates and silicon stencils with line resolution of printed graphene films of 30 µm and 5 µm respectively.[16, 17] However, these techniques require the use of cleanroom technology (i.e., photolithography) to fabricate a stencil or gravure template for each new pattern design. Photolithography requires multiple fabrication steps including photoresist application, development, and removal as well as UV exposure through a chrome/glass mask; photolithography is costly/time consuming[18] and inadequate for rapid prototyping of electrical circuits.[16, 17, 19] Others have developed electrostatic spray deposition (ESD) to create interdigitated electrodes (IDEs) with finger width and spacing of 100 μm and 50 μm respectively.[20] However, similar to the previous techniques, this solution-phase graphene technique requires the need for photolithography patterning.

Inkjet printing is a scalable, cost effective, and versatile technique for depositing highly intricate patterns on multiple substrates. This process does not require fixed geometry masks/stencils or the need to use photolithography patterning.[18] Moreover, inkjet printing has several advantages including: large surface area coverage, scalability for mass production, capability of printing on flexible substrates, and rapid prototyping through the use of computer-aided design (CAD) software.[21, 22] The major limitation of inkjet printing is the narrow value range that ink fluid properties (e.g., viscosity, surface tension, and density) must fall within for consistent droplet formation and pattern printing. For example, a typical inkjet printable ink must have a viscosity between 2 and 20 cP, surface tension between 30 to 40 mN/m, particle size less than 1% of the nozzle diameter, and a specific gravity between 1 and 1.5.[23] With such stringent requirements, suspending large particle inks that can be printed with high resolution, without clogging nozzles, splattering, or inconsistencies in ink deposition, is technically challenging.

Herein we demonstrate a photolithography-free, high-resolution solution-phase graphene patterning technique. This technique uses IML to pattern graphene films onto virtually any 2D planar substrate from rigid, temperature resistant silicon to flexible, inflammable polymers. The IML method functions by inkjet printing a polymer pattern, spin coating a more viscous/dense solution-phase graphene layer and removing the polymer pattern via a solvent-based lift-off process to create the patterned graphene film. This inkjet printed patterning technique circumvents the need for developing templates and is conducive to scalable roll-to-roll manufacturing onto flexible substrates.[21, 22] The IML process is capable of creating graphene line resolution of 20 μm—a resolution that supersedes the typical limitations of inkjet printing (width of ink droplet), which is typically greater than 60 μm.[24] Some researchers have demonstrated inkjet printing polymers as a protective mask,[25, 26, 27] while others have inkjet printed polymer layers for a sacrificial liftoff process as displayed in coffee-ring lithography[28] and polymer microsieve pores.[29] However, full patterning of high-resolution (<25 μm) graphene circuits has not been previously addressed. Furthermore, we demonstrate the electrochemical utility of the developed graphene films by creating a $H_2O_2$ sensor printed on flexible Kemafoil® polymer substrate (heat treated PET). The patterned graphene was laser annealed and electrodeposited with platinum nanoparticles to increase the sensor sensitivity. Finally, a graphene IDE arrays with varying finger width and spacing (50 μm and 50 μm; 75 μm and 150 μm; 150 μm and 200 μm respectively) was manufactured and subsequently characterized via electrochemical impedance spectroscopy (EIS) to demonstrate the ability to create high resolution graphene circuits by the IML process.

Results and Discussion
Graphene Patterning Via Inkjet Maskless Lithography (MIL)
Overview of the IML Process Steps
The IML manufacturing protocol developed herein uses a four-step process to make conductive graphene patterns (FIG. 1). First, the negative of the desired graphene pattern is inkjet printed [designed with computer aided design software (CAD) and uploaded to the printer] onto the substrate with a sacrificial polymer (FIG. 1, step (a) & Experimental Methods). Next graphene ink, made with a higher concentration of graphene than inkjet printable inks (e.g., 15 mg/mL vs~3.5 mg/mL)[30, 31, 32] is spin coated over the pattern (FIG. 1 step (b) & Experimental Methods). Graphene adhesion is increased and ink solvents are removed via heating (post-bake) in an oven (FIG. 1 step (c) & Experimental Methods). Finally, the polymer pattern is removed and graphene lift-off occurs by exposing the substrate to a sonicated acetone bath (10 seconds) and/or direct acetone impingement with a wash bottle (FIG. 1 step (d)).

Sacrificial Polymer Ink Formulation and Printing

The physical properties of the sacrificial polymer ink are critically important to create a high-resolution negative pattern. The fluid dynamic properties of the ink (viz., viscosity, surface tension, and density) strongly influences the inkjet printed line/pattern resolution. Primarily, two different non-dimensional properties [Reynolds number (Eq. 1) and Weber number (Eq. 2)] which are related to the inertial forces of viscosity and surface tension govern the printability of an ink, $$Re = \frac{v\rho a}{\eta} \quad (1)$$

$$We = \frac{v^2 \rho a}{\gamma} \quad (2)$$

$$Z = \frac{1}{Oh} = \frac{Re}{\sqrt{We}} = \frac{(\gamma\rho a)^{1/2}}{\eta} \text{ where } 10 > Z = \frac{1}{Oh} > 1 \quad (3)$$

$$K_c = We^{0.5} * Re^{0.25} \text{ where } K_c < 100 \quad (4)$$

where v is the impact velocity, p is the ink density, a is the drop diameter before impact, η is the viscosity of the ink, and γ is the surface tension. The Z-value (inverse of the Ohnesorge number, Oh), which describes the overall jettability of an ink (Eq. 3), combines Reynolds and Weber numbers and does not depend on the velocity of the jetted ink. For proper jetting to occur Reis and Derby et al., estimated the Z-value should be between 1 and 10 and the drop impact (Eq. 4) be below 100.[33] At low Z-values (<1) the viscosity of the ink is too large for proper ejection of the droplet, while at high Z-values (>10) unwanted satellite droplets form. When the drop impact approaches 100, splashing upon impact is predicted, which decrease printing resolution. In this work, the sacrificial polymer ink was developed with the solvent cyclohexanone and terpineol, similar to previously reported jettable inks.[22, 30] These solvents were subsequently mixed with an acrylic lacquer at a ratio of 8:1:1, respectively (Experimental Methods). This ink displayed a Reynolds number of 30.8, Weber number of 26.9, and a Z-value of 5.9 when printed at 40° C. which falls within the region of printable inks (FIG. 2A).[33] Hence, the developed polymer ink printed without satellite droplets, did not splash when deposited onto the substrate, and formed consistently stable drops upon expulsion from the piezoelectric nozzle of the inkjet printer (FIG. 2B, blue arrows; Supplemental Video 1 (see selected frames at FIGS. 17A-K), & Experimental Methods). The polymer printing process was adjusted (nozzle temperature set to 40° C., 20 μm drop spacing) to develop well-defined printed lines (50-75 μm width), straight edges, and spacing between polymer layers below 25 µm (Experimental Methods). Upon impact, the inkjet printed polymer droplets coalesced into a film as seen by FIGS. 7A-D).

Graphene Spin Coating and Post-Bake

Another important aspect to obtaining high-resolution graphene films is properly controlling the temperature and time of the graphene post-bake. Recall, that after the negative pattern is inkjet printed onto a substrate, a viscous graphene ink is spun over the polymer patterned surface (FIG. 1 & Experimental Methods). A temperature and time controlled baking process is subsequently conducted in a convection oven to remove ink solvents and subsequently to improve the physical bond between the substrate and the graphene (FIG. 3).[32] At low baking temperatures and/or short baking times, the graphene does not adhere tightly to the surface of the substrate and is completely removed upon lift-off of the sacrificial polymer via acetone (FIG. 3, top left). At higher baking temperatures or longer baking times the polymer irreversibly hardened on the substrate which inhibited acetone removal of the underlying sacrificial polymer (FIG. 3, bottom right). However, a post-bake temperature and time of 120° C. for 1 hr sufficiently adhered the graphene to the substrate while preventing over-hardening of the sacrificial polymer so that it could be removed by acetone; this post-bake time and temperature permitted the formation of well-defined graphene lines (25 µm width and 50 µm spacing) (FIG. 3, center highlighted image).

Graphene Annealing

The electrical conductivity of the graphene films was increased by a laser or thermal annealing processes similar to our previous protocols where surfactants, solvents, and non-conductive binders (e.g., ethyl cellulose) are burned off at lower temperatures (<300° C.) or lower energy densities (<50 mJ/cm$^2$) and morphological changes (e.g., graphene flake fusion, superficial 3D nanostructuring or semi-vertical graphene petal formation) occurs at higher temperatures (>800° C.) or higher energy densities (>70 mJ/cm$^2$).[30,32] The initial resistance of the IML patterned graphene before annealing was 135±15 kΩ (n=5) across a rectangular area of 25 mm×3 mm. The resistance of the IML patterned graphene (patterned on a Si/Sift wafer sample) was reduced to 3.5±0.25 kΩ (n=5) after thermal annealing at 1000° C. for 60 min (FIG. 8). It is important to note that this annealing process was conducted in an inert ambient atmosphere, such as nitrogen, to ensure that the graphene did not oxidize at higher temperatures (>350° C.)—an effect that can subsequently hinder the electrical conductivity of the graphene.[22] Alternatively, laser annealing was used to anneal the IML patterned graphene on temperature sensitive substrates (e.g., Kemafoil®, PET, polyimide) via a 1000 mW benchtop laser engraver. This laser annealing process (scan rate of 50 ms) reduced the graphene resistance to 329±18Ω (n=5) (FIG. 8), which corresponds to a sheet resistance of ~90 Ω/sq and electrical conductivity of ~26,000 S/m.

Initially, the patterned graphene using the IML method is free of any oxygen functional groups. X-ray photoelectron spectroscopy (XPS) reveals distinct C—C bonds around 284 eV which is a combination of sp2 (284 eV) and sp3 (284.8 eV) bonding structure, with no noticeable oxygen bonded to the surface of the graphene (FIG. 9A). Upon laser annealing in an oxygen atmosphere, an additional shoulder peak appears which represents oxygen groups (C—O—C at ~286.5 eV and C=O at ~288.5 eV) functionalized to the surface of the graphene (FIG. 9B). As graphene oxide is relatively not conductive, and the graphene patterned using IML is conductive, the oxygen groups are most likely localized to the surface of the graphene where the heat/energy of the laser facilities ambient oxygen groups to bind to superficial graphene flakes.

Printing Resolution

The printed graphene lines were characterized via both Confocal microscopy and AFM (FIGS. 4A-F). This process removed the sacrificial layer (FIG. 4A) leaving a conductive graphene pattern with high-resolution down to 20 µm (FIG. 4B), which is smaller than conventional inkjet printing techniques (~50-100 µm).[22] This EVIL process creates graphene lines with defined edges and relatively consistent height as opposed to inkjet printing which produces dome-like shaped cross-sections.[32] Confocal microscopy revealed IML graphene printed lines with 20 µm width and 0.6 µm height (FIG. 4C), along with sharp edges, and consistent spacing (FIG. 10). Atomic force microscopy (AFM) was next conducted (FIG. 4D) to analyze the surface morphology, which displayed a relative even graphene deposition but with high surface area due to the randomly orientated superficial graphene flakes. AFM revealed a 0.4 µm steep step at the edge of the patterned graphene with relatively smooth morphology across the surface a 20 µm printed graphene line (FIGS. 4E-4F). The difference between AFM and confocal microscopy height measurements is most likely due to different test locations of the spin coated graphene as spin coating deposits material more heavily in the center and thinner further from the axis of rotation. Spin coating a second layer of graphene ink resulted in a doubling of the film thickness to 0.8 µm (see AFM measurements in FIG. 4F, note that each height profile acquired at the same location on the sample).

Electrochemical $H_2O_2$ Sensing with Graphene Films

Figure 5A:
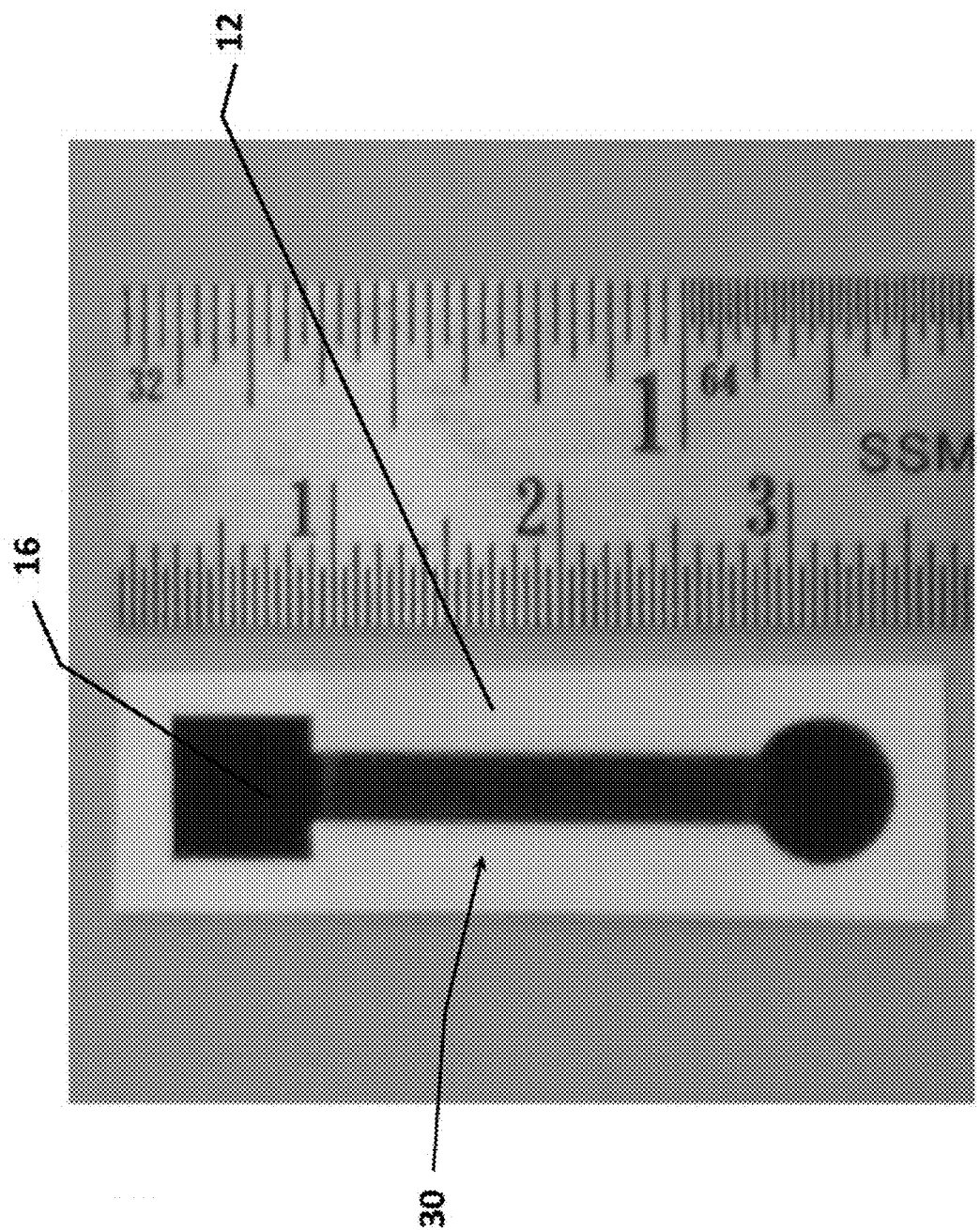
Figure 5B:
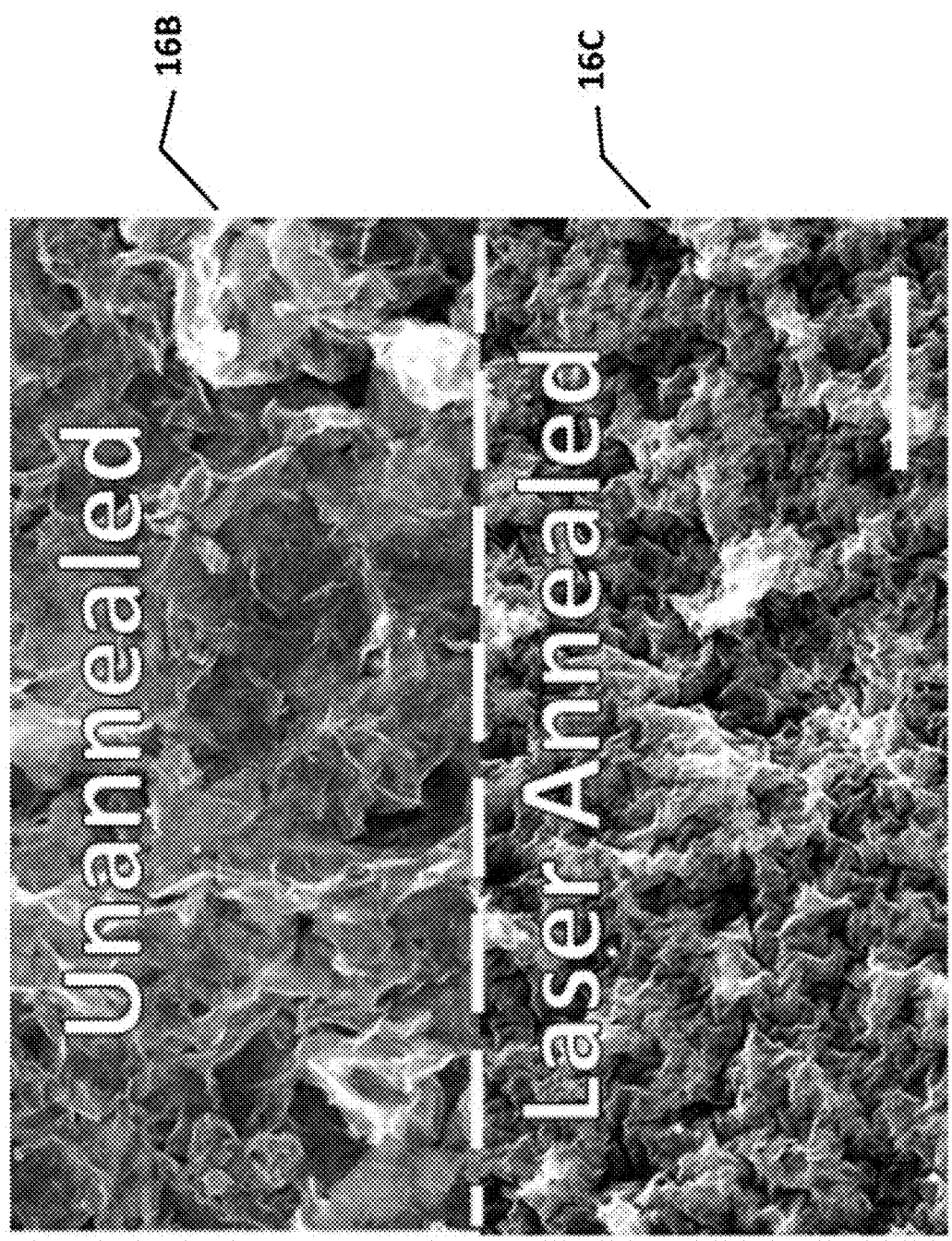
Figure 5C:
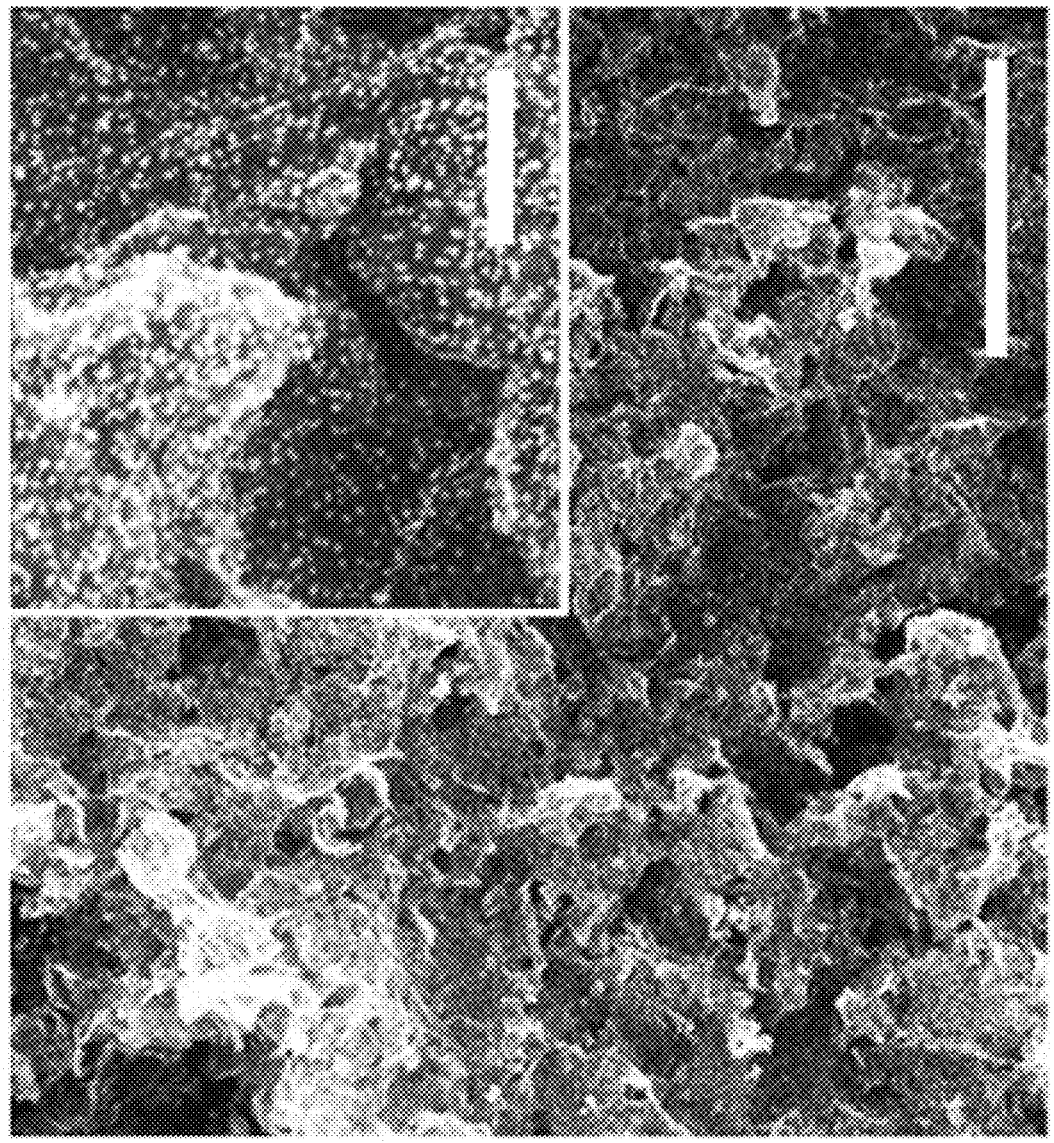
Figure 5D:
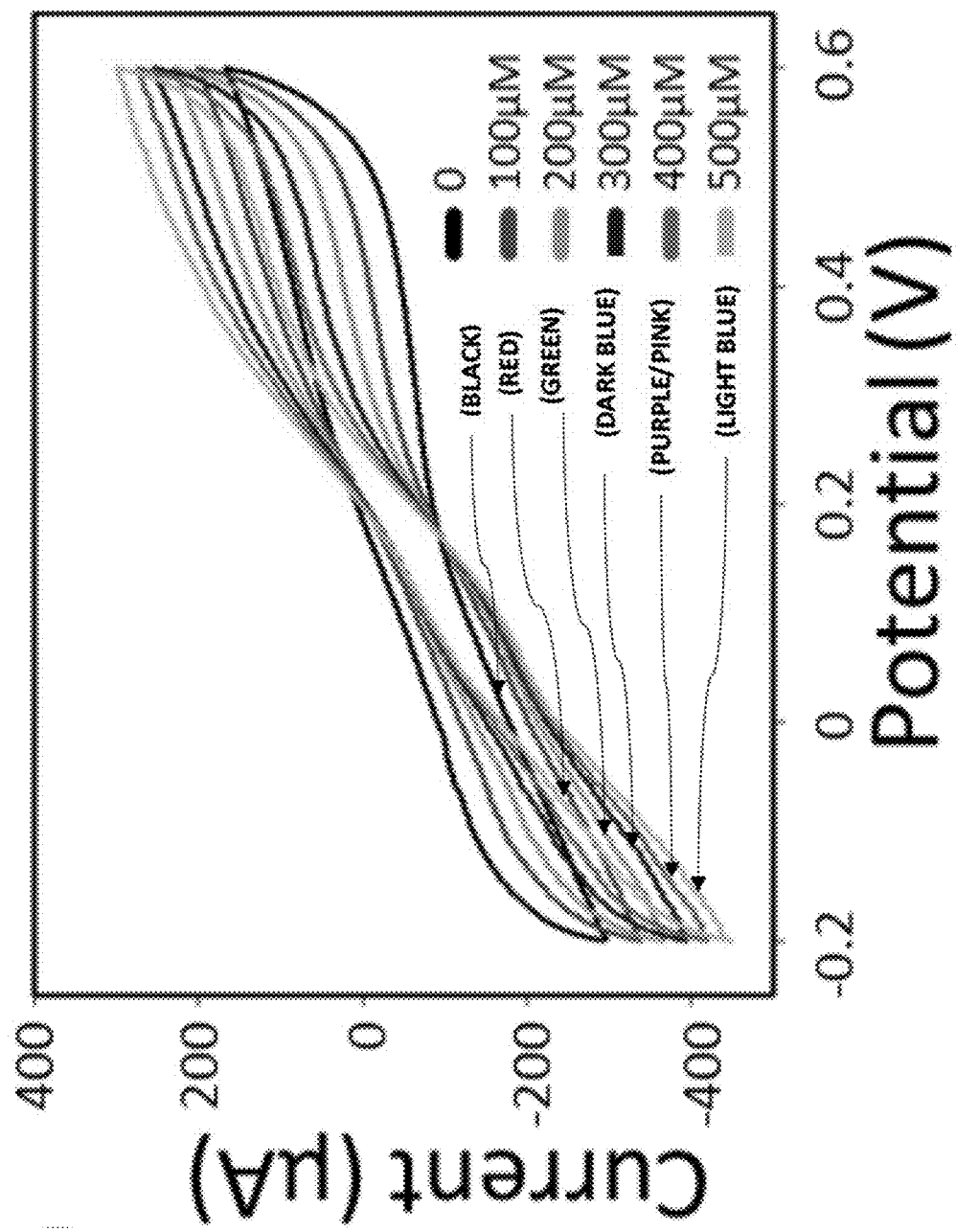
Figure 5E:
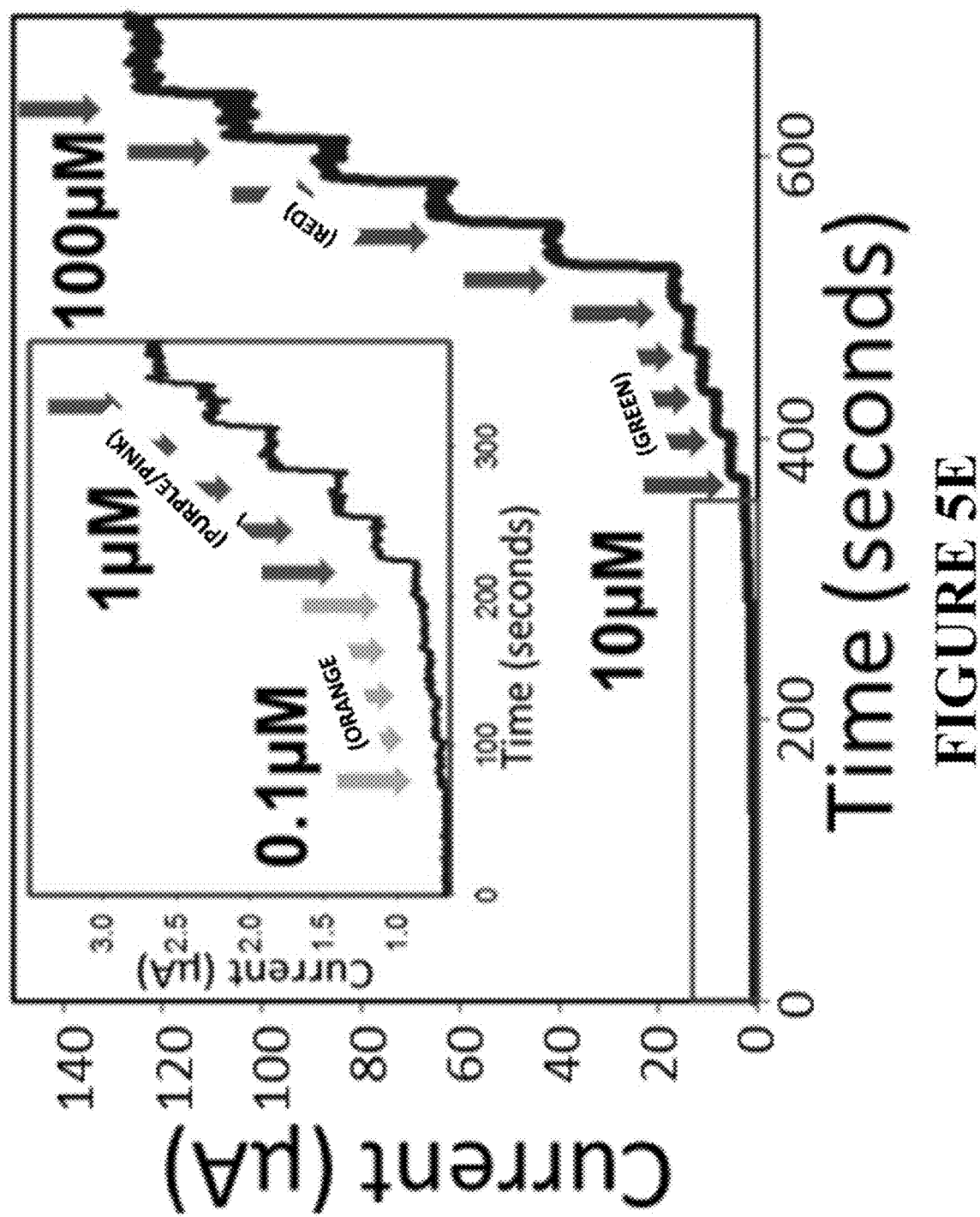
Figure 5F:
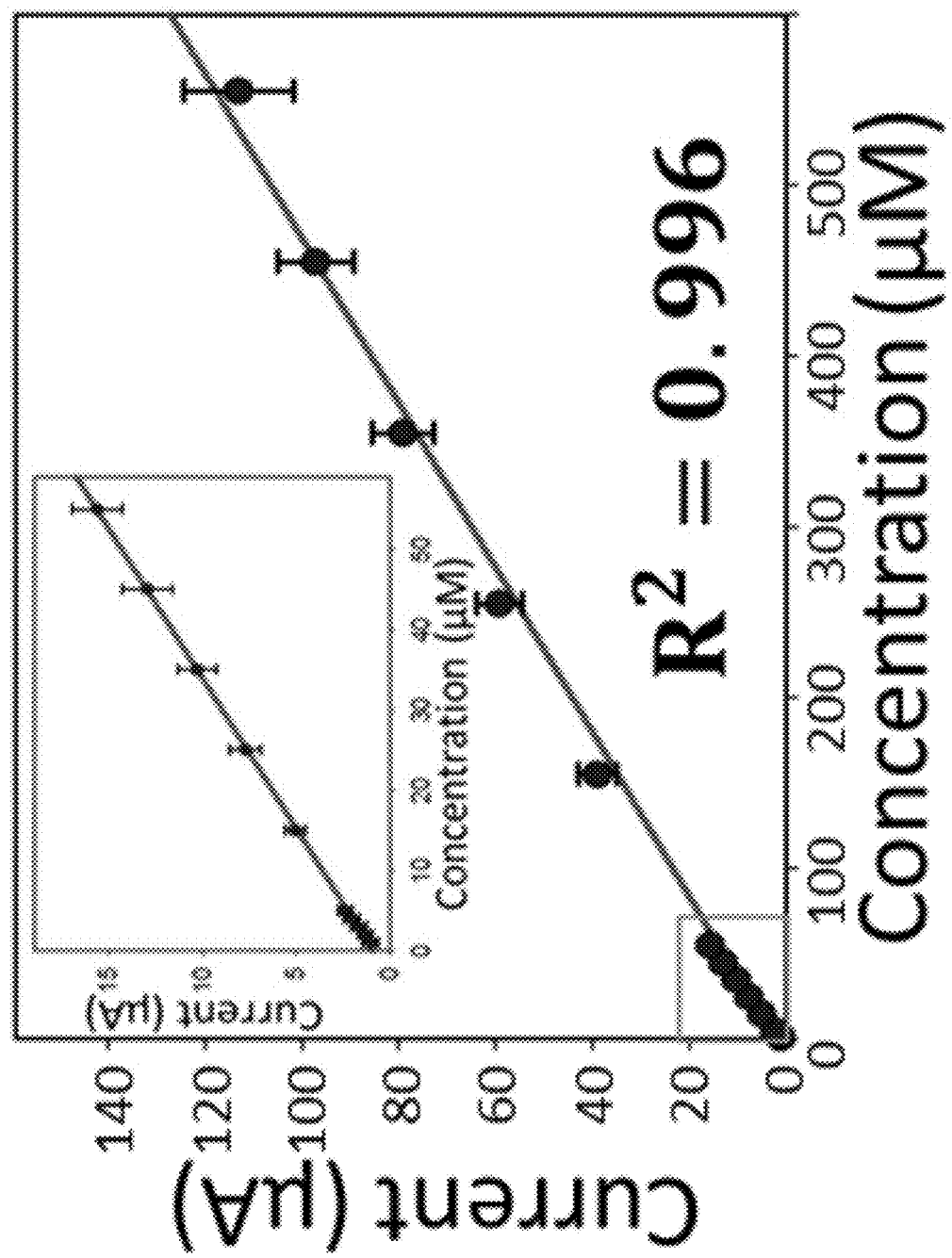

The electrochemical sensing capability of the patterned graphene using the IML method was first characterized via $H_2O_2$ sensing. A graphene electrode (25 mm×3 mm) was fabricated via IML and laser annealing (FIG. 5A). We have shown previously[30] that laser annealing fuses/welds together graphene boundary layers and significantly increases the printed graphene surface area by nano/microstructuring the orientation of superficial graphene flakes (FIG. 5B). Laser annealing was used to increase the surface area and superficial defects which are well-suited for electrochemical, heterogeneous charge transport and metallic nanoparticle deposition.[34,35] Platinum nanoparticles were subsequently electrodeposited onto the surface of the electrode according to our previous protocols (FIG. 5C, & Experimental Methods)[35,36] as it is an efficient non-enzymatic catalyst for $H_2O_2$ sensing. The laser annealed, high surface area graphene not only acts as a conductive transduction material but also provides an effective scaffold structure for the platinum nanoclusters. We have shown in similar studies that this graphene/platinum hybrid dramatically improves $H_2O_2$ sensing over platinum alone.[35,37,38] Subsequently, a semi-homogenous layer of platinum nanoclusters (~25-50 nm diameter spheres) were evenly electrodeposited across the graphene surface (FIG. 5C). Cyclic voltammetry and amperometry were next conducted via a standard 3-electrode set-up to electrochemically characterize the platinum-graphene sensors (FIGS. 5D-5F). Cyclic voltammograms acquired with increasing concentrations of $H_2O_2$ (100 µl final concentration additions, from 0 to 500 µM) revealed that peak oxidation occurred at a voltage of approximately +0.4 V (FIG. 5Q). Subsequent amperometric measurements (FIGS. 5E & 5F) were conducted at a working potential of +0.4 V for increasing concentrations of $H_2O_2$ (i.e., 5 increments of 0.1 µM, 1 µM, 10 µM and 100 µM respectively). These amperometric results show a wide linear $H_2O_2$ sensing range (0.1 to 550 µM, $R^2=0.996$), high sensitivity 0.21 µM/µA, low detection limit [0.21±0.16 µM (3σ)], and a fast response time (~5 sec.). The $H_2O_2$ sensor compared favorably to those achieved by similar carbon/metal hybrids electrodes while eliminating the need for multiple processing steps (e.g., electrode polishing, drying under infrared lamps, multiple electrodepositions steps, and sonication cleaning) (Table 1).

TABLE 1

Performance comparison table of electrochemical $H_2O_2$ sensors comprised of carbon nanomaterial/metal nanoparticle hybrids.

| Electrode | Operating Potential (V) | Linear Range (µM) | Detection Limit (µM) | Reference |
|---|---|---|---|---|
| PtAu NC Graphene GCE | +0.1 | 0.82-8.73 | 0.008 | 39 |
| PNEGHNS | 0 | 1-500 | 0.008 | 40 |
| OMCs/GE | +0.35 | 0.1-500 | 0.032 | 41 |
| GNPs/GN-CS/GCE | −0.4 | 5-35000 | 1.6 | 42 |
| CODs/octahedral $Cu_2O$ | −0.2 | 5-5300 | 2.38 | 39 |
| CNF-PtNP/GCE | −0.34 | 10-9380 | 1.9 | 43 |
| IML, Pt-Graphene | +0.4 | 0.1-550 | 0.21 | This Work |

PtAu NC Graphene GCE: Platinum-gold nanoclusters on glassy carbon electrode.
PNEGHNS: Platinum Nanoparticle Ensernbled-on-graphene hybrid nanosheet.
OMCs/GE: Ordered Mesoporous carbons modified glassy carbon electrode.
GNPs/GN-CS/GCE: Gold Nanoparticle Graphene Chitosan modified glassy carbon electrode.
CODs/octahedral $Cu_2O$: carbon quantum dots octahedral cuprous oxide nanocomposites.
CNE-PTNP/GCE: Nanoporous Carbon Nanofibers Decorated with Platinum Nanoparticles on Glassy Carbon Electrode.
IML Pt-Graphene: Inkjet maskless lithography electrodeposited platinum on graphene.

Graphene Interdigitated Electrode (IDE) Film Fabrication and Characterization

Figure 6A:
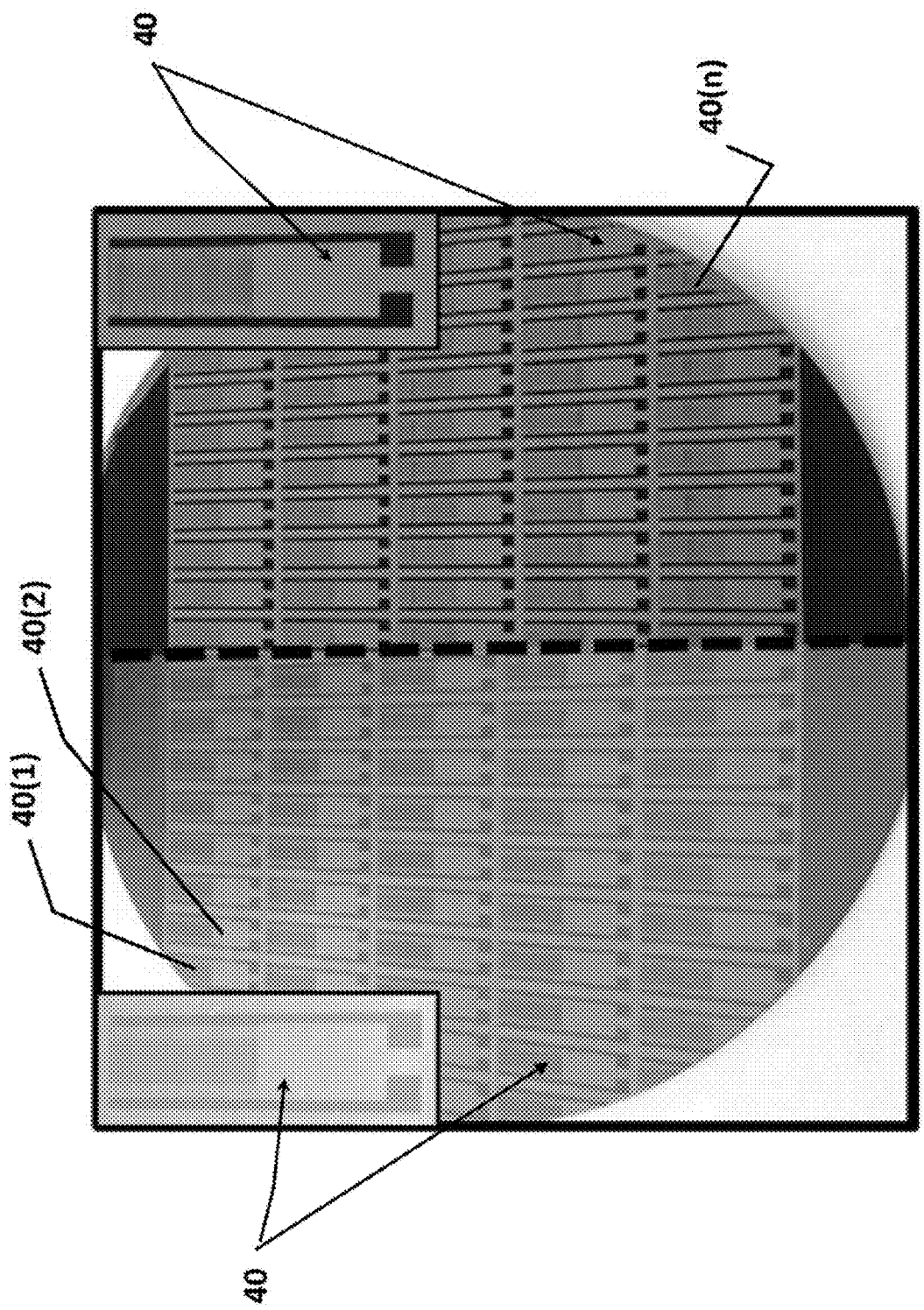
Figure 6B:
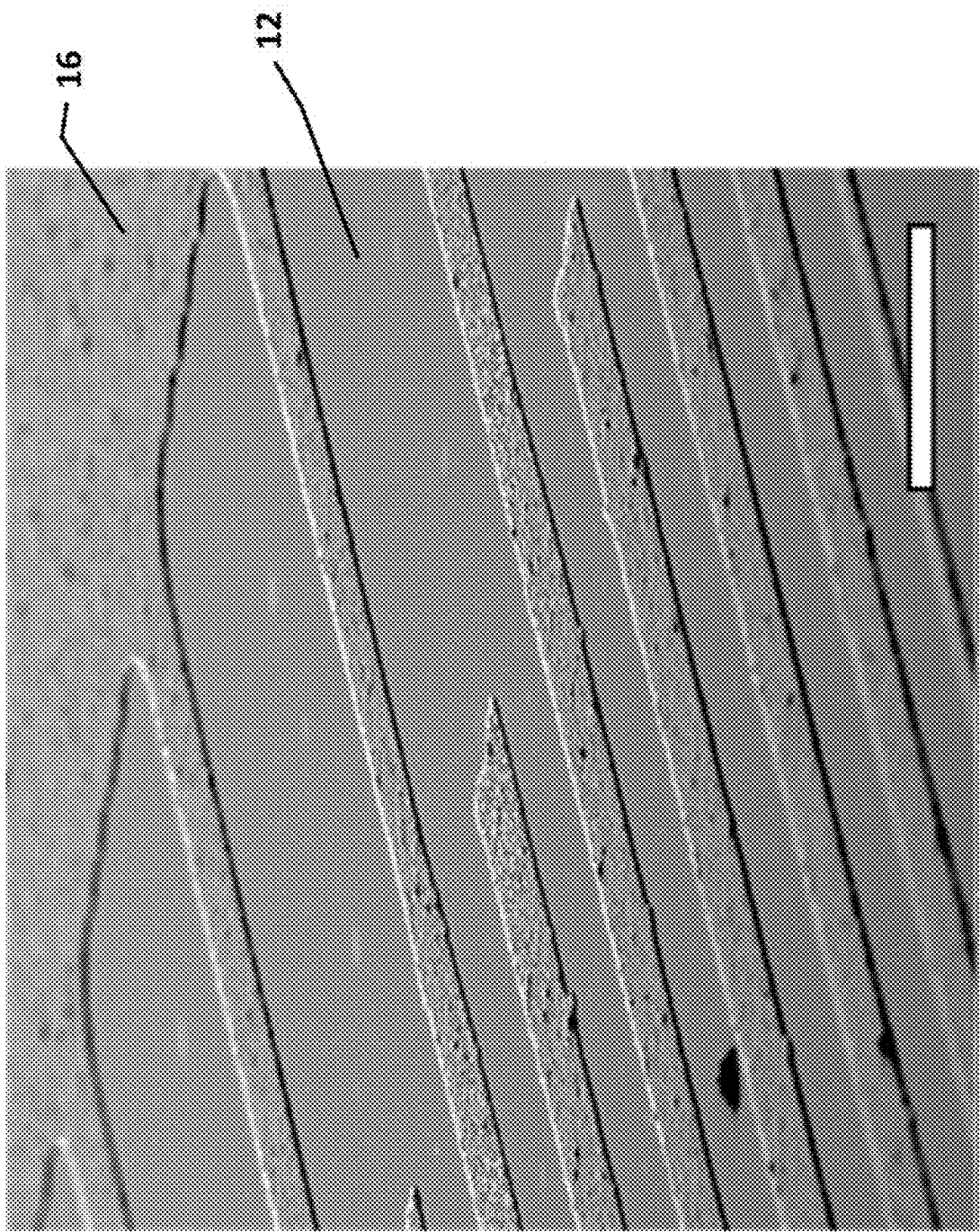
Figure 6C:
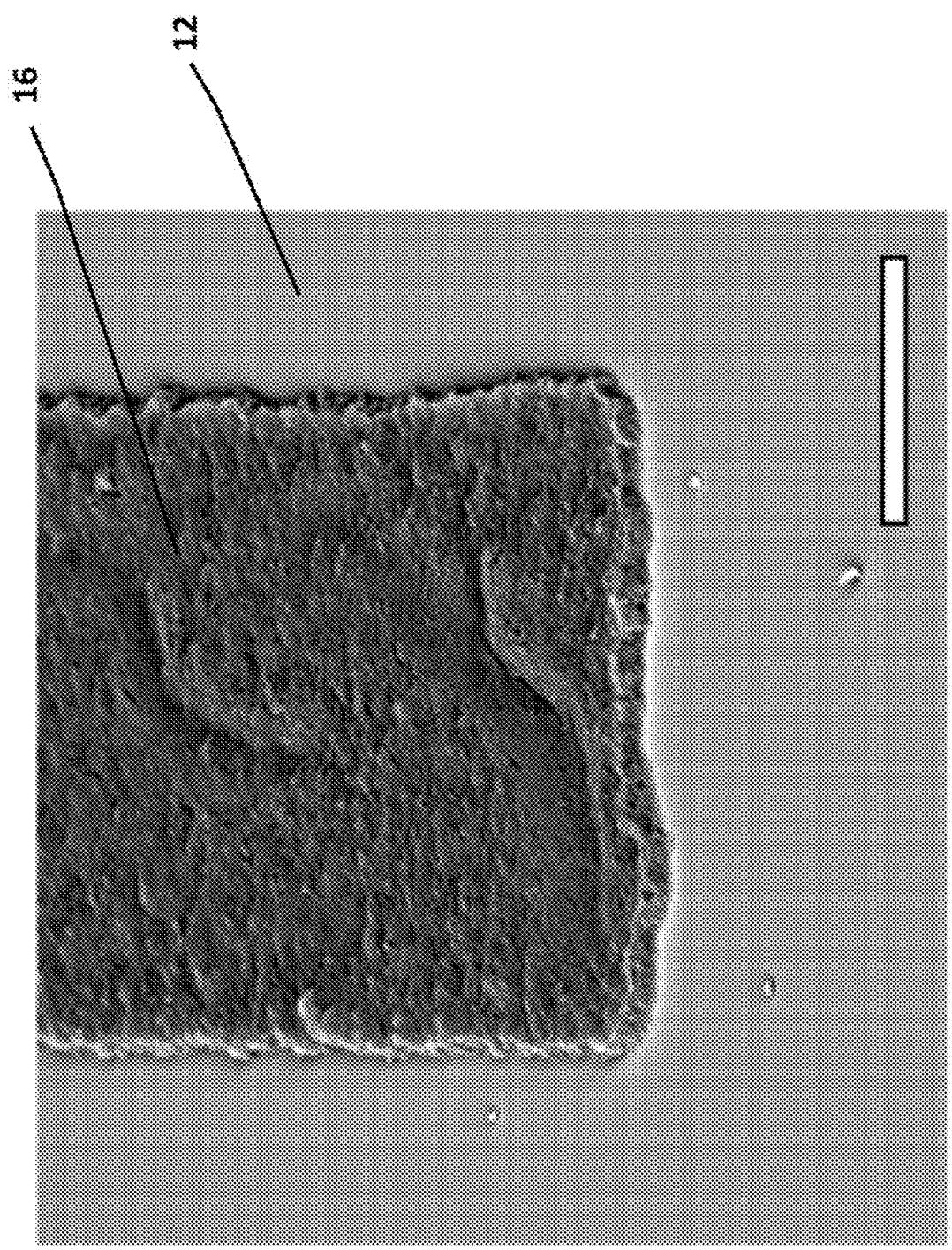

Next, complex graphene patterns were developed and characterized using the IML method include a high-resolution IML logo (see Supplemental Video 2; excerpted frames of which are at FIGS. 18A-J). It should be noted here that such IML patterning is not limited to graphene inks but can also be conducted with other inks such as those derived from metallic nanoparticles (e.g., silver nanoparticles) (see FIGS. 11A-B). An interdigitated electrode (IDE) array, a pattern consisting of two electrodes in alternating parallel bands with "comb-like features" that experiences large collection efficiencies,[44] increased signal-to noise ratios,[45] fast response times,[46] as well as no need for a separate reference electrode during electrochemical sensing,[47] was next created with IML to test the electrochemical reactivity of such high-resolution graphene patterning. The IML graphene IDE was fabricated with finger widths of 50 µm and inter-finger spacing of 75 µm on silicon (FIG. 6B & FIG. 12). SEM images of the graphene IDEs displayed a well-defined graphene pattern with sharp edges, straight lines, and consistent width (FIG. 6B, FIG. 6C & FIGS. 13A-D). A high-resolution SEM corroborated well with our previous AFM measurements by displaying a sharp step height on the edge of the graphene pattern and flat textured surface with high surface area due to the randomly orientated graphene flakes.

Figure 6D:
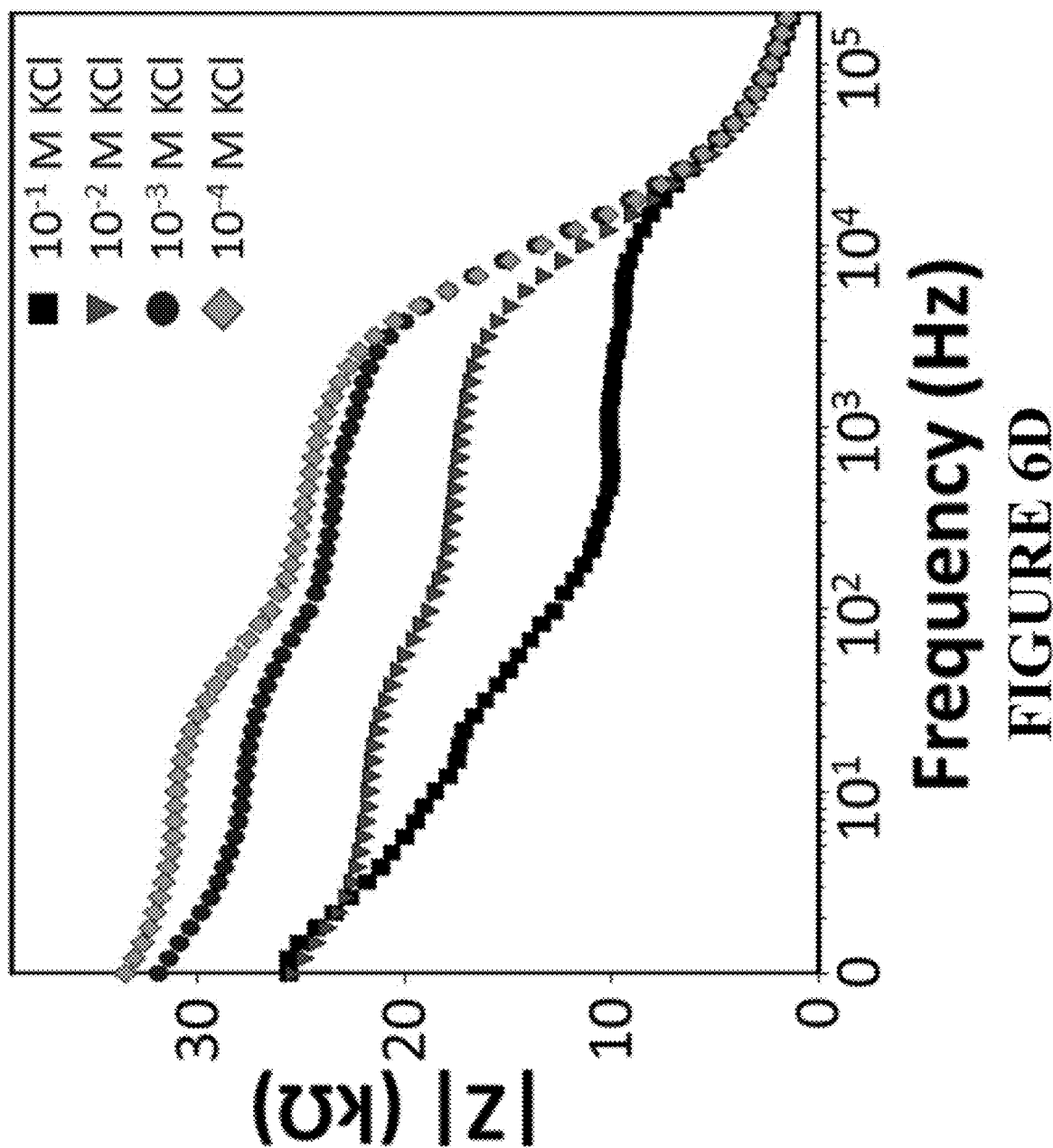

The graphene IDEs were electrochemically characterized by AC non-faradaic electrochemical impedance spectroscopy (EIS) in varying concentrations ($10^{-1}$, $10^{-2}$, $10^{-3}$, and $10^{-4}$ M) of potassium chloride (KCl). The direct relationship of impedance with frequency was analyzed via the Bode plot (FIG. 6D). At lower frequencies (below 10 Hz), the impedance is related to the double layer capacitance, while at higher frequency (above 10,000 Hz) the dielectric region governs the impedance.[48] The region in-between the double layer and the dielectric region is due to the solution resistance in which changes in the concentration of ions and their mobility were analyzed. Subsequently, increasing the KCl concentration resulted in an increase in impedance in both the double layer and solution resistance regions.

Figure 6E:
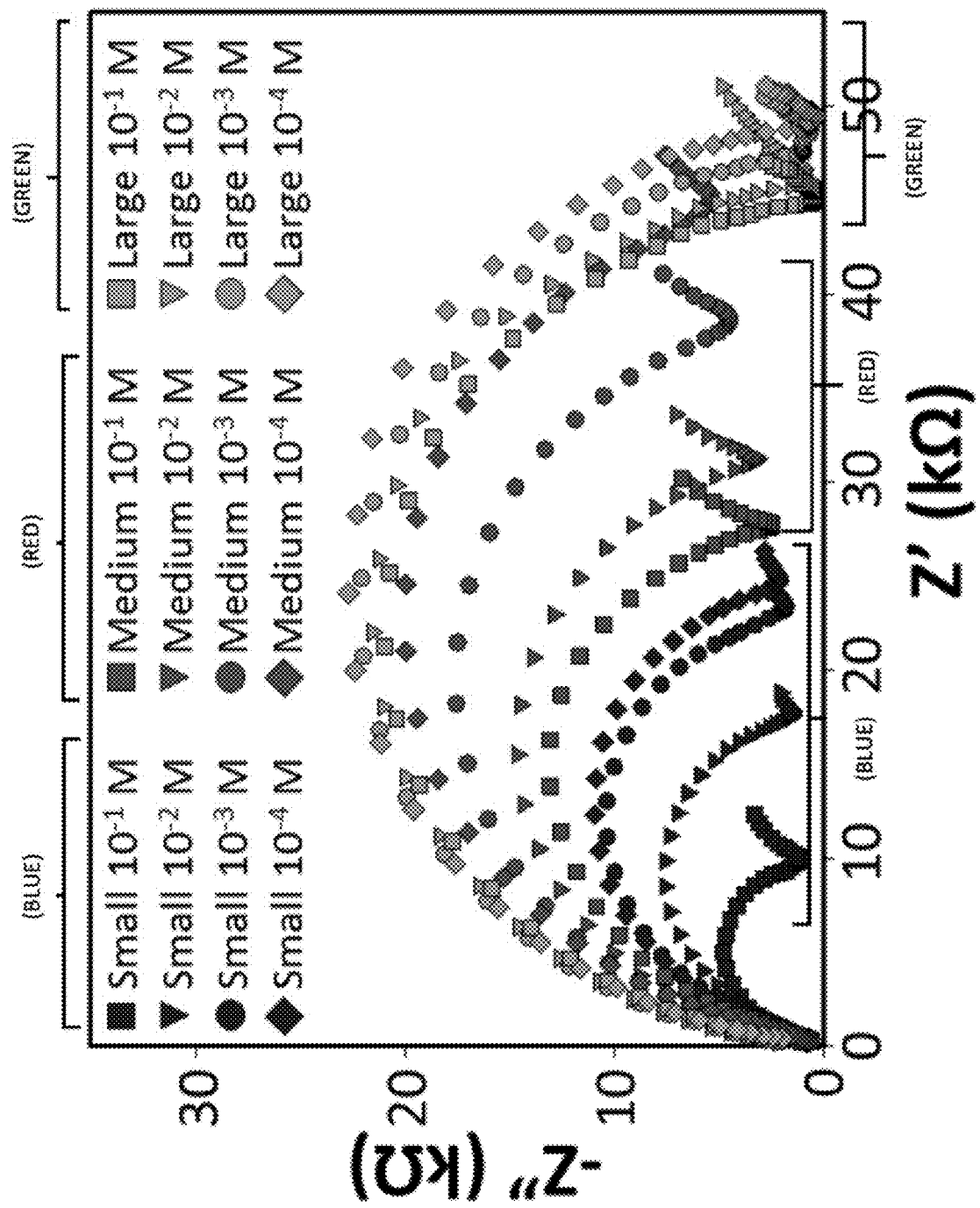
Figure 7A:
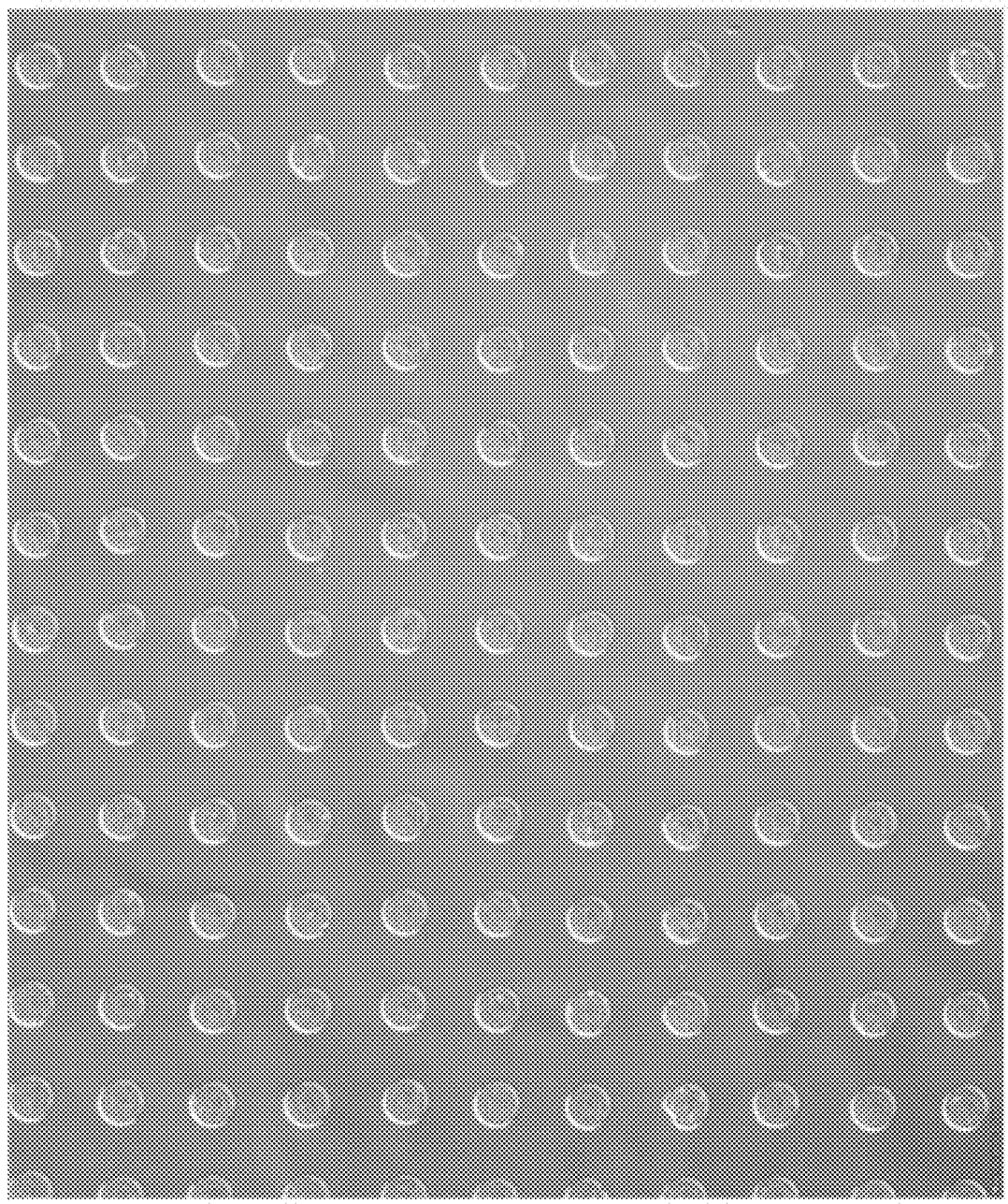
Figure 7B:
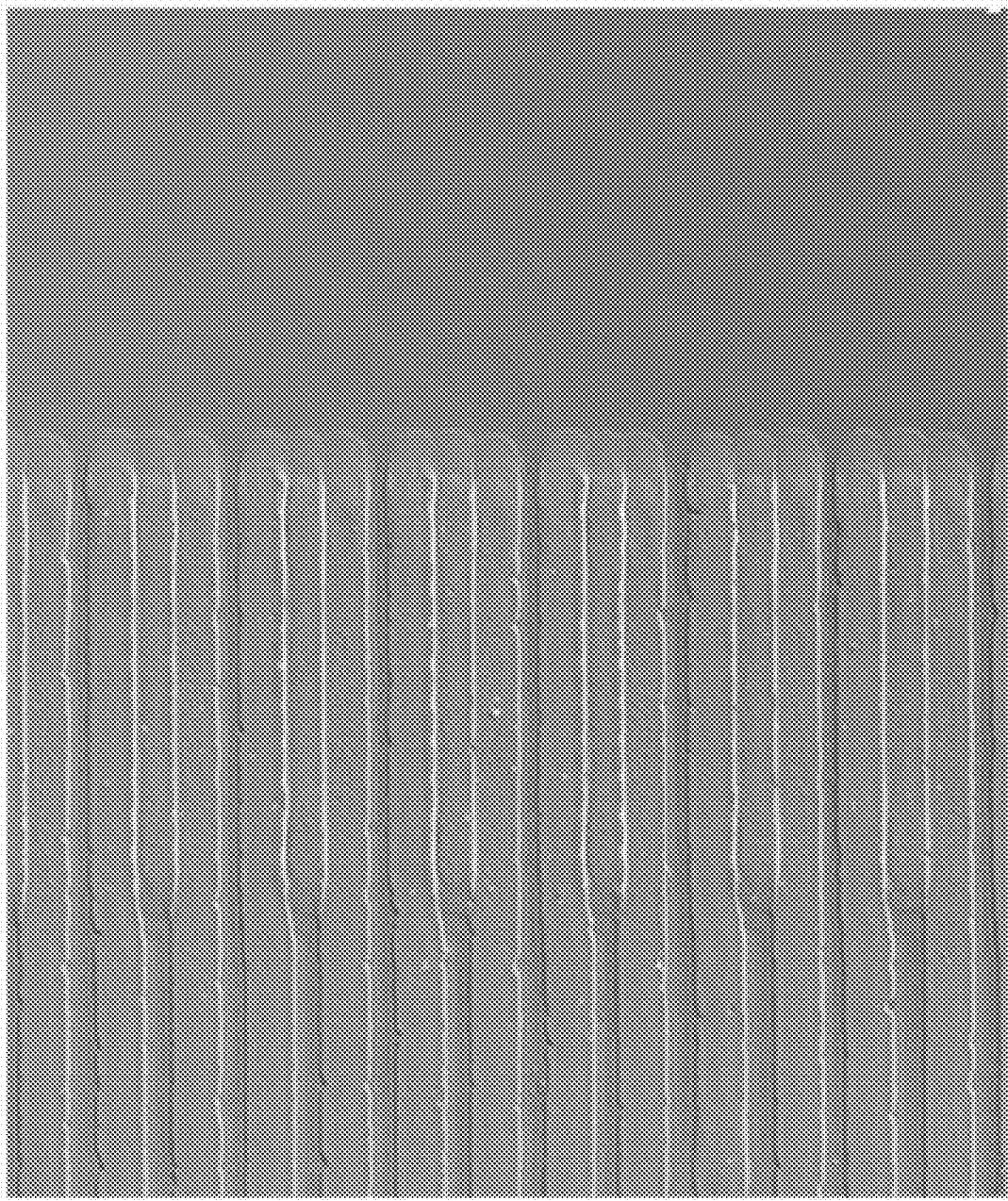
Figure 7C:
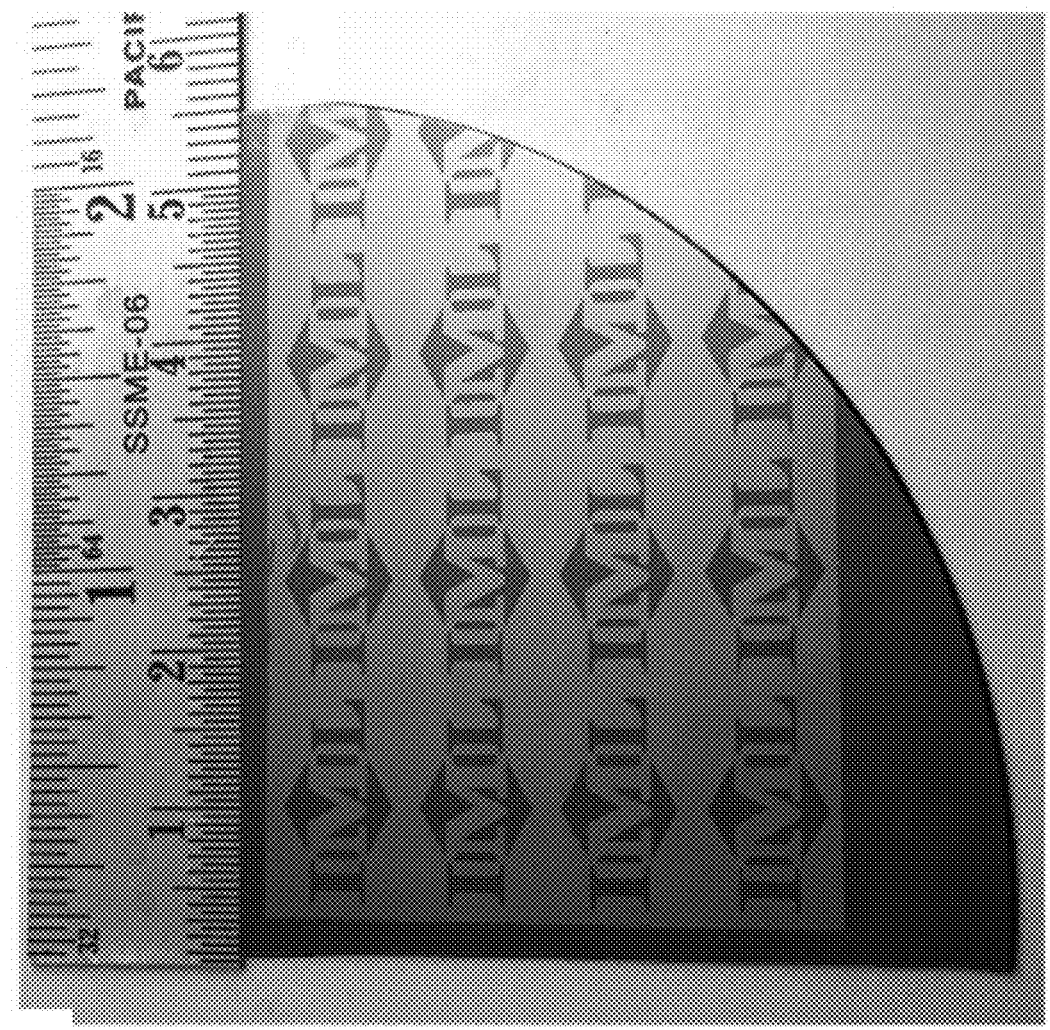
Figure 7D:
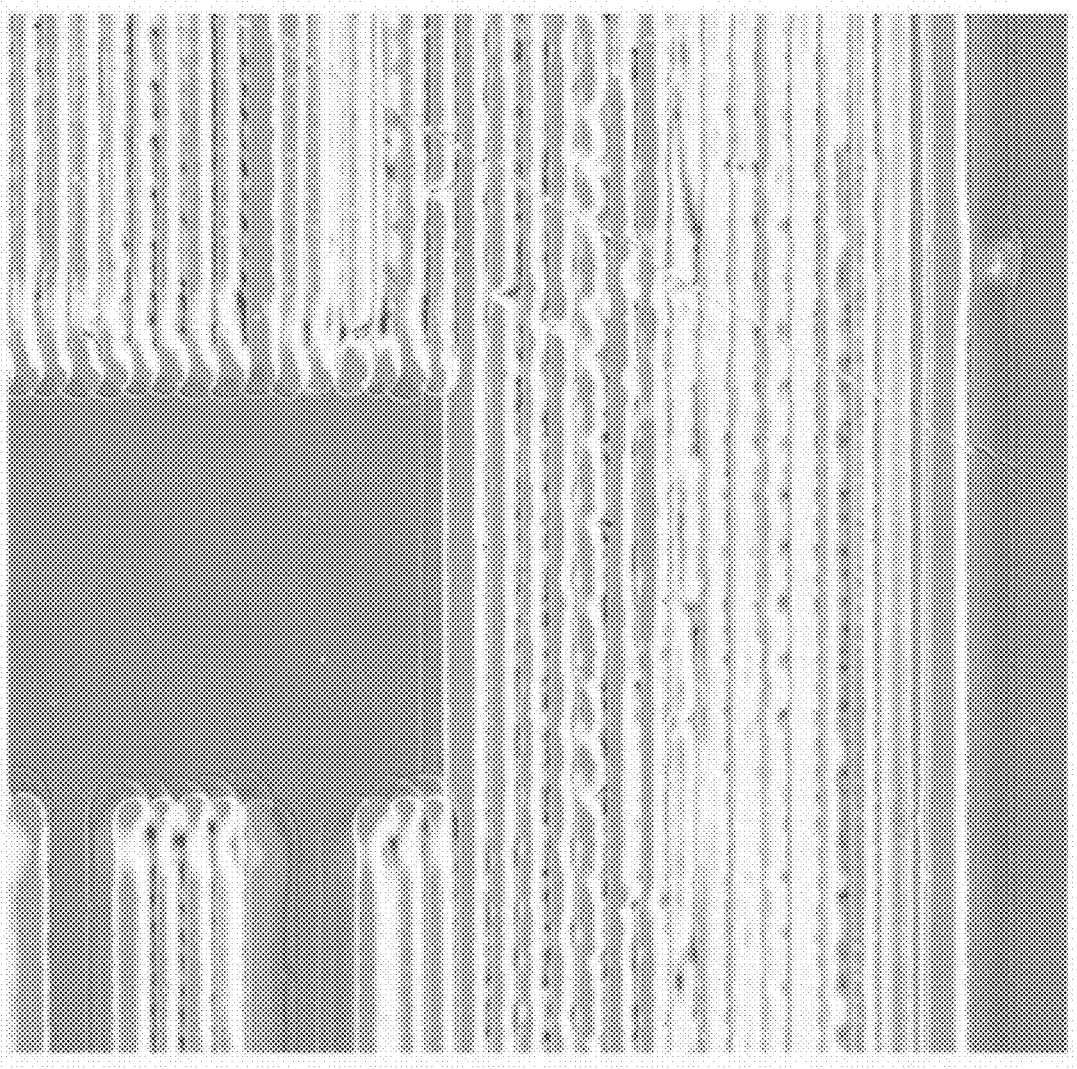

Next, three distinctly sized graphene IDEs with two 10-finger combs of varying finger width and spacing (50 µm and 50 µm; 75 µm and 150 µm; 150 µm and 200 µm; finger width and spacing respectively) were created via the IML method. The electrodes were characterized by EIS and the real verses imaginary impedance were plotted (FIG. 6E). All graphene IDES displayed typical Nyquist impedance characteristics: semicircle shapes with straight tails (45° straight line after semicircle) where the semicircular region (high frequency) is kinetically controlled and the tail region (low frequency) characterizes the mass-transfer controlled section (diffusion limited process).[49] The double layer capacitance of the graphene IDE (50 µm finger width and 50 µm finger spacing) was calculated to be ~5 nF in 0.1 M KCl which is comparable to IDEs comprised of palladium,[50] gold,[51, 52] and carbon nanotubes[53] (Experimental Methods). As the concentration of KCl increased the equivalent film resistance increased making the system kinetically slower (wider semicircle) for each of the different feature size graphene IDEs. As expected, the graphene IDE with larger feature sizes displayed larger film resistance ($R_{ct}$, diameter of semicircle). Additionally, the IDES with smaller feature sizes demonstrated the most favorable sensing characteristics as they were more sensitive (change in diameter of semicircle, $\Delta R_{ct}$) to variations in the KCl concentration as impedance values recorded for IDEs with the smallest to largest feature sizes were 21 kΩ, 17 kΩ, and 4.5 kΩ respectively. These results demonstrate that the IDE fabricated using the IML method displayed standard EIS characteristics and hence can act as a viable EIS sensor; furthermore, decreasing the feature size of the electrochemical sensors can improve sensor sensitivity.

CONCLUSIONS

In summary, a micro-manufacturing technique of depositing graphene films for high-resolution patterning has been demonstrated using a technique coined IML. This method can pattern solutions not easily inkjet printable such as inks comprised of high nanoparticle concentrations, large particle sizes, or higher viscosities. This developed IML process creates smaller feature sizes than conventional inkjet printing as the feature size is not limited to the width of the jetted material, but rather the space between two printed lines. In addition to high-resolution patterning, this process promotes rapid prototyping as no photolithography steps, stencils, or patterns are necessary.

Two different patterns were designed and tested to demonstrate the application of IML for electrochemical sensing. First, a $H_2O_2$ sensor was manufactured which showed the electroactive nature of the patterned and laser annealed graphene electrodeposited platinum hybrid using the MIL technique. The designed $H_2O_2$ sensor exhibited a low detection limit (0.21±0.16 µM), wide linear sensing range (0.1 to 550 µM), and fast response time (5 sec)—the graphene films exhibited a degree of electroactivity during electrochemical sensing. Next, IDEs of varying finger width and spacing (50 µm and 50 µm; 75 µm and 150 µm; 150 µm and 200 µm respectively) were manufactured to demonstrate the ability to create distinct high-resolution graphene circuits rapidly via the IML process. The patterned graphene IDEs had sharp edges, consistent line width, and demonstrated characteristic EIS measurements such as a double layer capacitance of ~5 nF. EIS measurements revealed that sensor sensitivity is correlated to electrode feature size as the IDE with the smallest finger width and spacing (50 µm and 50 µm) displayed the largest EIS magnitude response in KCL (~21 KΩ). The developed IML technique can be used to pattern solution-phase graphene on diverse substrates such as silicon as well as flexible, disposable substrates including Kemafoil® (heat treated PET), clear PET, and polymeride tape (FIGS. 14A-D). We have also demonstrated that other inks such as silver can be patterned with this AIL technique (FIGS. 11A-B). In summary, this work shows great promise in providing a rapid prototyping method of high-resolution patterns for concentrated, conductive nanoparticle inks which is compatible with multiple substrates. Hence this technique could potentially have wide utility to applications that use patterned graphene including electrochemical sensors, energy harvesters, batteries, capacitors/supercapacitors, triboelectric nanogenerators, strain sensors, and chemical/biological sensors.[43, 54, 55, 56, 57, 58, 59, 60]

EXPERIMENTAL METHODS

Materials

Completely reduced graphene oxide (referred throughout as Graphene) was purchased from ACS Materials (USA). All other chemicals including solvents were purchased from Sigma-Aldrich (USA), and used without any other further purification. The use of these chemicals is outlined in the following sections of this Experimental procedure section.

Polymer Lacquer Formulation and Printing

Polymer lacquer ink was designed and optimized using an acrylic lacquer and diluted with solvents to inkjet printable range. In short, 1 mL of a toluene formaldehyde nail polish was mixed with 1 mL of terpineol and 8 mL of cyclohexanone. The solution was then vortexed for 1 minute and filtered using a 0.45 syringe filter. The viscosity and surface tension of the ink was measured using Rheometer microVisc micropipette viscometer at 40° C. and were found to be 6 cP and 41 mN/m, respectively.

Inkjet printing of the polymer lacquer inks was conducted with a Fujifilm Dimatix Materials Printer (DMP2800). The polymer sacrificial ink was loaded into a 3 mL printer cartridge and printed through 1 pL nominal drop volume nozzles. The waveform was adjusted to print nozzles at a temperature 40° C. with a 20 µm drop spacing. These parameters yielded consistent droplets without any satellite droplets as well as well-defined lines that held tightly to the substrate. The ink was printed onto N-type <1,0,0> 300 nm dry thermal oxide polished silicon wafers (Silicon Quest International Inc.), polyimide (DuPont Kapton 125 µm), and heat stabilized polyester film (Coveme, Kemafoil® PET 100 µm). Typically, a single printed layer adequately form the sacrificial layer, which dramatically increases the speed and resolution of IML over typical inkjet printing, however porous materials required additional printing passes as the polymer was absorbed into the surface.

Graphene Ink Formulation and Graphene Film Fabrication

Graphene ink (10 mL) was synthesized by first vortexing 150 mg of completely reduced graphene oxide (ACS Material, GN1P0005, 1~5 µm flake size) in 50 mL of ethanol for 5 min at high speed in a 50 mL falcon vortex tube. Ethyl Cellulose (viscosity 46 cP, 5% in toluene/ethanol 80:20(lit.), Sigma-Aldrich 433837) was added to the solution (25 mg/mL) and revortexed for 5 minutes on high to increase solution homogeneity. Next, 10 mL of terpineol (Sigma-Aldrich T3407) was added to the solution. The graphene ink was then poured into a 100 mL beaker and probe sonicated (Sonics Vibra-cell VCX-750 ultrasonic processor) at 70% amplitude with a 9 second pulse and 1 second rest for 2 hours to break up large particles. The beaker was suspended in a water bath and the water was continually refreshed to provide cooling during sonication. The solution was then bath sonicated for 6 hours at high power to break up the graphene into smaller particles. The bath temperature was refreshed to maintain a temperature of no more than 40° C. The ethanol was then evaporated off by heating on a hotplate, leaving a concentrated graphene solution (15 mg/mL). This procedure provided a stable and homogenous graphene ink with a viscosity well-suited for spin coating (176.2 cP).

The graphene ink was spin coated over the entire surface of the substrate including the inkjet printed sacrificial layer. 1 mL of graphene ink was pipetted on the center of the wafer and spin coated at 1000 rpm for 30 seconds. The wafer was then heated at 90° C. on a hotplate for 2 minutes to dry the graphene ink. A post-bake was performed in a convection furnace at 120° C. for 1 hour to ensure the graphene thoroughly adhered to the substrate, or baked with a heat gun for 10 minutes. The sacrificial layer was then removed in an acetone bath and impinged with acetone from a wash bottle or bath sonicated in a Branson 2800 series bath sonicator at low power for 10 seconds to remove excess graphene. It should be noted that adhesion between graphene flakes often created a thin graphene film layer that adhered to the edges of the patterned graphene and suspended over the sacrificial layer (FIG. 1.5A). Hence, this thin graphene film layer impedes the graphene lift-off process and prevent straight edge graphene lines. To circumvent these deleterious effects, the graphene electrodes were sonicated in an acetone bath for 10 seconds at low power or impinged with acetone from a wash bottle to remove excess graphene (FIG. 15B).

Scanning Electron Microscopy (SEM)

The IML patterned graphene was investigated using a Field Emission Scanning Electron Microscopy (FESEM) [FEI Quanta 250]. All images were captured using secondary electron (SE) mode, with a working distance of ~10 mm, spot size of 3.0, and with a 10 kV accelerating potential. Iridium was evenly coated using turbo-pump sputter coater to deposit a 2 nm conductive coating over all samples to insure no surface charging or capacitance.

Atomic Force Macroscopy (AFM)

Atomic force microscopy images of printed graphene layers on silicon wafer surfaces were acquired in PeakForce Tapping mode using a Dimension Icon scanning probe microscope (Bruker, Santa. Barbara, Calif.). The PeakForce Tapping images were acquired using ScanAsyst. AFM probes used where model SCANASYST AIR (Bruker, Santa Barbara, Calif.). All images were acquired in air. AFM images were post processed using plane-fitting (second order) and/or flattening (zeroth order) techniques with Nanoscope software.

Confocal Microscopy

Confocal microscopy (Sensofar, S-neox, Spain) measurements were performed to study the surface features of printed graphene layers on prepared silicon wafers. An area of 350.88×264.19 µm² with 150× magnification was scanned with the SensoScan software. The z-scan was performed using a 0.1 µm step size. Form removal post processing was performed to remove sample tilt.

X-Ray Photoelectron Spectroscopy (XPS)

X-ray photoelectron spectroscopy of EVIL patterned graphene before and after laser annealing was analyzed using a Kratos Amicus X-ray Photoelectron Spectrometer containing Al K$\alpha$ excitation source (1486.7 eV). The binding energy scan was formed by subtracting the excitation energy from the measured photoelectron energy from the constituent elements. The C is spectrum fitted using CasaXPS with a Shirley background fitting and a Gaussian Lorentzian line peak fitting on the constituent peaks.

$H_2O_2$ Sensor Fabrication and Electrochemical Characterization

All electrochemical measurements and procedures were conducted on a CH instrument potentiostat (600E series) in 1×PBS buffer. $H_2O_2$ sensor was fabricated using IML described in the paper. The electrodes were laser annealed at laser power 1 and raster rate of 50 milliseconds using a 1000 mW engraver using a blue violet laser. Platinum was electrochemically deposited onto the graphene surface of the working electrode with a 2.5 mA/cm$^2$ current for 100 cycles following our similar established protocols for electrode-positing platinum nanoparticles on graphene and carbon nanotubes.[30, 35, 36, 61] The $H_2O_2$ sensors were next placed in 3D printed container to standardize testing between electrodes; these sensors were tested using a standard three electrode setup with an Ag/AgCl single membrane reference electrode and a platinum wire counter electrode (FIG. 16). Cyclic voltammograms were conducted with a scan rate 0.05 mV/s between the potential voltage of 0.2 to +0.6 V (FIG. 5D). Amperometric voltammetry was conducted at +0.4 V as determined from cyclical voltammetry. Electrodes were polarized for approximately 250 seconds before $H_2O_2$ additions were added. $H_2O_2$ (Sigma. Aldrich H1009) dilutions in 1×PBS was then added to create final concentration additions of 0.1 µM through 100 µM. The response time of the sensor was defined as the time from initial $H_2O_2$ injection to the point at which 95% of the steady state value was reached.

Interdigitate Electrode (IDE) Fabrication and Electrochemical Characterization

Graphene IDEs were manufactured using the IML method on a silicon wafer as described throughout the manuscript. The silicon wafer was then place on a hotplate and thermally annealed at 300° C. in ambient are for 30 min. A carbon paste was deposited on the ends of the IDE for alligator clips to attach. The IDE was tested in a standard two electrode setup by electrically shorting the reference and counter electrodes. Electrochemical impedance spectroscopy (EIS) was conducted with 5 mV amplitude, frequency between 1-10$^5$ Hz, and no DC current bias. EIS was conducted in varying concentrations of KCl (10$^{-1}$, 10$^{-2}$, 10$^{-3}$, and 10$^{-4}$ M). The double layer capacitance ($C_{dl}$) was calculated following the theory behind nonfaradaic EIS which correlates $C_{dl}$ with phase ($\phi$), and impedance (|Z|) as a sampling function in the electrolyte solution. $C_{dl}$ is hence calculated from the Nyquist plot by taking the inverse of the product of the film resistance ($R_{ct}$, diameter of the semicircle) and angular frequency at top of the semicircle ($\omega_{maxZ''}$).

Supporting Information

Thermal and laser annealing temperature and time vs graphene resistance, optical images of graphene suspended over a sacrificial layer, confocal microscopic images of IML graphene, electrochemical sensing setup, IDE design, SEM micrographs of graphene IDEs, graphene and silver patterning using IML, graphene ISU logos printed on various substrates, and video captions. This material is available free of charge via the Internet at http://pubs.acs.org.

REFERENCES AND NOTES (EACH INCORPORATED BY REFERENCE HEREIN IN ITS ENTIRETY)

1. Nomura, K.-i.; Ushijima, H.; Nagase, K.; Ikedo, H.; Mitsui, R.; Sato, J.; Takahashi, S.; Nakajima, S.-i.; Arai, M.; Kurata, Y., Simultaneous Formation of Fine and Large-Area Electrode Patterns Using Screen-Offset Printing and Its Application to the Patterning on Adhesive Materials. *Jpn. Appl. Phys.* 2016, 55, 03DD01.
2. Jiang, J.; Bao, B.; Li, M.; Sun, J.; Zhang, C.; Li, Y.; Li, F.; Yao, X.; Song, Y., Fabrication of Transparent Multilayer Circuits by Inkjet Printing. Advanced Materials 2016, 28, 1420-1426.
3. Bao, B.; Jiang, J.; Li, F.; Zhang, P.; Chen, S.; Yang, Q.; Wang, S.; Su, B.; Jiang, L.; Song, Y., Fabrication of Patterned Concave Microstructures by Inkjet Imprinting. *Advanced Functional Materials* 2015, 25, 3286-3294.
4. Sokolov, A. N.; Roberts, M. E.; Bao, Z., Fabrication of Low-Cost Electronic Biosensors. *Mater. Today* 2009, 12, 12-20.
5. Arias, A. C.; MacKenzie; J. D.; McCulloch, I.; Rivnay, J.; Salleo, A., Materials and Applications for Large Area Electronics: Solution-Based Approaches. *Chem. Rev.* 2010, 110, 3-24.
6. Jang, J.; Ha, J.; Cho, J., Fabrication of Water-Dispersible Polyaniline-Poly (4-Styrenesulfonate) Nanoparticles for Inkjet-Printed Chemical-Sensor Applications. *Adv. Mater.* 2007, 19, 1772-1775.
7. Le, L. T.; Ervin, M. H.; Qiu, H.; Fuchs, B. E.; Lee, W. Y., Graphene Supercapacitor Electrodes Fabricated by Inkjet Printing and Thermal Reduction of Graphene Oxide. *Electrochem. Commun.* 2011, 13, 355-358.
8. Kovalchuk, A.; Huang, K.; Xiang, C.; Marti, A. A.; Tour, J. M., Luminescent Polymer Composite Films Containing Coal-Derived Graphene Quantum Dots. *ACS Appl. Mater. Interfaces* 2015, 7, 26063-26068.
9. Zhang, S.; Li, S.; Cheng, S.; Ma, J.; Chang, H. In *Research on Smart Sensing Rfid Tags under Flexible Substrates in Printed Electronics*, 2015; IEEE: 2015; pp 1006-1009.
10. Wilson, K. G.; Ovington, P.; Dean, D., A Low-Cost Inkjet-Printed Glucose Test Strip System for Resource-Poor Settings. *J. Diabetes Sci. Technol.* 2015, 9, 1275-1281.
11. Geim, A. K., Graphene: Status and Prospects. *Science* 2009, 3.24, 1530-1534.
12. Kostarelos, K.; Novoselov, K. S., Exploring the Interface of Graphene and Biology. *Science* 2014, 344, 261-263.
13. Torrisi, F.; Hasan, T.; Wu, W.; Sun, Z.; Lombardo, A.; Kulmala, T. S.; Hsieh, G.-W.; Jung, S.; Bonaccorso, F.; Paul, P. J.; Chu, D.; Ferrari, A. C., Inkjet-Printed Graphene Electronics. *ACS Nano* 2012, 6, 2992-3006.
14. Aleeva, Y.; Pignataro, B., Recent Advances in Upscalable Wet Methods and Ink Formulations for Printed. Electronics. *J. Mater. Chem. C* 2014, 2, 6436-6453.
15. Zhou, X.; Boey, F.; Huo, F.; Huang, L.; Zhang, H., Chemically Functionalized Surface Patterning. *Small* 2011, 7, 2273-2289.
16. Secor, E. B.; Lim, S.; Zhang, H.; Frisbie, C. D.; Francis, L. F.; Hersam, M. C., Gravure Printing of Graphene for Large-Area Flexible Electronics. *Adv. Mater.* 2014, 26, 4533-4538.
17. Hyun, W. J.; Secor, E. B.; Hersam, M. C.; Frisbie, C. D.; Francis, L. F., High-Resolution Patterning of Graphene by Screen Printing with a Silicon Stencil for Highly Flexible Printed Electronics. *Adv. Mater.* 2015, 27, 109-115.

18. Weber, C. M.; Berglund, C. N.; Gabella, P., Mask Cost and Profitability in Photomask Manufacturing: An Empirical Analysis. *IEEE Trans. Semicond. Manuf.* 2006, 19, 465-474.
19. Sanjana, N. E.; Fuller, S. B., A Fast Flexible Ink-Jet Printing Method for Patterning Dissociated Neurons in Culture. *J. Neurosci. Methods* 2004, 136, 151-163.
20. Beidaghi, M.; Wang, C., Micro-Supercapacitors Based on Interdigital Electrodes of Reduced Graphene Oxide and Carbon Nanotube Composites with Ultrahigh Power Handling Performance. *Adv. Funct. Mater.* 2012, 22, 4501-4510.
21. Singh, M.; Haverinen, H. M.; Dhagat, P.; Jabbour, G. E., Inkjet Printing—Process and Its Applications. *Adv. Mater.* 2010, 22, 673-685.
22. Secor, E. B.; Prabhumirashi, P. L.; Puntambekar, K.; Geier, M. L.; Hersam, M. C., Inkjet Printing of High Conductivity, Flexible Graphene Patterns. *J Phys. Chem. Lett.* 2013, 4, 13474351.
23. Angelo, P. D., Inkjet-Printed Light-Emitting Devices: Applying Inkjet Microfabrication to Multilayer Electronics. Ph.D. Dissertation, University of Toronto: 2013.
24. Lee, S. H.; Shin, K. Y.; Hwang, J. Y.; Kang, K. T.; Kang, H. S., Silver Inkjet Printing with Control of Surface Energy and Substrate Temperature. *J. Micromech. Microeng.* 2008, 18, 075014.
25. Seng, L. C.; Chollet, F. In Maskless Lithography Using Off-the-Shelf Inkjet Printer, 2006; International Society for Optics and Photonics: 2006; pp 64150T-64150T.
26. Nishimoto, S.; Kubo, A.; Nohara, K.; Zhang, X.; Taneichi, N.; Okui, T.; Liu, Z.; Nakata, K.; Sakai, H.; Murakami, T., Tio 2-Based Superhydrophobic-Superhydrophilic Patterns: Fabrication Via an Ink-Jet Technique and Application in Offset Printing. *Applied Surface Science* 2009, 255, 6221-6225.
27. Sun, J.; Bao, B.; Jiang, J.; He, M.; Zhang, X.; Song, Y., Facile Fabrication of a Superhydrophilic-Superhydrophobic Patterned Surface by Inkjet Printing a Sacrificial Layer on a Superhydrophilic Surface. *RSC Advances* 2016, 6, 31470-31475.
28. Zhang, L.; Liu, H.; Zhao, Y.; Sun, X.; Wen, Y.; Guo, Y.; Gao, X.; Di, C. a.; Yu, G.;
Liu, Y., Inkjet Printing High-Resolution, Large-Area Graphene Patterns by Coffee-Ring Lithography. *Adv. Mater.* 2012, 24, 436-440.
29. Jahn, S. F.; Engisch, L.; Baumann, R. R.; Ebert, S.; Goedel, W. A., Polymer Microsieves Manufactured by Inkjet Technology. *Langmuir* 2008, 25, 606-610.
30. Das, S. R.; Nian, Q.; Cargill, A. A.; Hondred, J. A.; Ding, S.; Saei, M.; Cheng, G. J.; Claussen, J. C., 3d Nanostructured Inkjet Printed Graphene Via Uv-Pulsed Laser irradiation Enables Paper-Based Electronics and Electrochemical Devices. *Nanoscale* 2016, 8, 15870-15879.
31. Das, S. R.; Uz, M.; Ding, S.; Lentner, M. T.; Hondred, J. A.; Cargill, A. A.; Sakaguchi, D. S.; Mallapragada, S.; Claussen, J. C., Electrical Differentiation of Mesenchymal Stem Cells into Schwann-Cell-Like Phenotypes Using Inkjet-Printed Graphene Circuits. *Adv. Healthcare Mater.* 2017, 6, 1601087.
32. Secor, E. B.; Gao, T. Z.; Islam, A. E.; Rao, R.; Wallace, S. G.; Zhu, J.; Putz, K. W.; Maruyama, B.; Hersam, M. C., Enhanced Conductivity, Adhesion, and Environmental Stability of Printed Graphene Inks with Nitrocellulose. *Chem. Mater.* 2017, 29, 2332-2340.
33. Derby, B.; Reis, N., inkjet Printing of Highly Loaded Particulate Suspensions. *MRS Bull.* 2003, 28, 815-818.
34. Siburian, R.; Sebayang, K.; Supeno, M.; Marpaung, H., Effect of N-Doped Graphene for Properties of Pt/N-Doped Graphene Catalyst. *ChemistrySelect* 2017, 2, 1188-1195.
35. Claussen, J. C.; Kumar, A.; Jaroch, D. B.; Khawaja, M. H.; Hibbard, A. B.; Porterfield, De M.; Fisher, T. S., Nanostructuring Platinum Nanoparticles on Multilayered Graphene Petal Nanosheets for Electrochemical Biosensing. *Adv. Funct. Mater.* 2012, 22, 3399-3405.
36. Claussen, J. C.; Artiles, M. S.; McLamore, E. S.; Mohanty, S.; Shi, J.; Rickus, J. L.; Fisher, T. S.; Porterfield, D. M., Electrochemical Glutamate Biosensing with Nanocube and Nanosphere Augmented Single-Walled Carbon Nanotube Networks: A Comparative Study. *J. Mater. Chem.* 2011, 21, 1U24-11231.
37. Cargill, A. A.; Neil, K. M.; Hondred, J. A.; McLamore, E. S.; Claussen, J. C. In Effect of Platinum Nanopartick Deposition Parameters on Hydrogen Peroxide Transduction for Applications in Wearable Electrochemical Glucose Biosensors, 2016; International Society for Optics and Photonics: 2016; pp 98630E-98630E.
38. Daniele, M. A.; Pedrero, M.; Burrs, S.; Chaturvedi, P.; Salim, W. W. A. W.; Kuralay, F.; Campuzano, S.; McLamore, E.; Cargill, A. A.; Ding, S., Hybrid Metallic Nanoparticles: Enhanced Bioanalysis and Biosensing Via Carbon Nanotubes, Graphene, and Organic Conjugation. In *Nanobiosensors and Nanobioanalyses*, Springer: 2015; pp 137-166.
39. Cui, X.; Wu, S.; Li, Y.; Wan, G. G., Sensing Hydrogen Peroxide Using a Glassy Carbon Electrode Modified with in-Situ Electrodeposited Platinum-Gold Bimetallic Nanoclusters on a Graphene Surface. *Microchim. Acta* 2015, 182, 265-272.
40. Guo, S.; Wen, D.; Zhai, Y.; Dong, S.; Wang, E., Platinum Nanoparticle Ensemble-on-Graphene Hybrid Nanosheet: One-Pot, Rapid Synthesis, and Used as New Electrode Material for Electrochemical Sensing. *ACS nano* 2010, 4, 3959-3968.
41. Zhou, M.; Shang, L.; Li, B.; Huang, L.; Dong, S., Highly Ordered Mesoporous Carbons as Electrode Material for the Construction of Electrochemical Dehydrogenase- and Oxidase-Based Biosensors. *Biosens. Bioelectron.* 2008, 24, 442-447.
42. Jia, N.; Huang, B.; Chen, L.; Tan, L.; Yao, S., A Simple Non-Enzymatic Hydrogen Peroxide Sensor Using Gold Nanoparticles-Graphene-Chitosan Modified Electrode. *Sens. Actuators, B* 2014, 195, 165-170.
43. Bandodkar, A. J.; Jeerapan, I.; You, J.-M.; Nuñez-Flores, R.; Wang, J., Highly Stretchable Fully-Printed Cnt-Based Electrochemical Sensors and Biofuel Cells: Combining Intrinsic and Design-Induced Stretchability. *Nano Lett,* 2015, 16, 721-727.
44. Kokkinos, C.; Economou, A.; Prodromidis, M. I., Electrochemical Immunosensors: Critical Survey of Different Architectures and Transduction Strategies. *TrAC, Trends Anal. Chem.* 2016, 79, 88-105.
45. Min, J.; Baeumner, A. J., Characterization and Optimization of Interdigitated Ultramicroelectrode Arrays as Electrochemical Biosensor Transducers. *Electroanalysis* 2004, 16, 724-729.
46. Teerapanich, P.; Myint, M. T. Z.; Joseph, C. M.; Hornyak, G. L.; Dutta, J., Development and Improvement of Carbon Nanotube-Based Ammonia Gas Sensors Using Ink-Jet Printed Interdigitated Electrodes. *IEEE Trans. Nanotechnol.* 2013, 12, 255-262.
47. Marrakchi, M.; Jaffrezic Renault, N.; Dzyadevych, S.; Lagarde, F.; Samuelson, J. P., *Pollutant Detection and*

*Environmental Monitoring Using Conductometric Microbiosensors Industrial Waste.* 2009; p 205-222.

48. Laureyn, W.; Van Gerwen, P.; Suls, J.; Jacobs, P.; Maes, G., Characterization of Nanoscaled Interdigitated Palladium Electrodes of Various Dimensions in Kcl Solutions. *Electroanalysis* 2001, 13, 204-211.

49. Ibrahim, M.; Claudel, J.; Kourtiche, D.; Nadi, M., Geometric Parameters Optimization of Planar Interdigitated Electrodes for Bioimpedance Spectroscopy. *J. Diabetes Sci. Technol.* 2013, 4, 13-22.

50. Van Gerwen, P.; Laureyn, W.; Laureys, W.; Huyberechts, G.; De Beeck, M. O.; Baert, K.; Suls, J.; Sansen, W.; Jacobs, P.; Hermans, L., Nanoscaled Interdigitated Electrode Arrays for Biochemical Sensors. *Sens. Actuators*, B 1998, 49, 73-80.

51. Dharuman, V.; Grunwald T.; Nebling, E.; Albers, J.; Blohm, L.; Hintsche, R., Label-Free Impedance Detection of Oligonucleotide Hybridisation on Interdigitated Ultramicroelectrodes Using Electrochemical Redox Probes. *Biosens. Bioelectron.* 2005, 21, 645-654.

52. Lou, Z.; Kai, J.; Rust, M. J.; Han, J.; Ahn, C. H., Functionalized Nano Interdigitated Electrodes Arrays on Polymer with Integrated Microfluidics for Direct Bio-Affinity Sensing Using Impedimetric Measurement. *Sens. Actuators*, A 2007, 136, 518-526.

53. Yang, L.; Guiseppi-Wilson, A.; Guiseppi-Elie, A., Design Considerations in the Use of Interdigitated Microsensor Electrode Arrays (Imes) for Impedimetric Characterization of Biomimetic Hydrogels. *Biomed. Microdevices* 2011, 13, 279-289.

54. Bandodkar, A. J.; Mohan, V.; Lopez, C. S.; Ramirez, J.; Wang, J., Self-Healing Inks for Autonomous Repair of Printable Electrochemical Devices. *Adv. Electron. Mater.* 2015, 1, 1500289.

55. El-Kady, M. F.; Strong, V.; Dubin, S.; Kaner, R. B., Laser Scribing of High-Performance and Flexible Graphene-Based Electrochemical Capacitors. *Science* 2012, 335, 1326-1330.

56. Cong, H.-P.; Ren, X.-C.; Wang, P.; Yu, S.-H., Flexible Graphene—Polyaniline Composite Paper for High-Performance Supercapacitor. *Energy Environ. Sci.* 2013, 6, 1185-1191.

57. Kim, B. J.; Jang, H.; Lee, S.-K.; Hong, B. H.; Ahn, J.-H.; Cho, J. H., High-Performance Flexible Graphene Field Effect Transistors with Ion Gel Gate Dielectrics. *Nano Lett.* 2010, 10, 3464-3466.

58. Kim, S.; Gupta, M. K.; Lee, K. Y.; Sohn, A.; Kim, T. Y.; Shin, K. S.; Kim, D.; Kim, S. K.; Lee, K. H.; Shin, H. J., Transparent Flexible Graphene Triboelectric Nanogenerators. *Adv. Mater.* 2014, 26, 3918-3925.

59. Tian, H.; Shu, Y.; Cui, Y.-L.; Mi, W.-T.; Yang, Y.; Xie, D.; Ren, T.-L., Scalable Fabrication of High-Performance and Flexible Graphene Strain Sensors. *Nanoscale* 2014, 6, 699-705.

60. Liu, X.; Zhang, J.; Si, W.; Xi, L.; Eichler, B.; Yan, C.; Schmidt, O. G., Sandwich Nanoarchitecture of Si/Reduced Graphene Oxide Bilayer Nanomembranes for Li-Ion Batteries with Long Cycle Life. *ACS nano* 2015, 9, 1198-1205.

61. Claussen, J. C.; Hengenius, J. B.; Wickner, M. M.; Fisher, T. S.; Umulis, D. M.; Porterfield, D. M., Effects of Carbon Nanotube-Tethered Nanosphere Density on Amperometric Biosensing: Simulation and Experiment. *J. Phys. Chem. C* 2011, 115, 20896-20904.

Supplemental Information
High Resolution Graphene Films for Electrochemical Sensing Via Inkjet Maskless Lithography Videos (also referred to as "Movie 1" and "Movie 2") have been created to help show examples of implementation of certain aspects of the invention. A summary of each is set forth below:

Movie 1:

DMP2831 Diamatix Drop Watcher video showing consistently stable drops of developed acrylic Laquer ink upon expulsion from the piezoelectric nozzles of the inkjet printer. Selected frames are reproduced at FIGS. 17A-L.

Movie 2:

Graphene lift-off within an acetone bath and impingement from an acetone wash bottle revealing graphene IML logos developed via the inkjet maskless lithography (IML) technique on flexible Kemafoil. Selected frames are reproduced at FIGS. 18A-J. The captions in those figures summarize what those frames show These still frames help visualize certain aspects of the inventive techniques.

FIGS. 7A-D to 16 and their captions (see Brief Description of the Drawings section supra), provide supplementary information about aspects of the invention and the specific example discussed immediately above.

E. Options and Alternatives

As will be appreciated by those of skill in this technical art and field, the invention can take many forms and embodiments. The invention is not limited to the foregoing examples, which are for illustrative purposes only. Variations obvious to those skilled in the art will be included within the invention.

Some examples of possible variations have been mentioned in the descriptions and claims herein. Additional possibilities are discussed below.

Substrates

More rigid substrates such as silicon-based are mentioned, as are more flexible such as cellulose-based and polymer-based. It will be appreciated that aspects according the invention can be applied to other specific substrate compositions and characteristics.

Certain implementations may be limited by the material and characteristics of the sacrificial layer, the inkjet printer, or the intended application.

As a general rule, variability of this feature is controlled by the printer. Inkjet printers print on 2D surfaces including flexible surfaces.

Inkjet Printable Inks

Some specific inkjet printable ink formulations have been discussed supra. It is to be understood that variations are possible according to need or desire.

As a general rule, variability of this feature is controlled by physical properties of the sacrificial polymer ink. The fluid dynamic properties of the ink (viz., viscosity, surface tension, and density) strongly influences the inkjet printed line/pattern resolution (see FIGS. 2A-B). Examples of other such polymers that could be used in this scenario such as photoresists and high-temperature lacquers.

Inkjet Printers

At least one specific example of an inkjet printer that can be used has been given herein. Those skilled in the art appreciate others with similar or analogous capabilities are commercially available and possible.

As a general rule, variability of this feature is controlled by the resolution of solution phase printing process. Other types of possible printers that could be used to apply the sacrificial polymer include: screen printing, gravure printing and aerosol printing.

Deposition Techniques

Several methods of applying the viscous solution over the sacrificial negative pattern and substrate are mentioned supra. It will be appreciated by those skilled in the art that other techniques may well be used. Some may be applicable even if they do not produce as exact or uniform a coating or deposition as the techniques specifically mentioned.

As a general rule, variability of this feature is controlled by scalability and evenness of the coating technique. Hence various coating techniques could be implemented such as spin coating, dip coating, drop casting, and spray coating. For dip coating, parameters to control would be the number of dips and the speed and temperature at which the substrate is removed from the ink. Spray coating could involve a pressurized mechanism to propel the ink onto the surface of the substrate.

The following discussion will assist in an understanding of aspects of the invention:

a. A unique aspect of this work is that it was found that solution-phase inks [comprised of either organic (e.g., graphene) or metallic (silver nanoparticles)] are permeable to acetone and still sufficiently adhesive to the underlying substrate. This is not achievable with conventional photolithography pattern where thin films (even thickness of a few nanometers) need to be evaporated via non-conformal evaporation techniques such as electron beam or thermal evaporation techniques so that a small ledge or sidewall of photoresist remains exposes. This exposed photoresist permits acetone from dissolving the resist and subsequently leads to the removal of the metal above the resist (see FIG. 19).

b. The flakes that are used in the graphene inks have approximate width of 1-5 microns with the thickness ranging between 3-10 nanometers. The metallic inks used in study are spherical in nature with size ranges between 50-100 nanometers in diameter. The acetone molecules used to remove the sacrificial polymer layer has dimensions between 1-5 nm. Therefore, the smaller acetone molecules are likely to pass through small cracks, fissures, or openings that occur within the ink.

c. The temperature and duration of the baking of the spun coated graphene is crucial to forming a high-resolution pattern with onto a substrate with the solution phase inks as. Another important aspect to obtaining high-resolution graphene films is properly controlling the temperature and time of the graphene post-bake as displayed in the attached manuscript and below. Recall, that after the negative pattern is inkjet printed onto a substrate, a viscous graphene ink is spun over the polymer patterned surface (FIG. 1 & Experimental Methods). A temperature and time controlled baking process is subsequently conducted in a convection oven to remove ink solvents and subsequently to improve the physical bond between the substrate and the graphene (FIGS. 2A-B). At low baking temperatures and/or short baking times, the graphene does not adhere tightly to the surface of the substrate and is completely removed upon lift-off of the sacrificial polymer via acetone (FIG. 3, top left). At higher baking temperatures or longer baking times the polymer irreversibly hardened on the substrate which inhibited acetone removal of the underlying sacrificial polymer (FIG. 3, bottom right). However, a post-bake temperature and time of 120° C. for 1 hr sufficiently adhered the graphene to the substrate while preventing over-hardening of the sacrificial polymer so that it could be removed by acetone; this post-bake time and temperature permitted the formation of well-defined graphene lines (25 μm width and 50 μm spacing) (FIG. 3, center highlighted image). Thus, a proper postbake time and temperature prevents uneven breaking or tenting of the graphene when the photoresist is dissolved.

Hence the developed inkjet maskless lithography technique could be used with various coating techniques including spin coating, dip coating, cold spray coating, and drop casting. These coating techniques are described succinctly below.

Spin coating is a coating technique where solid particles (1 nanometer to 50 micrometers in size) are solubilized and dropped onto the center of a substrate that is spinning to evenly coat the substrate surface with the particles.

Cold spray coating is a coating technique where solid particles (1 nanometer to 50 micrometers in size) are ejected from a nozzle onto a substrate with high velocity from a compressed gas. The cold spray particles subsequently adhere to the substrate.

Dip coating is a coating technique where solid particles (1 nanometer to 50 micrometers in size) are solubilized in solution and a substrate is dipped into and out of a solution at a distance, speed, and temperature so that the particles adhere to the substrate.

Drop casting is a coating technique where solid particles 1 nanometer to 50 micrometers in size) are solubilized and dropped or casted onto the substrate so that they physically or chemically absorb onto the substrate.

Moreover, a wide variety of organic and inorganic materials can be used to coat the substrate surface and create the patterned circuits. The only restrictions are that the materials must be broken into flakes or particles with dimensions on the nano or microscale (1 nanometer to 50 micrometers in size). Polymeric binders (e.g., ethyl cellulose, or nitro cellulose) can be used to make the inks more adhesive to the substrates and particles can be solubilized in numerous organic solvents (e.g., terpineol, cyclohexanone).

For additional details, several examples, all incorporated by reference herein, of different types of coating of viscous fluids, including spin coating are:

Sahu, et al., Fundamental understanding and modeling of spin coating process: A review, Indian J. Phys., April 2009, Volume 83, Issue 4, pp 493-502;

Moridi, et al., Cold spray coating: review of material systems and future perspectives, A. Moridi, S. M. Hassani-Gangaraj, M. Guagliano & M. Dao, Pages 369-395 Received 31 Jul. 2013, Accepted 5 Mar. 2014, Published online: 16 Apr. 2014;

Mirri, et al., High-Performance Carbon Nanotube Transparent Conductive Films by Scalable Dip Coating, ACS Nano, 2012, 6 (11), pp 9737-9744

Krebs, Frederik C., Fabrication and processing of polymer solar cells: A review of printing and coating techniques, Solar Energy Materials and Solar Cells, Volume 93, Issue 4, April 2009, Pages 394-412.

Solute or Particles in Solution

Examples of different types of materials that might be placed in solution for deposition or coating of the negative pattern and substrate are mentioned in the descriptions and claims herein. Graphene is one non-limiting example.

Post Print Baking/Annealing

Examples are mentioned, as are references cited which discuss such things as laser annealing. Those skilled in the art will appreciate there are possible variations to achieve the needed results.

Oven baking is one option to dry the viscous solution. A heat gun is another. One non-limiting example is at a distance from a heat gun to the pattern of ~8 inches with a Model Wagner HT-1000, air stream temperature approximately 500° C.

As a general rule, variability of this feature is controlled by temperature, humidity, duration, airflow (convection heating), and pressure. Examples of heating processes that could be used include ovens (including convection and vacuum based), heat guns, and hotplates.

A non-limiting example, incorporated by reference herein, with details about using a laser to anneal graphene-based circuits by one or more of the present inventors (and cited reference 30 supra) is:

Das, S. R.; Nian, Q.; Cargill, A. A.; Hondred, J. A.; Ding, S.; Saei, M.; Cheng, G. J.; Claussen, J. C., 3D nanostructured inkjet printed graphene via UV-pulsed laser irradiation enables paper-based electronics and electrochemical devices. *Nanoscale* 2016, 8 (35), 15870-15879.

Removal and Lift Off

For the graphene-based example above, removal and lift-off alternatives are discussed. Some non-limiting examples are as follows.

Graphene can be coated across the entire surface and not just fill in between breaks within the pattern. Acetone solvent and appropriate agitation (sonication, impingement) can be used to remove the sacrificial polymer pattern and hence the graphene that rests on top of this pattern as well. We believe there is enough porosity to the graphene to permit the solvent to percolate through the flakes to the underlying sacrificial polymer layer. This solvent then dissolves the underlying polymer layer and therefore destroys the foundation of the graphene that was spin coated on top of it. Interestingly, in many if not most cases, the graphene resting directly on top of the substrate still has sufficient adhesion to not wash away during the acetone impingement and sonication process (see FIGS. 18A-J, illustrative frames from Movie/Video 2). This is similar to a lift-off process during photolithography were a photoresist is patterned onto a surface and then removed with an organic solvent. To further increase adhesion, the patterned graphene is now placed into an oven (130 deg. C. for 1 hour) or placed under a heat gun for 10 mins. After these heating processes the patterned graphene does not delaminate or break from the surface during flexing and sensing.

There are possible alternatives to acetone. Most organic solvents would likely remove the sacrificial polymer layer (e.g., ethanol, cyclohexanone, methanol).

Sonication and impingement are used to apply mechanical pressure (shaking, mixing, pressure from fluid flow) to help in the removal of the sacrificial layer.

As a general rule, variability of this feature is controlled by type and concentration of solvent and mechanical agitation parameters. Alternative solvents to acetone include most organic solvents (e.g., ethanol, cyclohexanone, methanol). Sonication and impingement are used to apply mechanical pressure but other forms of shaking, mixing, and pressure from fluid flow could facilitate the removal of the sacrificial layer.

Patterns

Several examples are described and illustrated herein. But those skilled in the art appreciate that the form factor of patterns that can be produced is almost unlimited. Of course, one limitation is the form factors that can be created with a negative pattern.

As a general rule, variability of this feature is controlled by the resolution of the printing process. The printer head resolution and drop size will affect this resolution.

Non-limiting examples, incorporated by reference herein, of different types of interdigitated circuits and patterns are described at:

Chang, et al., A Circuits and Systems Perspective of Organic/Printed Electronics: Review, Challenges, and Contemporary and Emerging Design Approaches, IEEE Journal on Emerging and Selected Topics in Circuits and Systems (Volume: 7, issue: 1, March 2017)

Khan, et al., Technologies for Printing Sensors and Electronics Over Large Flexible Substrates: A Review, IEEE Sensors Journal, Vol. 15, No. 6, June 2015, pp. 3164-3185.

Applications

Several examples are described and illustrated herein. But those skilled in the art appreciate that the uses to which the patterns that can be produced is almost unlimited. Of course, those uses would be limited to such things as the nature of the substrate (e.g. rigid or flexible), and nature of the final pattern (conductive, insulative, etc.).

As a general rule, variability of this feature is controlled by the ink material. For example, patterned metals may be limited to non-corrosive environments and patterned graphene would become less conductive (would oxidize) at temperatures above ~350° C.

As discussed above, aspects of the invention can be applied to various sensors. Details about non-limiting examples, incorporated by reference herein, of graphene-based sensors (and cited reference 31 supra) are at:

Das, S. R.; Uz, M.; Ding, S.; Lentner, M. T.; Hondred, J. A.; Cargill, A. A.; Sakaguchi, D. S.; Mallapragada, S.; Claussen, J. C., Electrical Differentiation of Mesenchymal Stem Cells into Schwann-Cell-Like Phenotypes Using Inkjet-Printed Graphene Circuits. *Adv. Healthcare Mater.* 2017, 6(7).

Non-limiting examples, incorporated by reference herein, of electro-chem sensors (and cited reference 37 supra):

Cargill, A. A.; Neil. K. M.; Hondred, J. A.; McLamore, E. S.; Claussen, J. C., *Effect of platinum nanoparticle deposition parameters on hydrogen peroxide transduction for applications in wearable electrochemical glucose biosensors*, 2016; International Society for Optics and Photonics: pp 98630E-98630E.

Non-limiting examples, incorporated by reference herein, of electro-chem sensors (and cited reference 35 supra):

Claussen, J. C.; Kumar, A.; Jaroch, D. B.; Khawaja, M. H.; Hibbard, A. B.; Porterfield, D. M.; Fisher, T. S., Nanostructuring platinum nanoparticles on multilayered graphene petal nanosheets for electrochemical biosensing. *Adv. Funct. Mater.* 2012, 22 (16), 3399-3405

Non-limiting examples, incorporated by reference herein, of electro-chem sensors (and cited reference 36 supra.:

Claussen, J. C.; Artiles, M. S.; McLamore, E. S.; Mohanty, S.; Shi, J.; Rickus, J. L.; Fisher, T. S.; Porterfield, D. M., Electrochemical glutamate biosensing with nanocube and nanosphere augmented single-walled carbon nanotube networks: a comparative study. *J Mater. Chem.* 2011, 21 (30), 11224-11231.

Non-limiting examples, incorporated by reference herein, of electro-chem sensors (and cited reference 61 supra):

Claussen, J. C.; Hengenius, J. B.; Wickner, M. M.; Fisher, T S.; Umulis, D. M.; Porterfield, D. M., Effects of carbon nanotube-tethered nanosphere density on amperometric biosensing: simulation and experiment. *J. Phys. Chem. C* 2011, 115 (43), 20896-20904.

Manufacturing Processes/Scalability

The examples above are somewhat generalized as to the specifics of each process step, with some mention of some specific techniques. Those skilled in the art will appreciate that the aspects of the invention can be implemented in a variety of manufacturing processes.

One example is roll-to-roll processing. This might require a solution application step other than spin coating. Non-limiting examples of roll-to-roll processing techniques, incorporated by reference herein, are:

Applications of Organic and Printed Electronics: A Technology-Enabled Revolution Editor: *Eugenio Cantatore*, (2013) Springer. ISBN: 978-1-4614-3159-6 (Print) 978-1-4614-3160-2 (Online)

Flexible Electronics: Materials and Applications, edited by William S. Wong, Alberto Salleo, ISBN 978M-387-74362-2, 2009 Springer.

Other

As will be appreciated by those skilled in the art, variations such as obvious to those skilled artisans are possible and including within the invention.

What is claimed is:

1. A method of manufacturing high resolution patterns on a substrate from a solution comprising:
    a. creating a sacrificial layer comprising a negative of a pattern on the substrate, wherein the sacrificial layer is created by direct printing and adhering of the negative of the pattern on the substrate;
    b. depositing or coating a solution including nano-material-based particles over the printed and adhered negative of the pattern formed by the sacrificial layer and at least the substrate at and around the printed and adhered negative pattern;
    c. stabilizing, drying, and/or reducing the deposited or coated solution on the substrate; and
    d. removing the sacrificial layer and dried solution over the sacrificial layer to leave a positive of the printed and adhered negative pattern comprising stabilized, dried, and/or reduced solution in the form of a positive pattern adhered to the substrate with resolution on the order of the resolution of the negative pattern.

2. The method of claim 1 wherein the direct printing and adhering of the sacrificial layer is created by jet printing of jet printable ink which:
    a. comprises a polymer that falls within viscosity, surface tension, specific gravity, and density values, and/or Reynolds number, Weber number, and z-values of jet printable inks; and
    b. adheres to the substrate.

3. The method of claim 2 wherein the jet printable ink comprises inkjet printable ink with;
    a. the z-value within the approximate range of 1-10;
    b. the viscosity within the approximate range of 2-20 cP;
    c. the surface tension within the approximate range of 30-40 mN/m; and
    d. the specific gravity within the approximate range of 1-1.5.

4. The method of claim 1 wherein the substrate comprises a sheet or plate with at least a substantially planar surface having a selectable width and length from micro-scale to meter-scale or more wherein the substrate comprises one of:
    a. rigid;
    b. flexible;
    c. thermally sensitive;
    d. semi-rigid;
    e. semi-flexible;
    f. silicon;
    g. heat rated polyethylene terephthalate (PET);
    h. clear PET;
    i. polyamide tape; and
    j. nanocellulose.

5. The method of claim 2 wherein the jet printable ink comprises inkjet printable ink and the jet printer comprises an inkjet printer which uses:
    a. 1 pL nominal droplet nozzles; and
    b. a waveform for 40 degrees C. 20 μm drop spacing.

6. The method of claim 1 wherein the deposition or coating of the solution comprises:
    a. one layer of height; or
    b. plural layers of height;
    and wherein the deposition or coating comprises:
    i. spin coating;
    ii. coating;
    iii. drop casting; or
    iv. spray coating.

7. The method of claim 6 wherein the spin coating for a graphene-based solution comprises:
    a. 1 mL of the solution placed on center;
    b. spun at 100 rpm for 30 seconds; and
    c. heated at 90 degrees C. for two minutes; wherein the stabilizing, drying, and/or reducing of the solution after deposition comprises:
        i. heating with a heat source.

8. The method of claim 1 wherein the solution comprises particles capable of electrical conductivity.

9. The method of claim 8 wherein the particles comprise at least one of:
    a. graphene;
    b. graphene oxide;
    c. graphene-based content;
    d. silver;
    e. silver nanoparticles,
    f. $MoS_2$ (Molybdenum disulfide);
    g. noble metals;
    h. carbon nanomaterials;
    i. thermoelectric materials;
    j. quantum dots; and
    k. various shapes/geometries.

10. The method of claim 9 wherein the noble metals comprise at least one of:
    a. platinum;
    b. palladium; and
    c. gold.

11. The method of claim 9 wherein the carbon nanomaterials comprise at least one of:
    a. graphene;
    b. carbon nanotubes; and
    c. carbon dots.

12. The method of claim 9 wherein the thermoelectric materials comprise bismuth telluride.

13. The method of claim 9 wherein the various shapes/geometries comprises at least one of:
    a. nanoparticles; and
    b. nanowires.

14. The method of claim 1 wherein the solution comprises:
    a. carbon-based content along with a surfactant binder and solvents; and
    b. a viscous/dense solution-phase with higher concentration of graphene-based content than inkjet printable inks.

15. The method of claim 14 wherein the carbon-based content comprises at least one of:
   a. graphene;
   b. graphene oxide;
   c. reduced graphene oxide;
   d. carbon nanotubes; and
   e. carbon dots.

16. The method of claim 14 wherein the surfactant binder comprises at least one of:
   a. ethyl cellulose; and
   b. nitrocellulose.

17. The method of claim 14 wherein the solvents comprise terpineol.

18. The method of claim 1 wherein after depositing or coating the solution over the negative pattern:
   a. annealing the negative pattern and the deposited solution for at least one of:
      i. increasing adhesion of the solution to the substrate;
      ii. removing surfactants, solvents, or non-conductive binders; and
      iii. tuning electroactive parameters.

19. The method of claim 18 wherein the annealing comprises:
   a. baking with a convection oven:
      i. in the approximate temperature range of 110-120 degrees C.;
      ii. for the approximate time of range of 1-6 hrs.; or
   b. heating with a heat gun:
      i. in the approximate flow stream temperature range of 300-500 degrees C.;
      ii. for the approximate time range of 5 to 10 min.; and
   c. scanning a laser:
      i. at the approximate laser power of 1000 mW;
      ii. at the approximate laser wavelength of 405 nm.

20. The method of claim 1 wherein the removing comprises:
   a. exposing the sacrificial layer to a solvent;
   b. lifting off the dried solution layer over the sacrificial layer; and
   c. leaving the dried solution layer positive pattern on the substrate.

21. The method of claim 20 wherein:
   a. the solvent comprises acetone; and
   b. the exposing comprises at least one of:
      i. sonicating in an acetone bath; and
      ii. direct acetone impingement.

22. The method of claim 20 further comprising:
   a. additional exposure to a solvent after removing and lift off to remove excess dried solution at the positive pattern on the substrate.

23. The method of claim 1 wherein the positive pattern is used with or for:
   a. one or more electrochemical sensors;
   b. one or more energy harvesters;
   c. one or more batteries;
   d. one or more capacitor/supercapacitors;
   e. one or more triboelectric nanogenerators;
   f. one or more strain sensors; or
   g. one or more chemical/biological sensors.

24. A method of manufacturing high resolution patterns on a substrate from a solution comprising:
   a. creating a sacrificial layer comprising a negative of a pattern on the substrate;
   b. depositing or coating a solution including nano-material-based particles over the negative of the pattern formed by the sacrificial layer and at least the substrate at and around the negative pattern;
   c. stabilizing, drying, and/or reducing the deposited or coated solution;
   d. removing the sacrificial layer and dried solution over the sacrificial layer to leave a positive of the negative pattern comprising stabilized, dried, and/or reduced solution in the form of a positive pattern adhered to the substrate with resolution on the order of the resolution of the negative pattern, wherein the removing comprises:
      (i). exposing the sacrificial layer to a solvent, and to mechanical agitation;
      (ii). lifting off the dried solution layer over the sacrificial layer; and
      (iii). leaving the dried solution layer positive pattern on the substrate;
   wherein the solvent is an organic solvent comprising:
      (1) acetone;
      (2) ethanol;
      (3) cyclohexanone; or
      (4) methanol.

25. The method of claim 24 further comprising:
   a. additional exposure to a solvent after removing and lift off to remove excess dried solution at the positive pattern on the substrate.

26. A method of manufacturing high resolution patterns on a substrate from a solution comprising:
   a. creating a sacrificial layer comprising a negative of a pattern on the substrate;
   b. depositing or coating a solution including nano-material-based particles over the negative of the pattern formed by the sacrificial layer and at least the substrate at and around the negative pattern;
   c. stabilizing, drying, and/or reducing the deposited or coated solution;
   d. removing the sacrificial layer and dried solution over the sacrificial layer to leave a positive of the negative pattern comprising stabilized, dried, and/or reduced solution in the form of a positive pattern adhered to the substrate with resolution on the order of the resolution of the negative pattern, wherein the removing comprises:
      (i). exposing the sacrificial layer to a solvent, and to mechanical agitation;
      (ii). lifting off the dried solution layer over the sacrificial layer; and
      (iii). leaving the dried solution layer positive pattern on the substrate;
   wherein the mechanical agitation comprises one or more of:
      (1) sonicating in an acetone bath; and
      (2) direct acetone impingement.

27. The method of claim 26 further comprising:
   a. additional exposure to a solvent after removing and lift off to remove excess dried solution at the positive pattern on the substrate.

28. A method of manufacturing high resolution patterns on a substrate from a solution comprising:
   a. creating a sacrificial layer comprising a negative of a pattern on the substrate, wherein the sacrificial layer is created by jet printing and jet printable ink which:
      (i) comprises a polymer that falls within viscosity, surface tension, specific gravity, and density values, and/or Reynolds number, Weber number, and z-values of jet printable inks; and
      (ii) adheres to the substrate;
   b. depositing or coating a solution including nano-material-based particles over the negative of the pattern formed by the sacrificial layer and at least the substrate at and around the negative pattern;

c. stabilizing, drying, and/or reducing the deposited or coated solution; and d. removing the sacrificial layer and dried solution over the sacrificial layer to leave a positive of the negative pattern comprising stabilized, dried, and/or reduced solution in the form of a positive pattern adhered to the substrate with resolution on the order of the resolution of the negative pattern.

29. The method of claim 28 wherein the jet printable ink comprises:

a. inkjet printable ink; or b. aerosol jet printable ink.

30. The method of claim 28 wherein the stabilizing, drying, and/or reducing of the deposited or coated solution comprises:

a. annealing, or b. heating.

31. The method of claim 28 wherein the removing comprises:

a. exposing the sacrificial layer to a solvent;

b. lifting off the dried solution layer over the sacrificial layer; and c. leaving the dried solution layer positive pattern on the substrate.

32. The method of claim 31 further comprising:

a. additional exposure to a solvent after removing and lift off to remove excess dried solution at the positive pattern on the substrate.

* * * * *